United States Patent [19]

Fukiage et al.

[11] Patent Number: 5,400,292
[45] Date of Patent: Mar. 21, 1995

[54] SEMICONDUCTOR MEMORY DEVICE WITH CHANGEABLE INPUT/OUTPUT DATA BIT ARRANGEMENT

[75] Inventors: Takahiko Fukiage; Yoshinori Inoue, both of Hyogo, Japan

[73] Assignee: Mitsubishi Denki Kabushiki Kaisha, Tokyo, Japan

[21] Appl. No.: 155,369

[22] Filed: Nov. 22, 1993

[30] Foreign Application Priority Data

Dec. 25, 1992 [JP] Japan .................................. 4-346450

[51] Int. Cl.$^6$ ............................................... G11C 8/00
[52] U.S. Cl. ...................... 365/230.010; 365/230.030; 365/230.050; 365/195
[58] Field of Search ...................... 365/230.01, 230.03, 365/230.05, 189.05, 49, 230.08, 195

[56] References Cited

U.S. PATENT DOCUMENTS

| | | | |
|---|---|---|---|
| 4,989,185 | 1/1991 | Matsuo et al. | 365/189.01 |
| 5,053,999 | 10/1991 | Matsumura et al. | 365/189.01 |
| 5,243,560 | 9/1993 | Amishiro et al. | 365/189.01 |
| 5,260,895 | 11/1993 | Shishikura | 365/230.01 |
| 5,295,108 | 3/1994 | Higa | 365/189.01 |

*Primary Examiner*—Eugene R. LaRoche
*Assistant Examiner*—Tan Nguyen
*Attorney, Agent, or Firm*—Lowe, Price, LeBlanc & Becker

[57] ABSTRACT

A dynamic type semiconductor memory device includes a plurality of data input/output nodes, a plurality of /CAS buffers for generating column address strobe signals corresponding to each of said input/output nodes, and an input node carrying out only data input. A switching signal generation circuit generates first and second switching signals indicating data input/output control modes. Memory cells corresponding in number to the data input/output nodes are selected simultaneously from a memory cell array. In operation of control mode A, data input/output is effected using an input node and one data input/ouput node. In the case of control mode B, data writing/reading is effected via a plurality of data input/output nodes according to one column address strobe signal. In the case of control mode C, data input/output is carried out individually for each input/output node according to a plurality of column address strobe signals. Modes A, B and C can be realized in one DRAM. Particularly, in mode C controlling data input/output according to respective column address strobe signals, writing/reading of unnecessary data bits can be prevented to reduce power consumption and prevent erroneous parity bit writing.

26 Claims, 34 Drawing Sheets

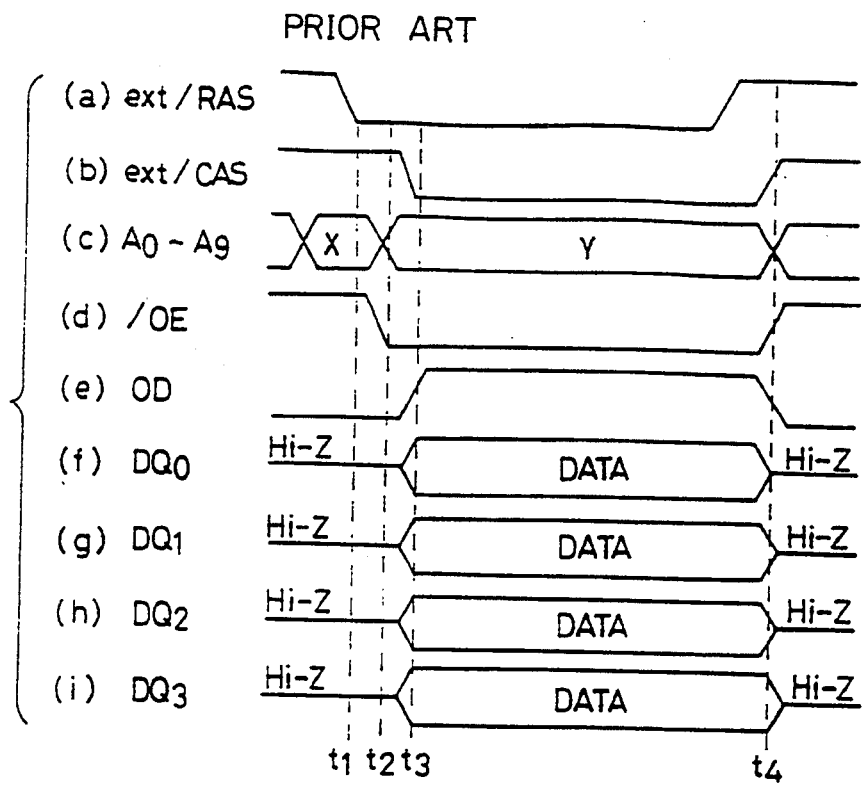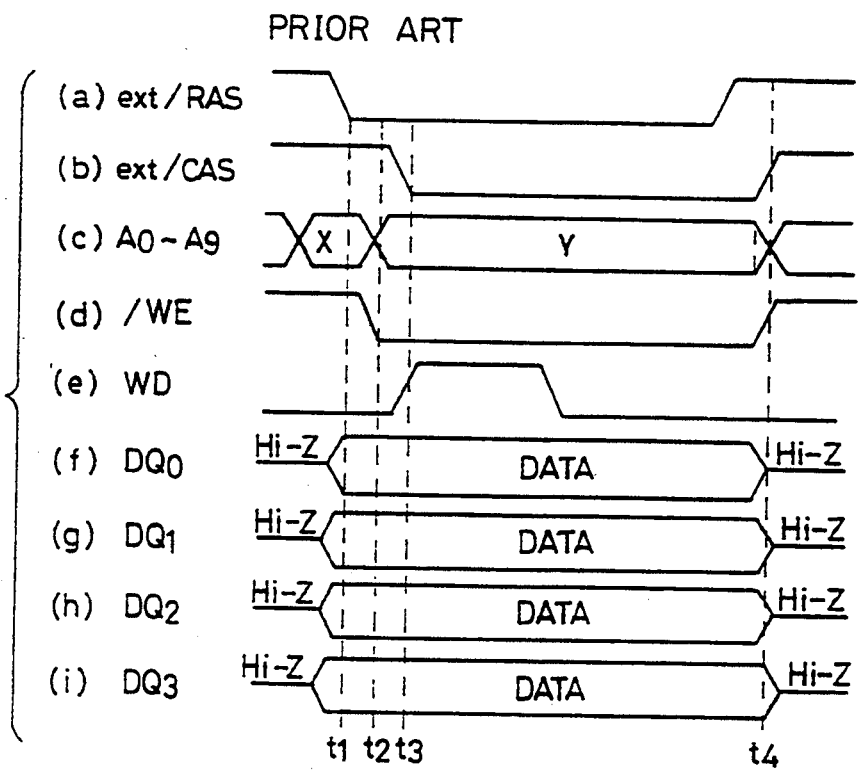

: MODE A (1/CAS, X1)

: MODE B (1/CAS, X4)

: MODE C (4/CAS, X4)

| $\psi_1$ | RAn | /RAn | CAn | /CAn | /$\phi_0$ | /$\phi_1$ | /$\phi_2$ | /$\phi_3$ |
|---|---|---|---|---|---|---|---|---|
| H | — | — | — | — | Z | Z | Z | Z |
| L | H | L | H | L | L | H | H | H |
| L | H | L | L | H | H | L | H | H |
| L | L | H | H | L | H | H | L | H |
| L | L | H | L | H | H | H | H | H |

"—" INDICATES "ARBITRARY"

"Z" INDICATES "HIGH IMPEDANCE"

142, 143, 144

150

SEMICONDUCTOR MEMORY DEVICE WITH CHANGEABLE INPUT/OUTPUT DATA BIT ARRANGEMENT

BACKGROUND OF THE INVENTION

1. Field of the Invention

The present invention relates to semiconductor memory devices, and more particularly, to a structure for data input and output in a dynamic type semiconductor memory device having a plurality of data input/output pins.

2. Description of the Background Art

FIG. 1 shows a structure of a general data processing system. Referring to FIG. 1, a data processing system includes a data processor 900 of, for example, a CPU (Central Processing Unit), a DRAM (Dynamic Random Access Memory) 920 as an external memory device, and a DRAM controller 910 for controlling the access from data processor 900 to DRAM 920.

DRAM controller 910 includes an address multiplexer 912 for multiplexing an address signal provided from data processor 900 on an address bus 921a into a row address signal and a column address signal, and providing the same to DRAM 920 via an address bus 921b, a data buffer 914 for carrying out buffering of data transfer between data processor 900 and DRAM 920, and a control driver 916 for generating and providing to DRAM 920 via a control bus 923b a control signal required for driving DRAM according to a control signal provided from data processor 900 on a control bus 923a. Data buffer 914 carries out data transmission/reception with data processor 900 via a data bus 922a, and carries out data transmission/reception with DRAM 920 via a data bus 922b.

Control driver 916 provides a wait signal to CPU 900 via control bus 923a when DRAM 920 is not accessible due to carrying out, for example, an automatic refresh operation.

FIG. 2 schematically shows a structure of a conventional DRAM used as DRAM 920 of FIG. 1. In FIG. 2, a structure of a 4M-bit DRAM is shown with four data input/output terminals (referred to as "IO pin" hereinafter).

Referring to FIG. 2, a 4M-bit DRAM includes a memory cell array 57 having a plurality of dynamic type memory cells 57a arranged in a matrix of 1024 ($=2^{10}$) rows$\times$4096 ($=2^2 2^{10}$) columns. In memory cell array 57, a word line WL is provided corresponding to each row of memory cells. A pair of bit lines BL and /BL is arranged corresponding to one column of memory cells 57a.

The 4M-bit DRAM further includes a row address buffer 52 for receiving an external address signal Ai (i=0-9) for generating complementary row address signals RAi and /RAi, a row decoder 53 for decoding row address signals RAi and /RAi from row address buffer 52 to select a corresponding word line in memory cell array 57, a sense amplifier group 58 having a sense amplifier SA provided corresponding to each column (each bit line pair) of memory cell array 57 for detecting and amplifying data of a memory cell connected to a selected word line by row decoder 53, a column address buffer 55 for receiving an externally applied address signal Ai for generating complementary column address signals CAi and /CAi, a column decoder 56 for decoding a predetermined address signal bit from column address buffer 55 to select a corresponding column in memory cell array 57, and an I/O control circuit 59 for selecting a column according to a predetermined column address signal bit from column address buffer 55 out of the columns selected by column decoder 56 for carrying out data reception/transmission with the selected column.

Column decoder 56 receives column address signal bits CA2-CA9 and /CA2-/CA9 from column address buffer 55. Because there are 4096 columns in memory cell array 57, column decoder 56 selects a bit line pair provided corresponding to 16 columns in memory cell array 57 by a column address signal of 8 bits.

Control circuit 59 further selects 4 columns out of the 16 columns selected by column decoder 56 according to column address signal bits CA0, /CA0, CA1 and /CA1 from column address buffer 55. I/O control circuit 59 transmits internal write data DI00-DI03 to the selected 4 columns when a write control signal WD from a write control signal generation circuit 63 which will be described afterwards is activated.

The DRAM further includes an input circuit 64 for input of data, an output circuit 61 for providing data, a write control signal generation circuit 63 for controlling data input and output, and a /RAS buffer 51 and a /CAS buffer 54 for controlling the write control signal generation circuit 63 and internal operation of this DRAM.

/RAS buffer 51 receives an externally applied row address strobe signal ext /RAS to provide an internal row address strobe signal /RAS. Internal row address strobe signal /RAS is used to activate the circuit associated with row selection inside the DRAM. In FIG. 2, internal row address strobe signal /RAS is indicated as to be applied only to row address buffer 52. Row address buffer 52 responds to activation of internal row address strobe signal /RAS to latch an external address signal Ai, and to provide row address signals RAi and /RAi.

/CAS buffer 54 receives an external column address strobe signal ext /CAS to generate an internal column address signal /CAS. Internal column address strobe signal /CAS provides the latching and generating timing of a column address signal in column address buffer 55, and also controls the input and output operation of data.

Output control signal generation circuit 60 receives an internal column address strobe signal /CAS from /CAS buffer 54 and an externally applied output enable signal /OE to generate an output control signal OD when both of these two signals attain an activated state of a low level. Output control signal OD attains a high level at the time of activation.

Write control signal generation circuit 63 receives a column address strobe signal /CAS from /CAS buffer 54 and an externally applied write enable signal /WE to generate and provide to I/O control circuit 59 a write control signal WD having a constant pulse width when both the two signals attain an activated state of a low level. Write control signal WD attains a high level at the time of activation.

Output circuit 61 includes output buffers 61a-61d activated in response to an output control signal OD from output control signal generation circuit 60 to provide to IO pins 62a-62d data DQ0-DQ3 of logics respectively corresponding to internal output data DO0-DO3 of 4 bits provided from I/O control circuit 59.

Input circuit 64 includes input buffers 64a–64d for receiving at IO pins 62a–62d external write data DQ0–DQ3 to provide in parallel internal write data DI0–DI3 of logics corresponding to these external write data to I/O control circuit 59. Next, the operation of the 4M-bit DRAM of FIG. 2 will be described.

First, a data reading operation will be described with reference to the operation waveform diagram of FIG. 3.

An address signal Ai (i=0–9) corresponding to a row address is provided from an external source. At time t1 when an external row address strobe signal ext /RAS falls to a low level of an activated state, an internal row address strobe signal /RAS provided from /RAS buffer 51 attains an activated state of a low level. In response to internal row address strobe signal /RAS of an activated state, row address buffer 52 latches an address signal Ai to provide row address signals RAi and /RAi.

Row decoder 53 decodes row address signals RAi and /RAi from row address buffer 52 to select a word line corresponding to a row address in memory cell array 57 according to the decoded result. The data of the memory cell array connected to the selected word line WL is read out onto a corresponding bit line. Then, sense amplifier SA in sense amplifier group 58 is activated, whereby the potential of a corresponding bit line pair is amplified differentially.

In parallel to this row selection and sensing operation, output enable signal /OE provided to output control signal generation circuit 60 attains a low level of an activated state at time t2. At this time point, internal column address strobe signal /CAS is not activated, so that output control signal OD provided from output control signal generation circuit 60 maintains a low level of a deactivated state.

An address signal Ai (I=0–9) corresponding to a Y address (column address) is applied. Then, an external column address strobe signal ext /CAS falls to a low level of an activated state at time t3. In response, internal column address strobe signal /CAS generated from /CAS buffer 54 attains a low level of an activated state. In response to an internal column address strobe signal /CAS of an activated state, column address buffer 55 latches an address signal Ai to provide column address signals CAi and /CAi. Column decoder 56 decodes column address signal bits CA2, /CA2–CA9, /CA9 to select 16 pairs of bit lines in memory cell array 57.

The data of the 16 pairs of bit lines selected by column decoder 56 are provided to I/O control circuit 59, whereby the data of 16 bits is amplified by a preamplifier not shown.

I/O control circuit 59 further selects 4 bits out of the 16-bit data amplified by the preamplifier according to the logics of column address signal bits CA0, /CA0, CA1 and /CA1 from column address buffer 55. The data of 4 bits are amplified by a main amplifier in I/O control circuit 59 to be transmitted to output buffers 61a–61d in output circuit 61 as internal output data DO–DO3.

Output control signal generation circuit 60 raises output control signal OD to a high level of an activated state when internal column address strobe signal /CAS becomes activated at time t3. In response, output buffers 61a–61d in output circuit 61 are enabled, whereby data DO0–DO3 transmitted from I/O control circuit 59 are buffered and provided in parallel to IO pins 62a–62d as data DQ0–DQ3.

A data writing operation will be described hereinafter with reference to FIG. 4. Write data DQ0–DQ3 are provided to IO pins 62a–62d. Input buffers 64a–64d in input circuit 64 provide to I/O control circuit 59 internal data DI0–DI3 of logics corresponding to write data DQ–DQ3 applied to IO pins 62a–62d.

Here, an address signal Ai (i=0–9) corresponding to an X address (row address) is provided from an external source. When external row address strobe signal ext /RAS attains a low level of an activated state at time t1, row address buffer 52 latches an address signal Ai to provide internal row address signals RAi and /RAi. According to row address signals RAi and /RAi, a corresponding word line in memory cell array 57 is selected by row decoder 5.

At time t2, write enable signal /WE attains an activated state of a low level. Here, write control signal WD provided from write control signal generation circuit 63 maintains the low level of a deactivated state since internal column address strobe signal /CAS is not yet activated.

An address signal Ai (i=0–9) corresponding to a Y address (column address) is applied. Then, at time t3, an external column address strobe signal ext /CAS falls to a low level of an activated state. In response, internal column address strobe signal /CAS provided from /CAS buffer 54 attains a low level of an activated state. Column address buffer 55 latches the address signal Ai to provide column address signals CAi and /CAi. Column decoder 56 decodes column address signals CA2, /CA2–CA9, /CA9 to select 16 pairs of bit lines in memory cell array 57, whereby these 16 pairs of bit lines are connected to I/O control circuit 59.

At time t3 when internal column address strobe signal /CAS attains an activated state, write control signal WD provided from write control signal generation circuit 63 rises to a high level of an activated state for a predetermined time. In response to this write control signal WD of an activated state, I/O control circuit 59 decodes column address signals CA0, /CA0, CA1 and /CA1 from column address buffer 55 to transmit respectively internal write data DI0–DI3 provided from input buffers 64a–64d to 4 pairs of bit lines out of the 16 bit line pairs.

When external row address strobe signal ext /RAS rises to a high level, and external column address strobe signal /CAS rises to a high level at time t4, one memory cycle is completed.

As described above, signals /RAS and /CAS must be pulled down to a low level of an activated state to access a DRAM. When an external row address strobe signal ext /RAS once attains a deactivated state of a high level, external row address strobe signal ext /RAS cannot be pulled down to a low level until the elapse of a time period called a RAS precharge time tRAS. This is to reliably precharge the potential of a bit line or the like to a predetermined potential. Therefore, there is a problem that a DRAM cannot be accessed at high speed.

A possible consideration to implement a high speed memory system is to provide in parallel a plurality of DRAMs to reduce the access time effectively by sequentially accessing these plurality of DRAMs.

FIG. 5 shows an embodiment of such a memory system structure. Referring to FIG. 5, a memory system includes a memory #A925a and a memory #B925b provided in parallel with a data bus 922. A processor 926 is connected to data bus 922. Processor 926 is not limited to a CPU and may be a data processor such as a DSP (Digital Signal Processor). An address is applied to memories #A925a and #B925b in common via an address bus 921. Similarly, a signal /RAS defining a memory cycle is also applied. Separate input/output control signals φRW1 and φRW2 are provided to memory #A925a and memory #B925b, respectively. Signals /RAS, φRW1 and φRW2 are transmitted on a control bus 923. Input/output control signals φRW1 and φRW2 correspond to respective combinations of signals /RAS, /WE, and /OE.

When signals φRW1 and φRW2 attain a low level of an activated state, data input/output with respect to memory #A925a and memory #B925b is allowed. The operation of the memory system of FIG. 5 will be described hereinafter with reference to an operation waveform diagram shown in FIG. 6.

With signal /RAS attaining an activated state of a low level and memories #A925a and #B925b attaining an operational state, an internal row selecting operation is executed. Then, input/output control signal φRW1 is pulled down to a low level of an activated state, and memory #A925a is accessed to carry out input or output of data DQA. Input/output control signal φRW1 is rendered to a deactivated state of a high level, simultaneous to the fall of input/output control signal φRW2 to an activated state of a low level. Then, data input/output with respect to memory #B925b is executed.

Data of memory #A925a and data of memory #B925b will appear continuously on data bus 922, so that data input/output can be executed at high speed without being affected by a RAS precharging time.

In the structure shown in FIG. 5, toggling of a column address strobe signal /CAS such as in a page mode operation is not required, and access can be carried out more rapidly than in a page mode. In page mode, a column address strobe signal /CAS is toggled while row address strobe signal /RAS maintains a low level of an activated state as shown in FIG. 7. In response to signal /RAS attaining an activated state, a row address signal is latched to select one row in the DRAM array. In response to the transition of signal /CAS to an activated state, a column address signal is fetched to carry out a column selecting operation in a DRAM array. Because a different column address signal is fetched for each toggle of signal /CAS, data reading or writing is executed of a memory cell corresponding to each column address. FIG. 7 shows an example where data reading is carried out. In such a page mode, there is a CAS access time of tCAS starting from the fall of signal /CAS up to the output of a valid data. Because input/output control signals φRW1 and φRW2 include a signal /CAS in the memory system of FIG. 5, there exists CAS access time for each of memories #A and #B. However, the toggle of column address strobe signal /CAS can be excluded effectively to eliminate the transition time of signal /CAS to a high level, resulting in access at high speed.

In a memory system, an error detection circuit for ensuring reliability of data is provided. A parity bit is generally used for error detection. A bit of "0" or "1" is added so that the number of "1" in the data becomes an even number or an odd number. This additional bit is called a parity bit.

FIG. 8 schematically shows a structure of a memory system including error checking functionality. Referring to FIG. 8, a memory system includes a data memory 930 for storing data, a parity bit memory 932 for storing a parity bit corresponding to each data stored in data memory 930, and a parity checking circuit 934 for generating a parity bit and carrying out error detection. An address signal and a control signal are applied to data memory 930 and parity bit memory 932 via an address bus 933 and a control bus 935.

Data memory 930 carries out data transmission/reception with data bus 931. FIG. 8 shows an embodiment where data bus 931 has a width of 8 bits. Data generally has a byte as the minimum unit, and one parity bit is added to a 8-bit data.

In data writing operation, parity checking circuit 934 generates one bit of parity bit from the data of 8 bits on data bus 931 to write the same into parity bit memory 932. In data reading, parity checking circuit 934 receives data of 8 bits from data memory 930 read out on data bus 931 and a parity bit read out from parity bit memory 932 to make determination whether the number of "1"s included in the data bits and the parity bit is an even number (or an odd number). An error flag is generated according to this determination to indicate whether an error bit is included in the data bit. The operation of parity checking circuit 934 will be described briefly with reference to FIGS. 9 and 10.

The operation of the parity checking circuit in data writing will be described with reference to FIG. 9. In general, a write enable signal /WE is pulled down to an activated state of a low level prior to column address strobe signal /CAS (early write cycle). In response to write enable signal /WE (applied via control bus 935), parity checking circuit 934 fetches the write data on data bus 931 to generate a parity bit PB. When column address strobe signal /CAS attains an activated state of a low level, write data D and parity bit PB are written into data memory 930 and parity bit memory 932, respectively.

The operation of data reading will be described with reference to FIG. 10. Following the activation of signal /CAS to a low level, data bit Q from data memory 930 and parity bit PB from parity bit memory 932 attain an ascertained state after an elapse of a predetermined time. Using these data bits of the valid state, parity checking circuit 934 counts the number of "0"s (or "1"s) included therein to make determination whether an error bit is included in data bit Q according to the counted result. When signal /CAS attains a deactivated state of a high level, an error flag from parity checking circuit 934 is decided.

By using the above-described parity checking circuit 934, an error in a data bit can be checked to form a memory system of high reliability.

FIG. 11 shows a specific structure of a memory system including conventional parity checking functionality. Referring to FIG. 11, the memory system includes first and second memory groups 10 and 30 connected parallel to a data bus 20 of a width of 16 bits.

First memory group 10 includes two memory sub-groups 12 and 13. Second memory group 30 includes two memory sub-groups 32 and 33.

Memory sub-group 12 includes 4M-bit DRAMs 12a and 12b, each including four IO pins 11. Memory sub-group 13 includes 4M-bit DRAMs 13a and 13e, each including four IO pins 11. Each IO pin 11 of DRAMs 12a and 12b of memory sub-group 12 is connected to control buses 20a and 20b of a width of 4 bits. IO pins 11c and 11d of DRAMs 13a and 13b are connected to control buses 20c and 20d, respectively, of a width of 4 bits.

Memory sub-group 32 includes 4M-bit DRAMs 32a and 32b having four IO pins 31a and 31b, respectively.

Memory sub-group 33 includes 4M-bit DRAMs 33a and 33b having four IO pins 31c and 31d, respectively. IO pins 31a, 31b, 31c and 31d are connected to control buses 20a, 20b, 20c and 20d, respectively.

Write enable signal /WE, output enable signal /OE, external row address strobe signal ext /RAS, and an address signal are provided in common to DRAMs 12a, 12b, 13a, 13b, 32a, 32b, 33a, and 33b. External column address strobe signal ext /CAS0 is applied to DRAMs 12a and 12b of memory sub-group 12. External column address signal ext /CAS1 is applied to DRAMs 13a and 13b of memory sub-group 13. External column address strobe signal ext /CAS2 is applied to DRAMs 32a and 32b of memory sub-group 32. External column address strobe signal ext /CAS3 is applied to 4M-bit DRAMs 33a and 33b of memory sub-group 33.

According to the above-described structure, control of data input/output can be carried out in the units of memory sub-groups, i.e. in the units of 8 bits.

The memory system further includes a parity bit memory 40 having 1M-bit DRAMs 42a, 42b, 42c and 42d provided corresponding to memory sub-groups 12, 13, 32 and 33. 1M-bit DRAMs 42a–42d respectively include one of IO pins 41a–41d. In FIG. 11, a parity checking circuit for generating a parity bit and carried out parity checking is indicated simply by blocks 43a, 43b, 43c and 43d. A control signal similar to that provided to corresponding memory sub-group is applied to parity checking circuits 43a and 43d. For the sake of simplification, this signal path and the data input/output path are not shown.

A control signal similar to that applied to a corresponding memory sub-group is provided to each of 1M-bit DRAMs 42a, 42b, 42c and 42d. The operation will be described briefly hereinafter.

First, the operation of providing data of 16 bits from memory group 10 will be described. Here, external row address strobe signal ext /RAS attains an activated state of a low level. Therefore, 4M-bit DRAMs 12a, 12b, 13a, 13b, 32a, 32b, 33a and 33b latch an applied address signal as a row address signal. Similarly, in parity bit memory 40, 1M-bit DRAMs 42a–42d latch a row address signal.

Then, external column address strobe signals ext /CAS0 and ext /CAS1 provided to first memory group 10 attain an activated state, and DRAMs 12a, 12b, 13a, 13b in memory group 10 latch an address signal as a column address signal.

In second memory group 30, external column address strobe signal ext /CAS2 and ext /CAS3 both maintain the deactivated state of a high level. Therefore, although 4M-bit DRAMs in second memory group 30 execute a column selecting operation, an output high impedance state is maintained since an output control signal is not generated as shown in FIG. 2.

When output enable signal /OE attains an activated state of a low level, data of 16 bits are provided on data bus 20 from first memory group 10 via IO pins 11a–11d. Simultaneously, a parity bit is provided from 1M-bit DRAMs 42a and 42b in parity memory circuit 40. Parity checking circuits 43a and 43b check whether the number of "1"s in the data of 8 bits is an even number (or an odd number) on the basis of the parity bit provided from 1M-bit DRAMs 42a and 42b, and the data provided from memory sub-groups 12 and 13. An error flag is set according to this checking result.

Next, the operation of writing data of 16 bits into memory group 10 will be described hereinafter. Similar to data reading, an external row address strobe signal ext /RAS and external column address strobe signals ext /CAS0 and ext /CAS1 are applied to memory group 10. External column address strobe signals ext /CAS2 and ext /CAS3 maintain the high level of a deactivated state for memory group 30. As a result, data writing to memory group 30 is inhibited.

When write enable signal /WE and external column address strobe signals ext /CAS0 and ext /CAS1 both attain an activated state of a low level, data of 16 bits on data bus 20 are written into 4M-bit DRAMs 12a, 12b, 13a and 13b in memory group 10. Parallel to this writing operation, parity checking circuits 943a and 943b respond to write enable signal /WE to generate a parity bit of "1" or "0" according to the number of "1" included in the data applied on data bus 20. In memory circuit 40, 1M-bit DRAMs 42a and 42b both attain a writing state, and parity bits generated from parity checking circuits 943a and 943b are written via IO pins 41a and 41b.

The reading and writing operation of data with respect to memory group 30 is similar to that of the first memory group 10. In this case, data input/output is inhibited in memory group 10, i.e. external column address strobe signals ext /CAS0 and ext /CAS1 both attain a deactivated state of a high level. Parity checking circuits 943c and 943d carry out parity checking at the time of writing a parity bit and reading out data with respect to 1M-bit DRAMs 42c and 42d.

In the memory system of FIG. 11, 4 DRAMs of a x1 organization is used for parity bit storage. The four DRAMs 42a–42d are activated simultaneously by external row address strobe signal ext /RAS and execute an operation related to row selection. However, the input/output of a parity bit is actually carried out only by two DRAMs and power is wasted. Furthermore, because four DRAMs are used, the circuit complexity of parity bit memory 40 is increased to become a bottleneck in forming a memory system of a small level.

An approach of using one 4M-bit DRAM (1M×4-bit DRAM) in a parity bit memory 40 is considered as shown in FIG. 12 to solve the above-described problem.

Referring to FIG. 12, a parity bit memory 40 includes one 4M-bit DRAM 43. 4M-bit DRAM 43 has a structure similar to a 4M-bit DRAM used in memory groups 10 and 30 for data bit storage. Parity bit memory 40 further includes a 4-input NAND circuit 44 for receiving external column address strobe signals ext /CAS0, ext /CAS1, ext /CAS2 and ext /CAS3, and an inverter circuit 45 for inverting an output of NAND circuit 44. An external column address strobe signal ext /CAS corresponding to 4M-bit DRAM 43 is generated from inverter circuit 45.

The structures of memory groups 10 and 30 are similar to those shown in FIG. 11. In FIG. 12, the parity checking circuit is not explicitly shown for the sake of simplification. NAND circuit 44 provides a signal of a high level when external column address strobe signal ext /CASk (k=0–3) attains an activated state of a low level, and column address strobe signal ext /CAS generated from inverter circuit 45 attains an activated state of a low level.

Parity bit memory 43 has a structure shown in FIG. 2. When column address strobe signal ext /CAS provided from inverter circuit 45 attains an activated state of a low level, data reading to IO pins 41a–41d and writing data applied to IO pins 41a–41d to selected memory cells are carried out. In this case, the following problem will occur.

For the sake of simplifying the explanation, it is assumed that a parity checking circuit is provided for each memory sub-group as shown in FIG. 13. More specifically, parity checking circuits 943a–943d are provided for memory sub-groups 12, 13, 32, and 33, respectively. Memory sub-groups 12 and 32 share a 8-bit data bus 20A, and memory sub-groups 13 and 33 share a 8-bit data bus 20B. A logic gate 46 shown in FIG. 13 includes NAND circuit 44 and inverter circuit 45 shown in FIG. 12.

The case is considered where data is to be written into memory sub-groups 12 and 13. Here, writing data to memory sub-groups 32 and 33 is inhibited. Parity checking circuits 943a and 943d execute a parity bit generation operation in response to a write enable signal /WE. Here, parity checking circuits 943a and 943c generate a parity bit from the data on 8-bit data bus 20A, and parity checking circuits 943b and 943d generate a parity bit from the 8 bit data on 8-bit data bus 20B. The parity bits generated by parity checking circuits 943a–943d are attained in response to the fall of external column address strobe signal ext /CASi to a low level. The parity bits generated by parity checking circuits 943a–943d are written in parallel to parity bit memory 43.

Here, the parity bits generated by parity checking circuits 943c and 943d are parity bits irrelevant of data written into memory sub-groups 32 and 33. Therefore, there is a problem that an erroneous parity bit is written into parity bit memory 43. Similar to a DRAM, when the outputs of parity checking circuits 943a–943d attain an ascertained state from a high impedance state in response to the fall of external column address strobe signal ext /CASi, the outputs of parity checking circuits 943c and 943d attain a high impedance state. Therefore, uncertain data of a high impedance state will be written into parity bit memory 43. Similarly, an erroneous parity bit data is written.

The data reading operation will next be described. A case is considered where data of memory sub-groups 12 and 13 are read out. Here, parity bits of 4 bits are applied from parity bit memory 43 to parity checking circuits 943a–943d. Parity checking circuits, 943a and 943b carries out error checking of a parity bit according to the data read out from memory sub-groups 12 and 13 and the parity bit provided from parity bit memory 43. In this case, proper error checking can be carried out. Parity checking by parity checking circuits 943c and 943d are not required. This means that parity bits not required are provided from parity bit memory 43. (All the output buffers in the output circuit shown in FIG. 2 operate in parallel). Therefore, there is a problem of increase in consumption power in parity bit memory 43.

When a parity checking circuit is provided for each 8-bit data bus instead of the structure of FIG. 13, and the connection between a parity checking circuit and a data bus is switched according to an external column address strobe signal ext /CASk (k=0-3), the IO pins of parity bit memory 43 attain a high impedance state in writing data to de-selected memory sub-groups, resulting in uncertain data being written. In reading out data, unrequired parity bits will be provided on signal lines attaining a high impedance state from the IO pins corresponding to the de-selected memory sub-group. Therefore, the above-described problem will occur in either case.

SUMMARY OF THE INVENTION

In view of the foregoing, an object of the present invention is to provide a semiconductor memory device of low consumption power and in which erroneous parity bit is not written thereto.

Another object of the present invention is to provide a semiconductor memory device that can control data input and output for each IO pin.

A semiconductor memory device according to the present invention includes N data access nodes, a column select designating signal generation circuit for generating a column select designating signal corresponding to each data access node, and a selecting circuit for selecting simultaneously N memory cells from a memory cell array according to an address signal. These selected N memory cells correspond to each of the N data access nodes.

The semiconductor memory device according to the present invention further includes a circuit responsive to a node identification signal indicating whether a data access node is valid/invalid and at least one column select designating signal for carrying out data reading or writing by accessing a memory cell out of the selected N memory cells corresponding to a data access node with a node identification signal indicating a valid state.

According to a column select designating signal, i.e. a column address strobe signal, input/output of data can be driven individually. Therefore, unrequired writing and output of data can be inhibited.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a signal waveform diagram showing a data reading operation of the DRAM of FIG. 2.

FIG. 4 is a signal waveform diagram showing a data writing operation of the DRAM of FIG. 2.

DESCRIPTION OF THE PREFERRED EMBODIMENTS

Embodiment 1

Overall Structure

Figure 1:
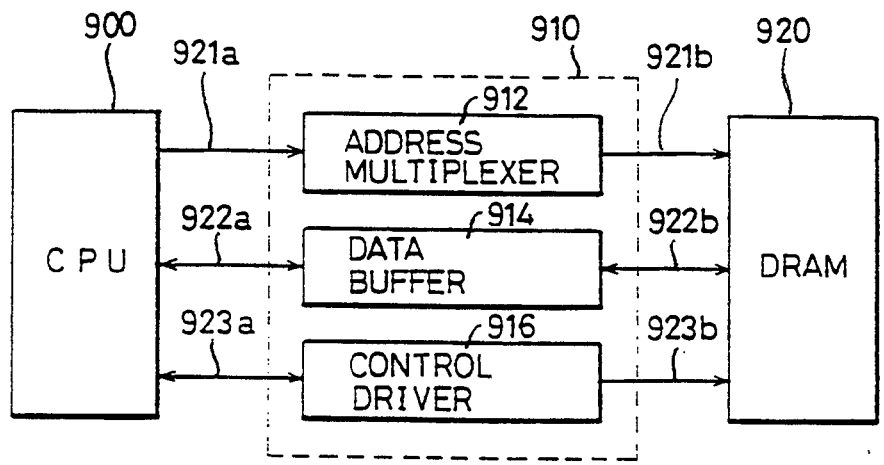
FIG. 1 shows a general structure of a data processing system.
Figure 5:
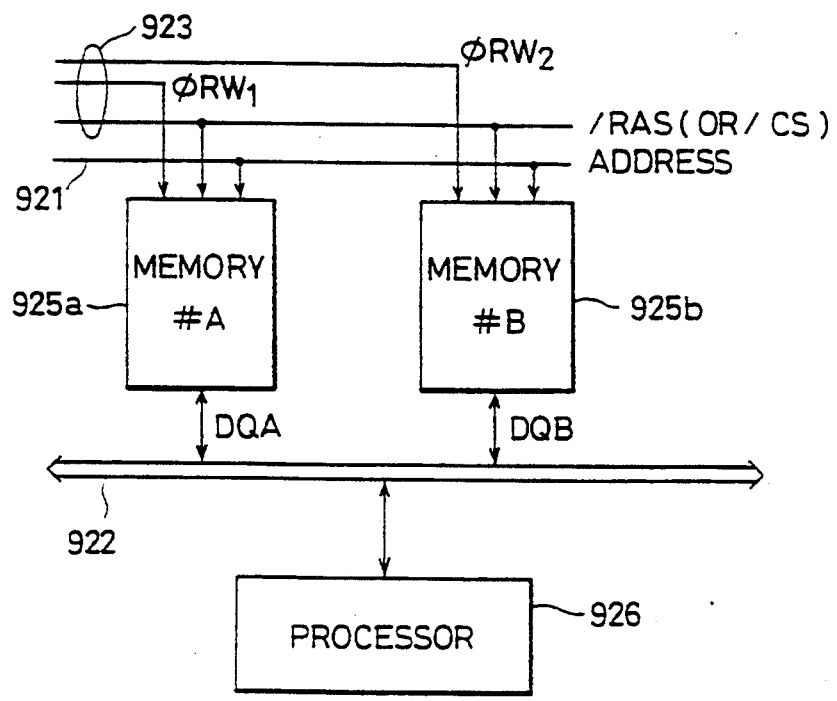
FIG. 5 schematically shows a structure of a data processing system using a plurality of memories.
Figure 2:
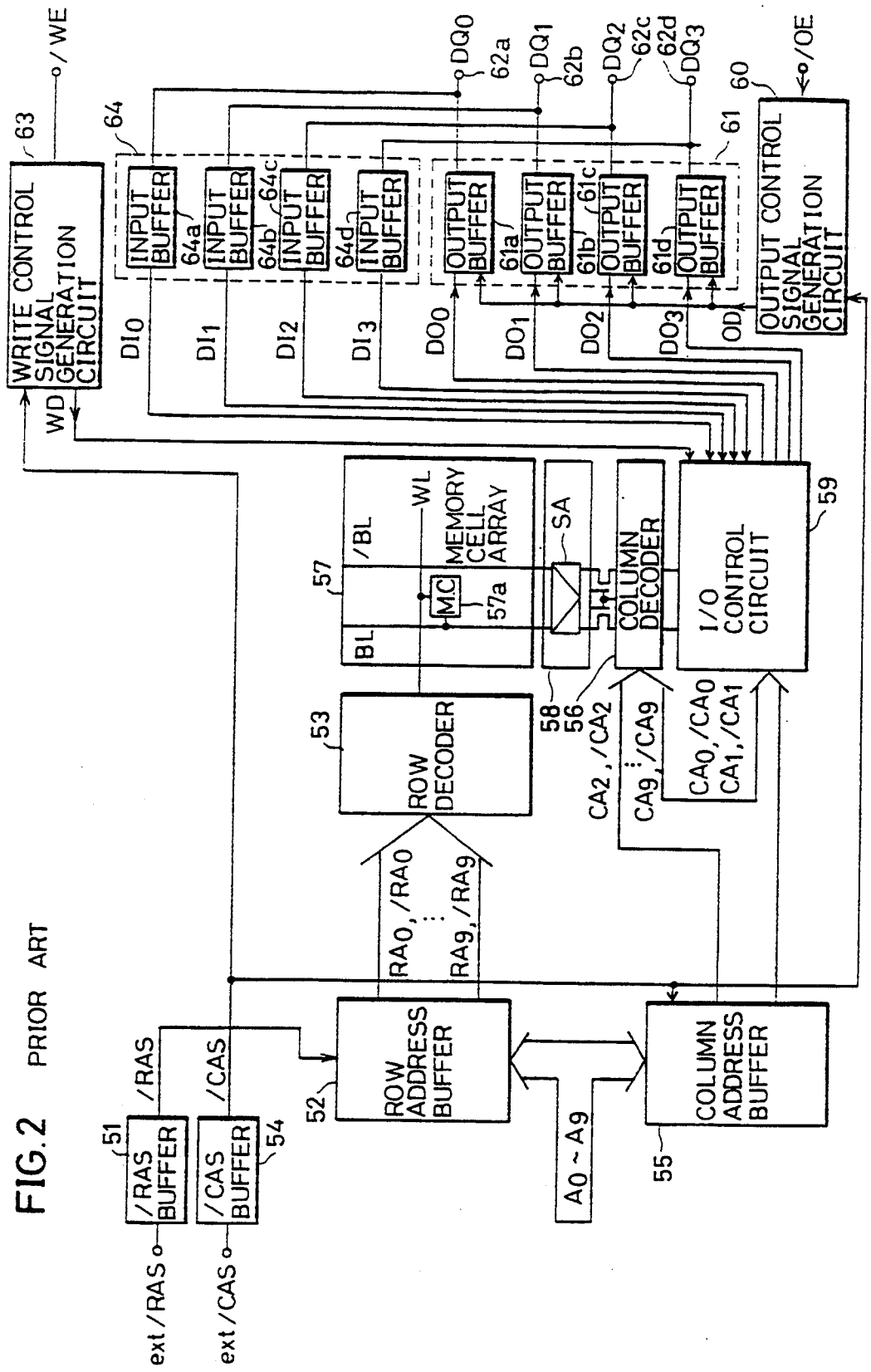
FIG. 2 schematically shows a structure of a conventional 4M-bit DRAM.
Figure 6:
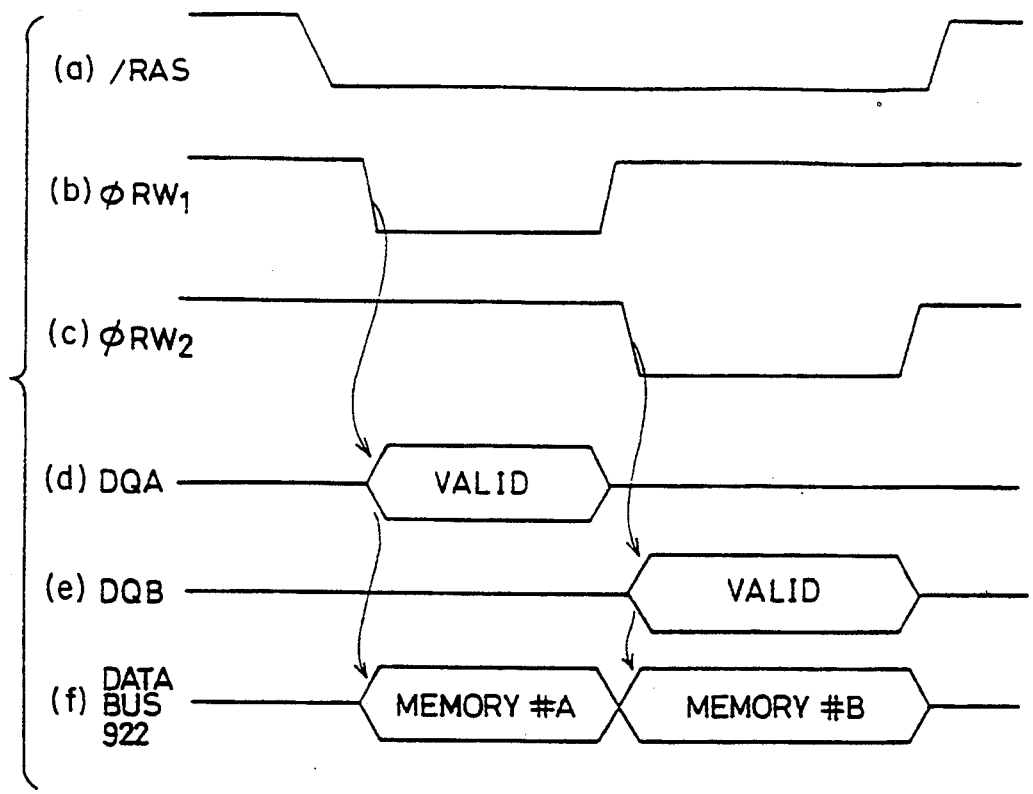
FIG. 6 is a signal waveform diagram showing the operation of the memory system of FIG. 5.
Figure 7:
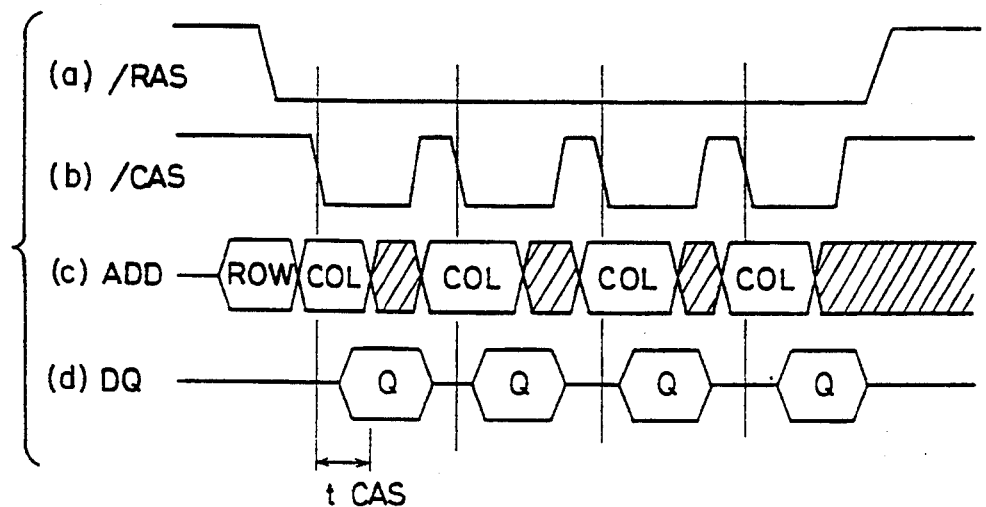
FIG. 7 is a signal waveform diagram showing a page mode operation of a conventional DRAM.
Figure 8:
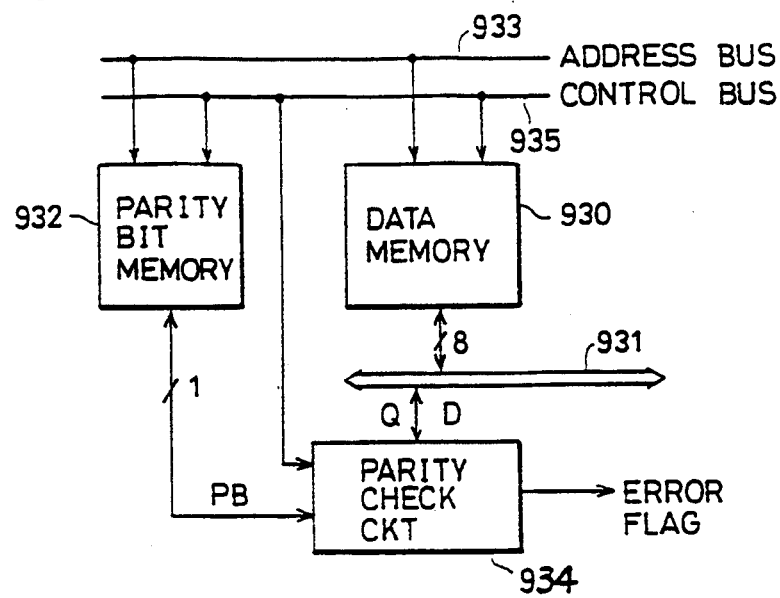
FIG. 8 shows a structure of a memory system including parity checking functionality.
Figure 9:
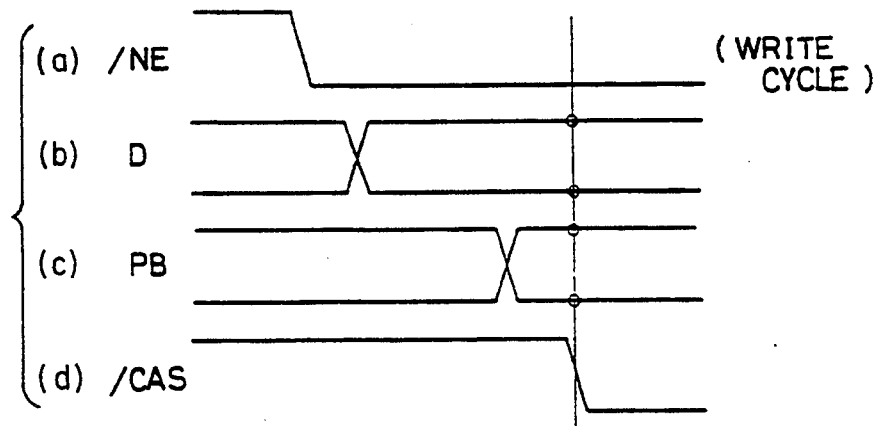
FIG. 9 is a signal waveform diagram showing the writing operation of the parity checking circuit of FIG. 8.
Figure 10:
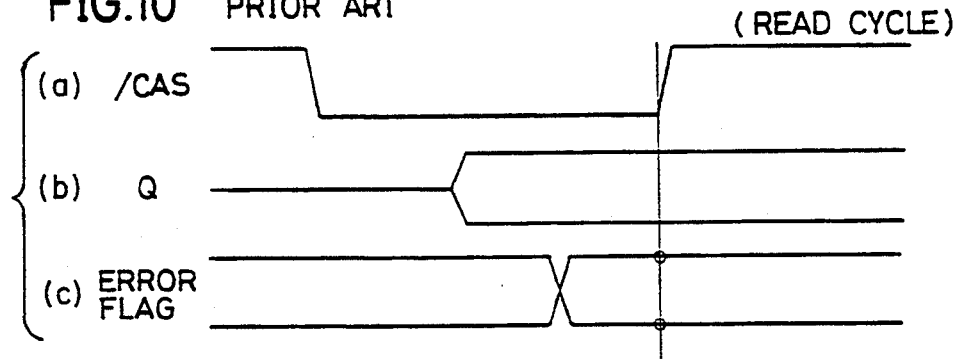
FIG. 10 is a signal waveform diagram showing operation of data reading of the parity checking circuit of FIG. 8.
Figure 11:
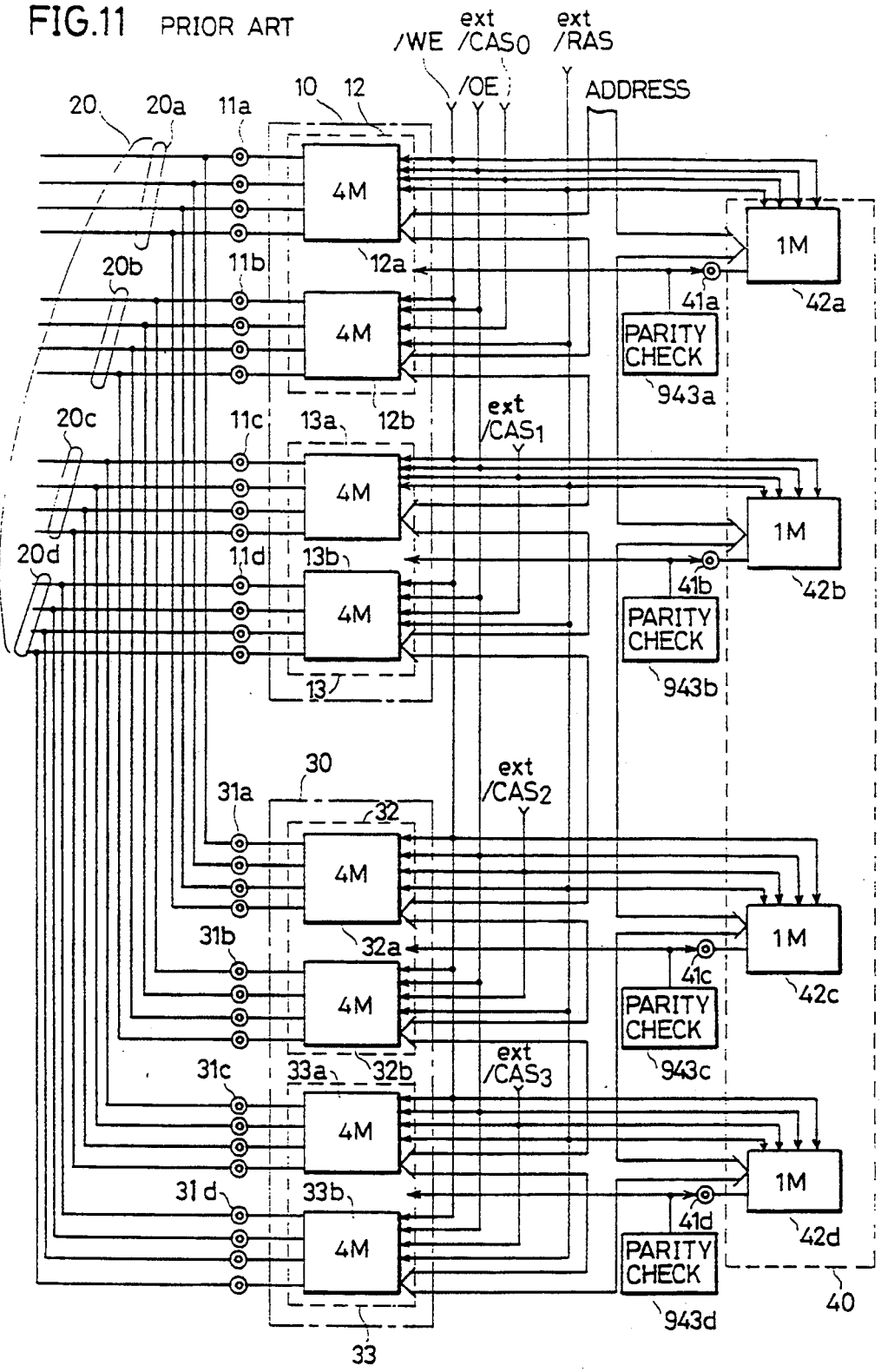
FIG. 11 shows a structure of a conventional memory system with a parity checking function.
Figure 12:
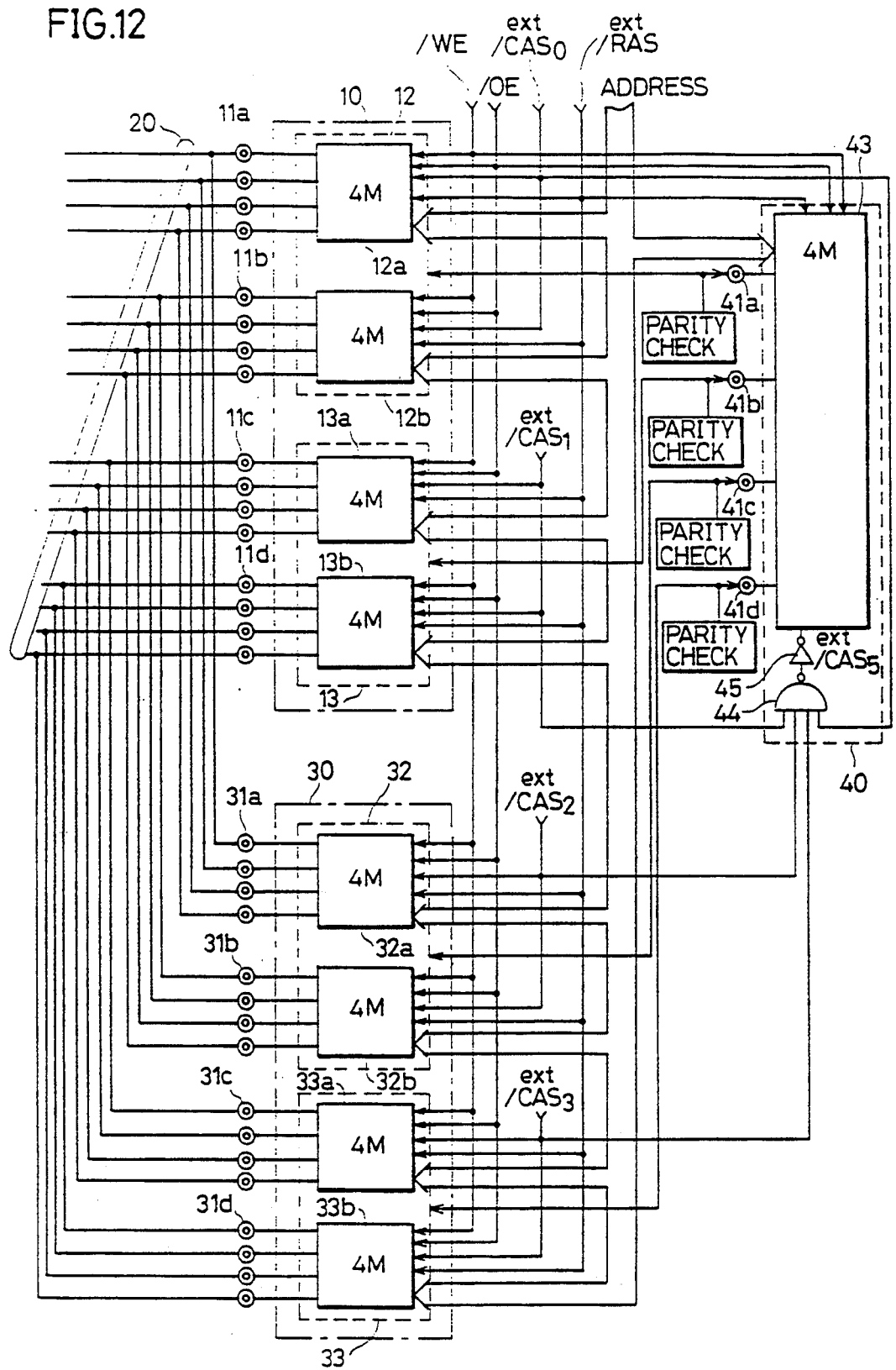
FIG. 12 is a modification of the memory system of FIG. 11.
Figure 13:
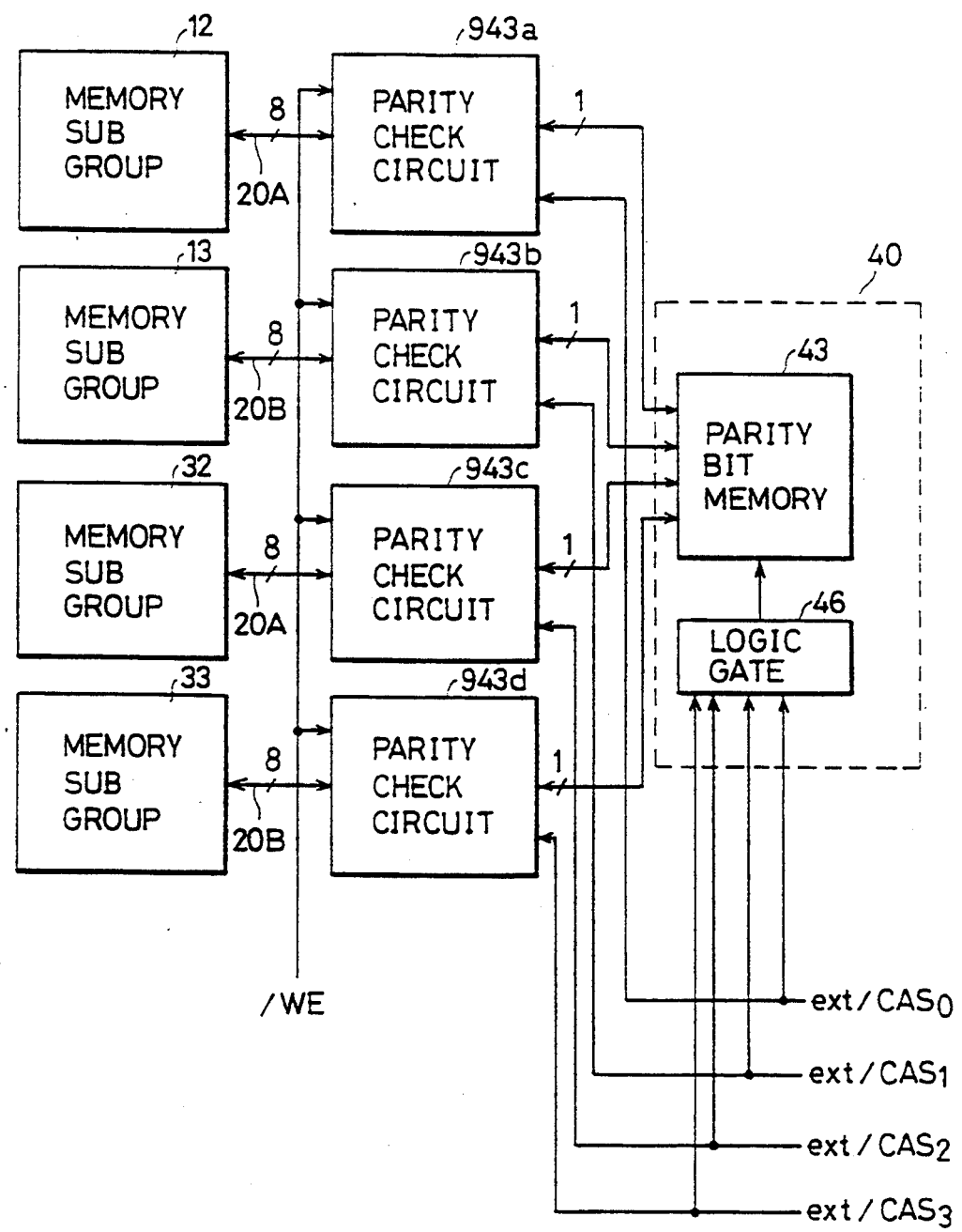
FIG. 13 is a diagram for describing the problems of the memory system of FIG. 12.
Figure 14:
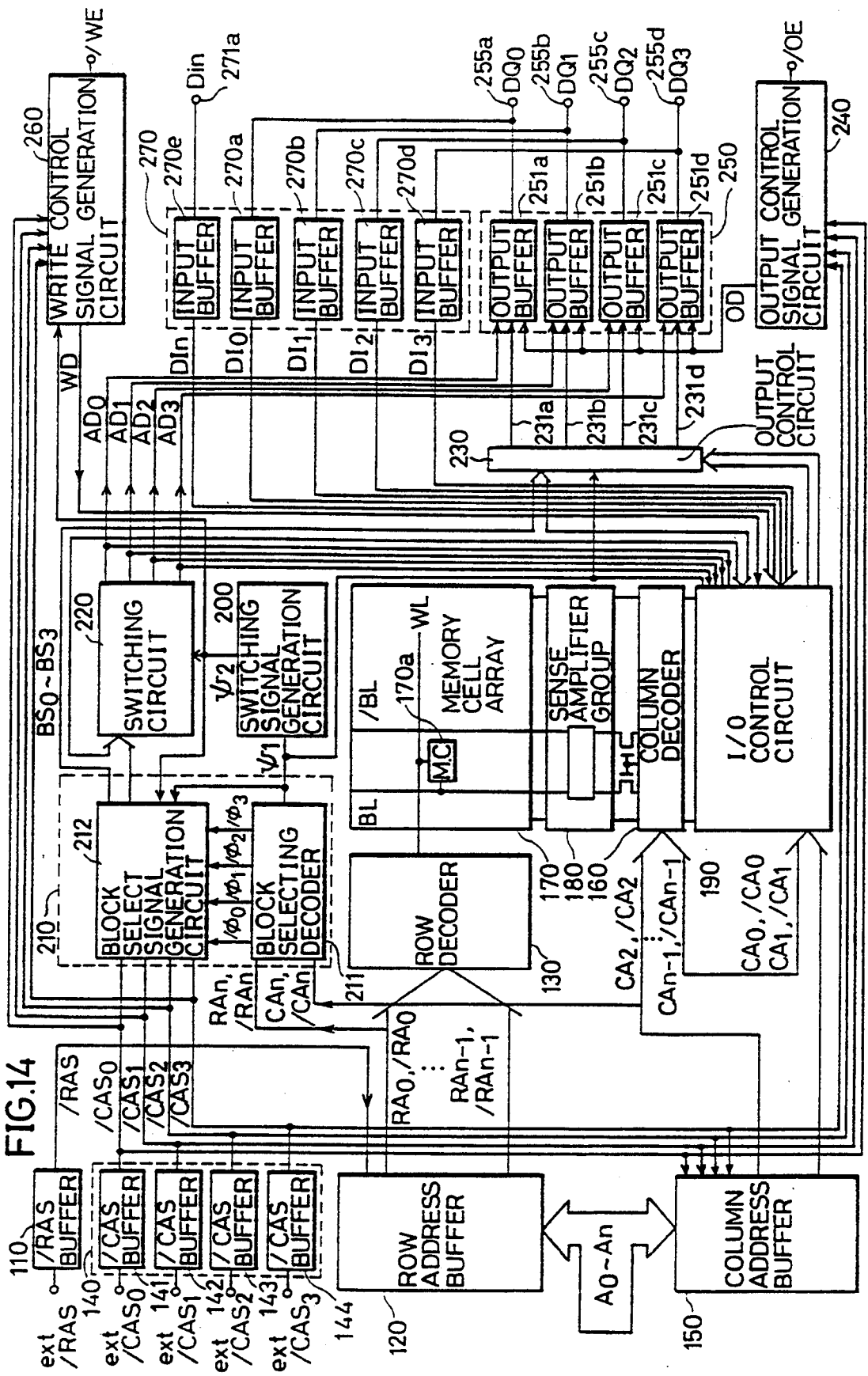
FIG. 14 is a block diagram showing the entire structure of a DRAM according to a first embodiment of the present invention.

FIG. 14 shows a structure of the overall structure of a semiconductor memory device according to a first embodiment of the present invention. Referring to FIG. 14, a DRAM is shown having four IO pins 255a-255d and a data input pin 271a that can selectively realize a x1 bit organization and a x4 bit organization.

Referring to FIG. 14, a DRAM includes a memory cell array 170 having a plurality of dynamic type memory cells 170a arranged in a matrix, a row address buffer 120 to receive an external address signal Aj (j=0-n) for generating internal row address signals RAj, /RAj, a row decoder 130 for decoding internal row address signals RAj and /RAj from row address buffer 120 to select a corresponding row (word line WL) in memory cell array 170, a sense amplifier group 180 of a plurality of sense amplifiers, each provided corresponding to each column (bit line pair BL, /BL) of memory cell array 170 for amplifying differentially the signal potential on a corresponding column, a column address buffer 150 for receiving an external address signal. Aj to generate internal column address signals CAj and /CAj, and a column decoder 160 for decoding internal column address signals CA2 to CAn-1 and /CA2 to /CAn-1 from column address buffer 150 to set 16 columns (16 pairs of bit lines) in memory cell array 170 to a selected state simultaneously for connecting the selected columns to I/O control circuit 190.

The DRAM further includes an input circuit 270 for carrying out data input, and an output circuit 250 for carrying out data output. Input circuit 270 includes an input buffer 270e provided corresponding to a data input node 271a, and input buffers 270a-270d provided corresponding to IO nodes 255a-255d, respectively. Output circuit 250 includes output buffers 251a-251d provided corresponding to IO nodes 255a-255d, respectively.

The DRAM further includes a /RAS buffer 110 to receive an external row address strobe signal ext /RAS for generating an internal row address strobe signal /RAS, a /CAS buffer circuit 140 to receive an externally applied column address strobe signal ext /CASk (k=0-3) for generating an internal column address strobe signal /CASk, a switching signal generation circuit 200 for generating signals Ψ1 and Ψ2 determining the operational manner (IO pin arrangement and the like) of this DRAM, a block selecting circuit 210 for generating a block selecting signal for selecting one block (4 bit line pairs) out of the 16 bit line pairs selected simultaneously by column decoder 160 according to a first switching signal Ψ1 from switching signal generation circuit 200, an internal column address strobe signal /CASk from a /CAS buffer, and address signals RAn, /RAn, CAn, /CAn from row and column address buffers 120 and 150, a switching circuit 220 for generating pin selecting signals AD0-AD3 for designating a node that can be used out of IO nodes 255a-255d according to a second switching signal Ψ2 from switching signal generation circuit 200 and a block selecting signal from block selecting circuit 210, a write control signal generation circuit 260 for generating a write control signal WD according to a second switching signal Ψ2 from switching signal generation circuit 200 and an internal column address strobe signal /CASk from CAS buffer circuit 140, an output control signal generation circuit 240 for generating an output control signal OD according to an internal column address strobe signal /CASk from /CAS buffer circuit 140 and an externally applied output enable signal /OE, and an output control circuit 230 for transmitting to output buffers 251a-251d data read out from I/O control circuit 190 according to a block selecting signal from block selecting circuit 210 and a first switching signal $\Psi1$ from switching signal generation circuit 200.

For the purpose of driving independently output buffers 251a–251d in output circuit 250, /CAS buffer circuit 140 includes four /CAS buffers 141, 142, 143 and 144 for receiving four external column address strobe signals ext /CAS0–ext /CAS3, respectively. Internal column address strobe signals /CAS0–/CAS3 are generated from /CAS buffers 141–144, respectively.

As will be described in detail afterwards, switching signal generation circuit 200 generates first and second switching signals $\Psi1$ and $\Psi2$ set by wire bonding and the like for defining the input and output structure of this DRAM. The DRAM can operate in three operation modes of mode A, mode B, and mode C.

Mode A is an operation mode in which only an external column address strobe signal ext /CAS0 is used, and input and output of 1 bit of data is carried out via an IO pin.

Mode B is an operation mode in which only one external column address strobe signal ext /CAS0 is used, and input and output of data of 4 bits are carried out in parallel via four IO nodes 251a–251d.

Mode C is an operation mode in which data input and output is carried out individually for IO nodes 255a–255d using four external column address strobe signals ext /CAS0–ext /CAS3.

In mode A, first and second switching signals $\Psi1$ and $\Psi2$ are set to a low level and a high level, respectively. In mode B, first and second switching signals $\Psi1$ and $\Psi2$ are set to a high level. In mode C, first and second switching signals $\Psi1$ and $\Psi2$ are set to a high level and a low level, respectively.

Block selecting circuit 210 includes a block selecting decoder 211 activated in response to a first switching signal $\Psi1$ from switching signal generation circuit 200 for decoding internal address signals RAn, /RAn, CAn, and /CAn, and a block selecting signal generation circuit 212 for generating column block selecting signals BS0–BS3 according to internal column address strobe signals /CAS0–/CAS3 from /CAS buffer circuit 140, first and second switching signals $\Psi1$ and $\Psi2$, and decode signals /$\phi$0–/$\phi$3 from block selecting decoder 211.

When the first switching signal $\Psi1$ attains a high level and indicates a x4 bit organization (mode B and mode C), block selecting decoder 211 sets decode signal$_s$ /$\phi$0–/$\phi$3 to a high impedance state. When the first switching signal $\Psi1$ attains a low level indicating mode A of a $\times$1 bit organization, the applied address signals are decoded to set one of the four decode signals /$\phi$0–/$\phi$3 to a low level.

Block selecting signal generation circuit 212 activates block selecting signals BS0–BS3 according to internal column address strobe signals /CAS0–/CAS3 when first and second switching signals $\Psi1$ and $\Psi2$ attain a high and a low level of mode C. Block selecting signal generation circuit 212 activates all block selecting signals BS0–BS3 when the first switching signal $\Psi1$ and the second switching signal $\Psi2$ both attain a high level indicating Mode B. When the first switching signal $\Psi1$ attains a low level and the second switching signal $\Psi2$ attains a high level, one of block selecting signal BS0–BS3 is activated according to decode signals /$\phi$0–/$\phi$3 from block selecting decoder 211.

Switching circuit 220 provides to a corresponding output node 231a–231d output data DO0–DO3 from I/O control circuit 190 corresponding to an activated block selecting signal out of block selecting signals BS0–BS3 when the second switching signal $\Psi2$ attains a high level (when in mode A or mode B). Output control circuit 230 selects one of data DO0–DO3 according to block selecting signals BS0–BS3 and provides the selected data to output node 231a corresponding to block selecting signal BS0 when the first switching signal $\Psi1$ attains a low level indicating mode A. The output nodes 231a–231d of output control circuit 230 are connected to the input portion of output buffers 251a–251d, respectively.

Output control signal generation circuit 240 activates an output control signal OD to a high level when output enable signal /OE attains an activated state of a low level and at least one of internal column address strobe signals /CAS0–/CAS3 attains an activated state of a low level.

IO pin selecting signals AD0–AD3 from switching circuit 220 are provided to output buffers 251a–251d included in output circuit 250. IO pin selecting signals AD0–AD3 from switching circuit 220 sets all IO pin selecting signals AD0–AD3 to an activated state when the second switching signal $\Psi2$ attains a high level and only one column address strobe signal /CAS0 is to be used. When the second switching signal $\Psi2$ attains a low level and indicates that the four column address strobe signals /CAS0–/CAS3 are to be used, IO pin selecting signals AD0–AD3 corresponding to block select signals BS0–BS3, respectively, are generated.

Output buffers 251a–251d are set to an output high impedance state when IO pin selecting signals AD0–AD3 attain a low level of a deactivated state.

When a second switching signal $\Psi2$ attains a low level indicating mode C, write control signal generation circuit 260 responds to a write enable signal /WE and an internal control address strobe signal /CASk both attaining an activated state to pull up write control signal WD to a high level of an activated state. When the second switching signal $\Psi2$ attains a high level and indicates mode A or B that uses only one column address strobe signal /CASk, write control signal WD attains a activated state of a high level for a predetermined time period according to activation of write enable signal /WE and internal column address strobe signal /CASk.

Input buffer 270e in input circuit 270 is connected to an input pin via data input node 271a when in mode A of a x1 bit organization. In mode B or C of a x4 bit organization, input buffer 270e is not connected to this data input pin, and is set to an input floating state.

Then, I/O control circuit 190 decodes column address signals CA0, CA1, /CA0 and /CA1 from column address buffer 150 according to first switching signal $\Psi1$, IO pin selecting signals AD0–AD3 and block selecting signals BS0–BS3 for carrying out data input-/output in the unit of x1 bit or x4 bits. The operation will be described briefly hereinafter.

(A) Mode A: one signal /CAS, one data input pin and data output pin are used.

In mode A, only output buffer 251a is connected to an output pin via a data output node 255a. Output buffers 251b–251d have IO nodes 255b–255d disconnected from IO pins. Also, an input pin is connected to input buffer 270e via data input node 271a. Therefore, data node 255a is used only for data output. Also, only external column address strobe signal ext/CAS0 is used. In this case, in /CAS buffer group 140, /CAS buffers 142–144 are disconnected from external pin terminals, and internal column address strobe signals /CAS1, /CAS2, and /CAS3 are fixed to a high level of a deactivated state.

Figure 15:
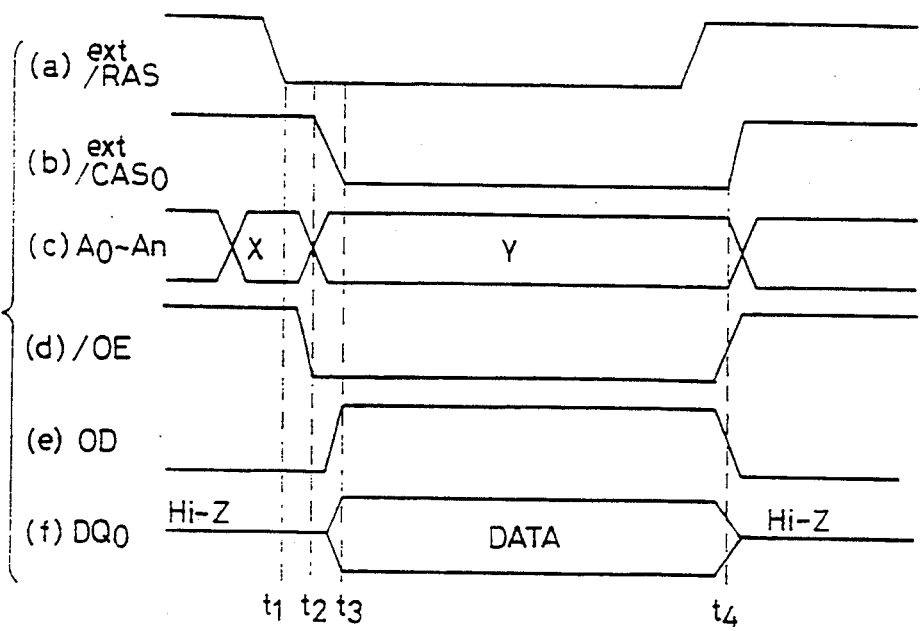
FIGS. 15-20 are signal waveform diagrams showing the operation of the DRAM of FIG. 14.

In switching signal generation circuit 200, the first switching signal $\Psi1$ is set to a low level, and the second switching signal $\Psi2$ is set to a high level. First, a data reading operation will be described with reference to the waveform diagram of FIG. 15.

When external row address strobe signal ext /RAS rises to a low level, internal row address strobe signal /RAS from /RAS buffer 110 attains an activated state of a low level. Row address buffer 120 fetches external address signals A0-An as a row address (X address) signal to generate internal row address signals RA0, /RA0-RAn, /RAn. Row decoder 130 decodes internal row address strobe signals RA0, /RA0 to RAn-1, /RAn-1 to set a corresponding word line WL to a selected state in memory cell array 170.

In parallel to the row selecting operation in memory cell array 170, output enable signal /OE attains an activated state of low level at time t2. Because column address strobe signal ext /CAS0 still attains a high level of a deactivated state, output control signal OD generated from output control signal generation circuit 240 maintains a deactivated state of a low level.

When external column address strobe signal ext /CAS0 attains an activated state of a low level at time t3, address signals A0-An is fetched and latched by column address buffer 150 to generate internal column address signals CA0, /CA0 to CAn, /CAn. Column decoder 160 decodes column address signals CA2, /CA2 to CAn-1, /CAn-1 to select 16 pairs of bit lines. Here, the data of memory cells connected to the selected line in memory cell array 170 are detected and amplified by a sense amplifier in sense amplifier group 180 to be set to a latched state. Data on the selected 16 pairs of bit lines are transmitted to I/O control circuit 190.

Since the second switching signal $\Psi2$ attains an activated state of a high level, data IO pin selecting signals AD0-AD3 from switching circuit 220 all attain a high level of an activated state. I/O control circuit 190 decodes column address signals CA0, /CA0, CA1, and /CA1 to select 4 pairs of bit lines from the 16 pairs of bit lines to provide data DO0-DO3.

Since first and second switching signals $\Psi1$ and $\Psi2$ attain a low level and a high level, respectively, block selecting decoder 211 decodes internal address signals RAn, /RAn, CAn, and /CAn to set one of decode signals /$\phi$0-/$\phi$3 to an activated state according to the decoded result. Block selecting signal generation circuit 212 sets a block selecting signal to an activated state corresponding to an activated decode signal of decode signals /$\phi$0-/$\phi$3. Data DO corresponding to this activated block selecting signal is applied to output control circuit 230 via I/O control circuit 190. Output control circuit 230 transmits the data of 1 bit from I/O control circuit 190 to output node 231a according to first switching signal $\Psi1$.

At time t3, output control signal generation circuit 240 pulls output control signal OD to an activated state of a high level. Output buffer 251a is enabled, whereby the data applied to node 231a thereof is provided to data output pin 255a. Although output buffers 251b-251d are also enabled, data will not be output to corresponding IO pins since data IO node 255b-255d are disconnected from the IO pins.

When external column address strobe signal ext /CAS0 attains a deactivated state of a high level at time t4, output control signal OD attains an deactivated state of a low level, and output buffer 251a attains a disabled state, resulting in an output high impedance state. Here, output enable signal /OE also changes to a high level of a deactivated state.

Figure 16:
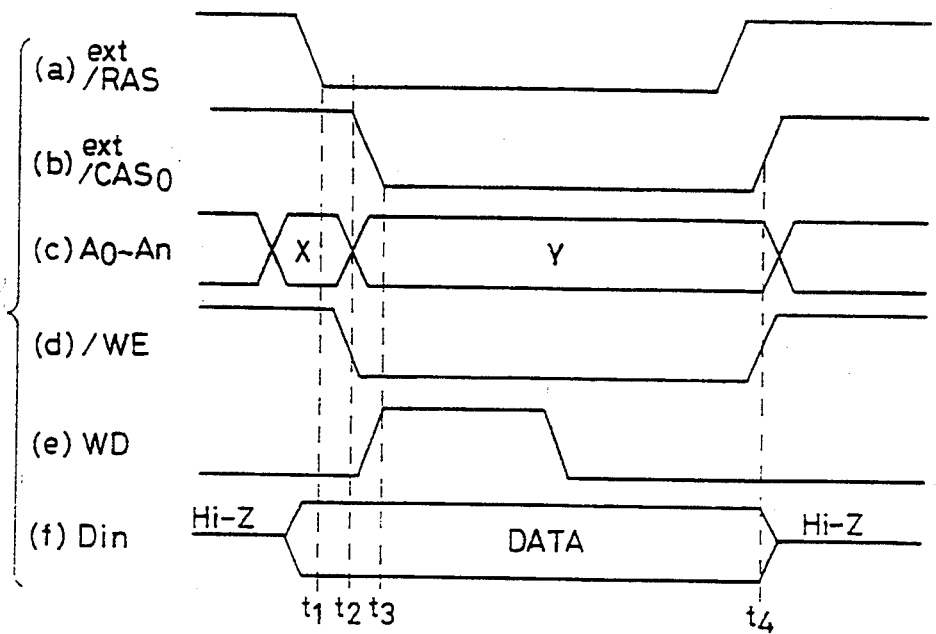

A data writing operation will be described hereinafter with reference to an operation waveform diagram of FIG. 16.

At time t1 when external row address strobe signal ext /RAS attains a low level of an activated state, the applied address signals A0-An are fetched by row address buffer 120 to generate internal row address signals RA0, /RA0 to RAn, /RAn. Here, data Din is applied to input node 271a, and input buffer 270e generates an internal write data DIn which is provided to I/O control circuit 190.

At time t2, write enable signal /WE applied to write control signal generation circuit 260 attains an activated state of a low level. Here, external column address strobe signal ext /CAS0 attains a deactivated state, and internal column address strobe signal /CAS0 also attains a high level of a deactivated state. Write control signal /WD provided from write control signal generation circuit 260 attains a deactivated state of a low level.

At time t1 and et seq., a word line selecting operation in memory cell array 170 is carried out by row decoder 130, and sensing operation by sense amplifier group 180 is carried out, similar to the operation at the time of data read out.

Externally applied address signals A0-An corresponding to a column address (Y address) are provided, and external column address strobe signal ext /CAS0 attains an activated state of a low level. Then, 16 columns, i.e. memory cells of 16 bits are selected by column decoder 160, similar to the operation at the time of reading.

I/O control circuit 190 decodes column address signals CA0, /CA0, CA1, and /CA1 to select memory cells of 4 bits out of the memory cells of 16 bits, similar to the operation of data reading. A memory cell of 1 bit is selected from the memory cells of 4 bits according to block selecting signals BS0-BS3 from block selecting signal generation circuit 212. In response to activation of column address strobe signal /CAS0 at time t3, a write control signal WD is generated from write control signal generation circuit 260 attaining a high level of an activated state for a predetermined time period. According to this activated write control signal WD, I/O control circuit 190 writes data DIn transmitted from input buffer 270e for the selected 1 bit of memory cell.

(B) Mode B: one column address strobe signal and four IO pins are used.

In the operation of mode B, first and second switching signals $\Psi1$ and $\Psi2$ are set to a high level. Block selecting decoder 211 responds to a first switching signal $\Psi1$ of a high level to set all decode signals /$\phi$0-/$\phi$3 to a high impedance state. In other words, block selecting decoder 211 is inhibited of a decoding operation. Block selecting signal generation circuit 212 sets all block selecting signals BS0-BS3 to a high level of an activated state since first and second selecting signals $\Psi1$ and $\Psi2$ are both high. As a result, memory cells of 4 bits are selected in I/O control circuit 190.

Because the second switching signal $\Psi2$ attains a high level, IO pin selecting signals AD0-AD3 from switching circuit 220 are set to a high level of an activated state.

In output circuit 250, output buffers 251a–251d are connected to IO pins via IO nodes 255a–255d. In input circuit 270, input buffers 270a–270d are connected to IO pins via IO nodes 255a–255d. Data input node 271a of input buffer 270e is disconnected from the input pin.

In /CAS buffer circuit 140, an external column address strobe signal ext /CAS0 is applied to /CAS buffer 141. /CAS buffer 142–144 are disconnected from external pin terminals, and internal column address strobe signals /CAS1–/CAS3 are fixed to an deactivated state of a high level. Because input/output of data of 4 bits is to be carried out, an address signal An of 1 bit is set to a high impedance state. The operation thereof will be described hereinafter.

(i) Data Reading Operation

Figure 17:
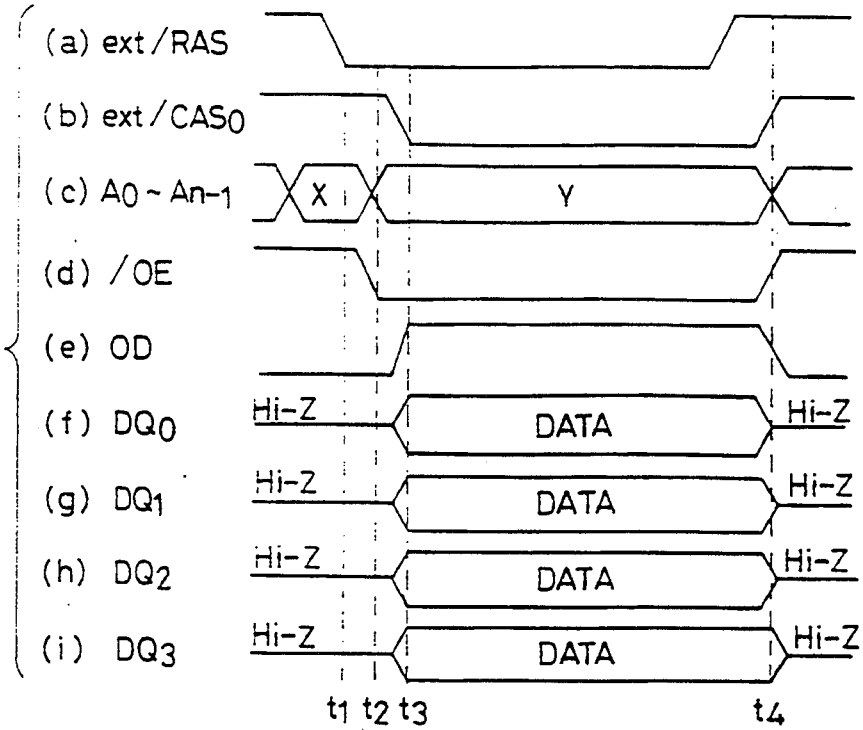

A data reading operation will be described with reference to the operation waveform diagram of FIG. 17.

When external row address strobe signal ext /RAS attains an activated state of a low level at time t1, row address buffer 120 fetches address signals A0–An-1 to generate internal row address signals RA0, /RA0 to RAn-1, /RAn-1. Row decoder 130 decodes internal row address signals RA0, /RA0 to RAn-1, /RAn-1 to select a corresponding word line in memory cell array 170. Then, data of the memory cells connected to the selected word line are read out on bit line pairs, whereby the data of the memory cells are detected and amplified by sense amplifier group 180 to be latched.

At time t2, output enable signal /OE applied to output control signal generation circuit 240 attains an activated state of a low level. Because external column address strobe signal ext /CAS0 attains a deactivated state of a high level under this state, output control signal OD maintains the deactivated state of a low level.

When external column address strobe signal ext /CAS0 falls to a low level at time t3, column address buffer 150 fetches (latches) address signal A0–An-1, and column address signals CA0, /CA0 to /CAn-1, /CAn-1 are provided.

In column decoder 160, column address signals CA2, /CA2 to CAn-1, /CAn-1 from column address buffer 150 are decoded to select 16 pairs of bit lines in memory cell array 170. Data on the 16 bit lines are transmitted to I/O control circuit 190. Here, block selecting signals BS0–BS3 all attain an activated state, and IO pin selecting signals AD0–AD3 also attain an activated state. Under such a state, I/O control circuit 190 selects memory cells of 4 bits out of the selected 16 bits of memory cells according to column address signals CA0, /CA0, CA1, and /CA1 from column address buffer 150 to provide data of the selected 4 bits of memory cells to output control circuit 230.

Because block selecting signals BS0–BS3 all attain an activated state and the first switching signal Ψ1 attains a high level, output control circuit 230 provides data of 4 bits from I/O control circuit 190 to output nodes 231a–231d, and then to output buffers 251a–251d.

When column address strobe signal ext /CAS0 is activated to attain a low level at time t3, output control signal OD from output control signal generation circuit 240 is activated to attain a high level. In response, output buffers 251a–251d are enabled, whereby data of 4 bits from output control circuit 230 are provided to IO pins via IO nodes 255a–255d.

When column address strobe signal ext /CAS0 attains a high level of a deactivated state at time t4, output control signal OD attains a deactivated state of a low level, and output enable signal /OE also attains a high level of a deactivated state. Thus, a memory reading operation is completed.

(ii) Data Writing Operation

Figure 18:
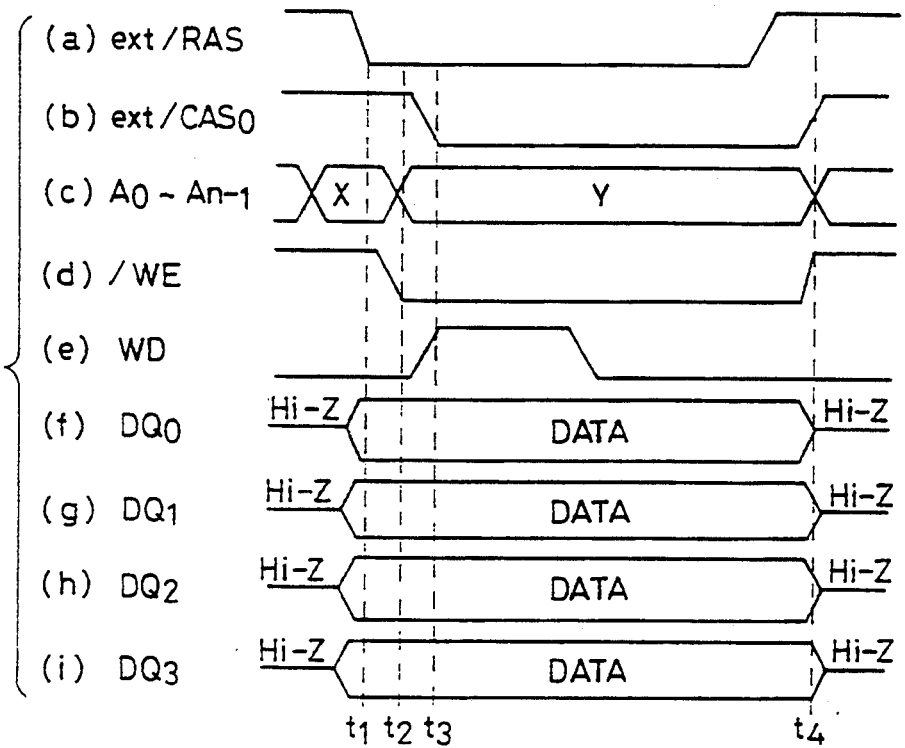

A data writing operation will be described with reference to FIG. 18. Similar to data reading, when external row address strobe signal ext /RAS is activated to attain a low level at time t1, internal row address signals RA0, /RA0 to RAn-i, /RAn-1 from row address buffer 120 are generated to select a word line in memory cell array 170 as a result of row decoder 130 carrying out a decoding operation. Then, data detection and amplification of the selected one row of memory cells are carried out by sense amplifier group 180 to be latched.

At time t2, write enable signal /WE is activated to fall to a low level. Under this state, external column address strobe signal ext /CAS0 attains a deactivated state of a high level, and write control signal WD maintains a deactivated state of a low level.

When external column address strobe signal ext /CAS0 is activated to attain a low level at time t3, write control signal WD from write control signal generation circuit 260 is activated to attain a high level.

Column address buffer 165 generates internal column address signals CA0–CAn-1 and /CA0–/CAn-1 from external address signals A0–An-1. Column decoder 160 decodes column address signals CA2, /CA2 to CAn-1, /CAn-1 to select 16 bits of memory cells.

I/O control circuit 190 decodes column address signals CA0, /CA0, CA1, and /CA1 from column address buffer 150 to select memory cells of 4 bits from the 16 bits of memory cells. 4 bits of write data DI0–DI3 from input buffers 270a–270d are already transmitted to I/O control circuit 190. In response to activation of write control signal WD, I/O control circuit 190 writes these 4 bits of write data DI0–DI3 into the already selected 4 bits of memory cell.

When external column address strobe signal ext /CAS0 attains a high level at time t4, a data writing operation is completed.

(C) Mode C: four column address strobe signals and four IO pins are used.

In mode C, /CA buffers 141–144 receive external column address strobe signals ext /CAS0–ext /CAS3, respectively. Input buffers 270a–270d and output buffers 251a–251d are connected to IO nodes 255a–255d. Input buffer 270e is disconnected from data input pin 271a.

In switching signal generation circuit 200, the first and second switching signals Ψ1 and Ψ2 are set to a high level and a low level, respectively. Under this state, block selecting decoder 211 attains an output high impedance state according to a first switching signal Ψ1 of a high level. That is to say, decode signals /φ0–/φ3 are set to a high impedance state.

Because data input/output is carried out individually for IO nodes 255a–255d in mode C, block selecting signal generation circuit 212 sets block selecting signals BS0–BS3 to an activated state according to column address strobe signals /CAS0–/CAS3. Switching circuit 220 responds to a second switching signal Ψ2 of a low level to set IO pin selecting signals AD0–AD3 to an activated state according to block selecting signals BS0–BS3. The operation will be described hereinafter.

(i) Data Reading Operation

A data reading operation will be described hereinafter with reference to the operation waveform diagram of FIG. 19. An operation where external column address strobe signals ext /CAS0 and ext /CAS1 are activated will be described.

When external row address strobe signal ext /RAS is activated to be pulled down to a low level at time t1, row address strobe signal /RAS from /RAS buffer 110 also falls to a low level. Row address buffer 120 receives external address signals A0 to An-1 (signal An is set to a high impedance state) to generate row address signals RA0, /RA0, RAn-1, /RAn-1. Row decoder 130 decodes the applied row address signals RA0, /RA0 to RAn-1, /RAn-1 to select a corresponding word line in memory cell array 170. When data of the memory cells connected to the selected word line are read out to corresponding bit lines, sense amplifier group 180 is activated to detect and amplify the data of a memory cell connected to the selected word line to be latched.

At time t2, output enable signal /OE is activated to a low level. Here, all external column address strobe signals ext /CAS0-ext /CAS3 are still deactivated state at a high level. Output control signal OD attains a deactivated state of a low level, and output buffers 251a-251d all attain an output high impedance state. External address signals A0-An-1 corresponding to a Y address (column address) are applied, and external address signal An is set to a high impedance state.

Figure 19:
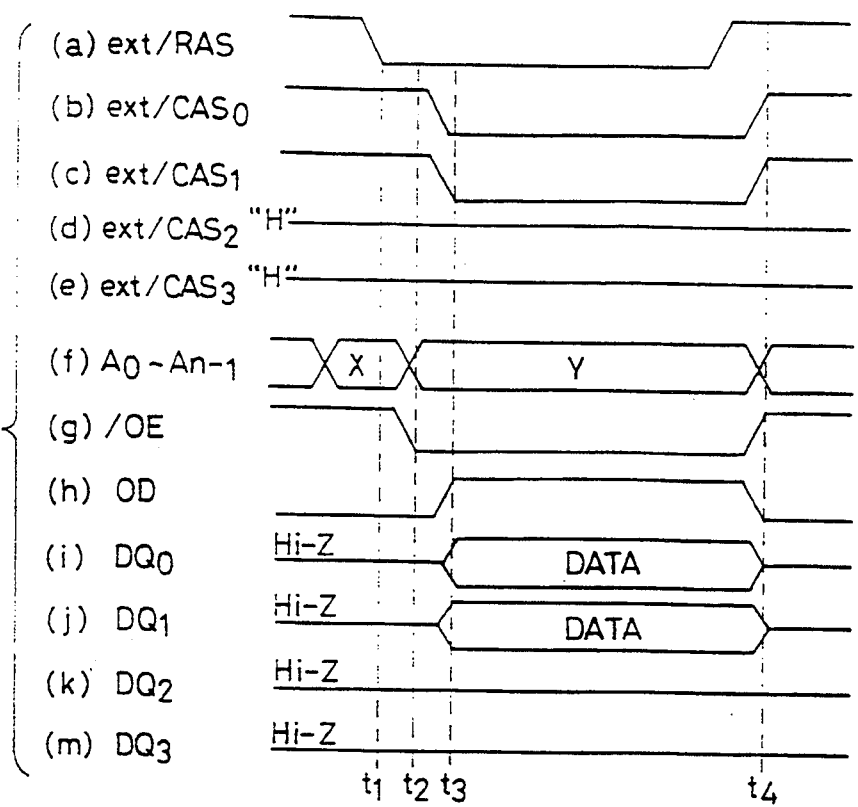

When at least one of external column address strobe signals ext /CAS0-ext /CAS3, i.e. external column address strobe signals ext /CAS0 and ext /CAS1 are activated to a low level as shown in FIG. 19 at time t3, internal column address strobe signals /CAS0 and /CAS1 generated from /CAS buffers 141 and 142 receiving external column address strobe signals ext /CAS0 and ext /CAS1 are activated to a low level.

In response to activation of internal column address strobe signals /CAS0 and /CAS1, column address buffer 150 latches address signals A0 to An-1 to provide column address signals CA0, /CA0 to CAn-1, /CAn-1. Column decoder 160 decodes these column address signals CA2, /CA2 to CAn-1, /CAn-1 to select memory cells of 16 bits out of memory cells connected to the selected word line in memory cell array 170 according to the decoded result. The data of the selected 16 bits of memory cells are transmitted to I/O control circuit 190.

In I/O control circuit 190, column address signals CA0, /CA0, CA1, and /CA1 are decoded to select memory cells of 4 bits out of the 16 bits of memory cells according to the decoded result. Block selecting signals BS0-BS3 generated from block selecting signal generation circuit 212 are activated according to internal column address strobe signals /CAS0-/CAS3. Therefore, block selecting signals BS0 and BS1 are activated, and block selecting signals BS2 and BS3 are deactivated. I/O control circuit 190 transmits the data of the selected 4 bits of memory cells to output control circuit 230.

Output control circuit 230 transmits data of 2 bits from I/O control circuit 190 to output nodes 231a and 231b according to block selecting signals BS0-BS3. Output nodes 231c and 231d attain a high impedance state.

According to the activation of column address strobe signals /CAS0 and /CAS1 at time t3, output control signal OD from output control signal generation circuit 240 is activated to a high level. As a result, output buffers 251a-251d attain an output enable state. Here, IO pin selecting signals AD0-AD3 are activated according to block selecting signals BS0-BS3. Therefore, only output buffers 251a and 251b transmit simultaneously the data from output control circuit 230 to IO nodes 255a and 255b, whereby output buffers 251c and 251d maintain an output high impedance state.

(ii) Data Writing Operation

In writing data, first write data DQ0 and DQ1 are applied to IO nodes 255a and 255b. The data DQ2 and DQ3 applied to IO nodes 255c and 255d attain a high impedance state. Also, address signals A0 to An-1 corresponding to an X address are applied, and address signal An is set to a high impedance state.

Figure 20:
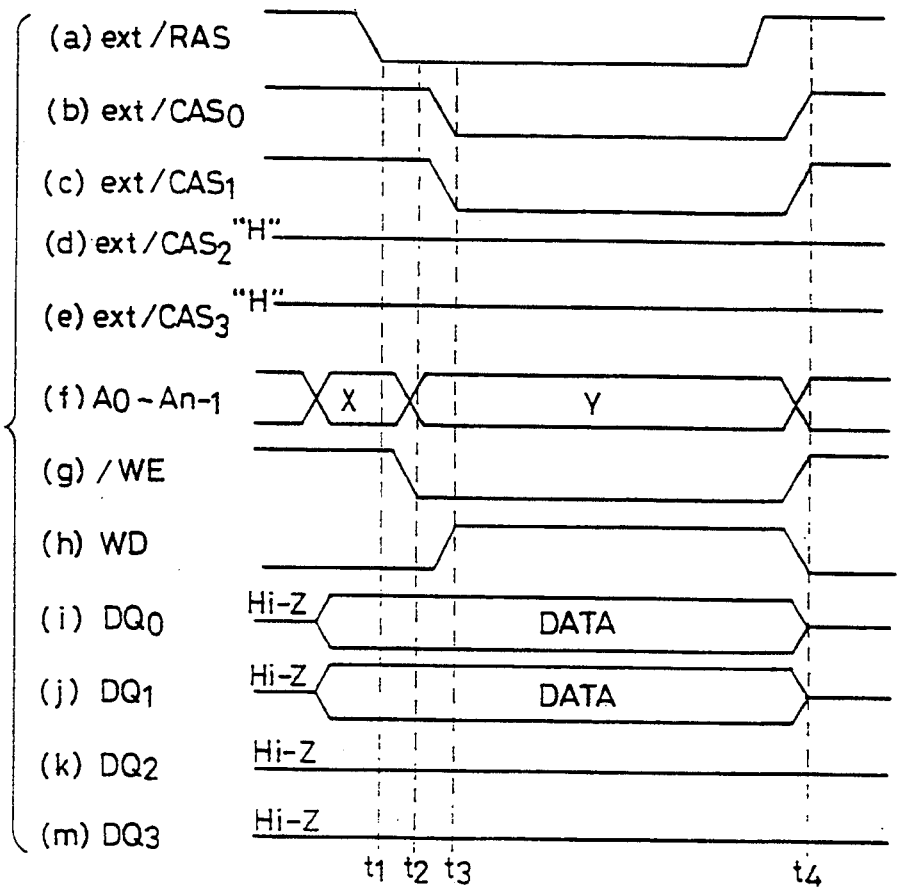

Referring to FIG. 20, when external row address strobe signal ext /RAS is pulled down to a low level at time t1, row address strobe signal /RAS from /RAS buffer 110 is pulled down to a low level, and row address buffer 120 is activated. Row address buffer 120 latches address signals A0-An-1 to generate row address signals RA0, RA0 to RAn-1, /RAn-1. Row decoder 130 selects one row of memory cells in memory cell array 170, whereby sense amplifier group 180 detects, amplifies, and latches the data of the selected one row of memory cells.

At time t2, write enable signal /WE is activated to attain a low level. Input buffer 270a-270d provides to I/O control circuit 190 internal write data DI0-DI3 corresponding to data applied to IO nodes 255a-255d. However, all external column address strobe signals ext /CAS0-ext /CAS3 attain a high level of the deactivated state, and write control signal WD from write control signal generation circuit 260 maintains the deactivated state of a low level. Therefore, I/O control circuit 190 does not yet execute data writing.

When external column address strobe signal ext /CAS0 and ext /CAS1 are activated to a low level at time t3, column address strobe signals /CAS0 and /CAS1 from /CAS buffers 141 and 142 are activated to a low level. External column address strobe signals ext /CAS2 and ext /CAS3 maintain a high level of a deactivated state, and column address strobe signals /CAS2 and /CAS3 attain a high level of a deactivated state.

In response to activation of external column address strobe signals ext /CAS30 and ext /CAS1 at time t3, column address buffer 150 latches the already applied address signals A0 to An-1 (signal An at a high impedance state) to generate column address signals CA0, /CA0 to CAn-1, CAn-1. Column decoder 160 decodes column address signals /CA2, /CA2 to CAn-1, /CAn-1 to select memory cells of 16 bits.

Because the first switching signal Ψ1 attains a high level, I/O control circuit 190 writes write data DI0--DI3 provided from input buffers 270a-270d into the memory cells of 4 bits out of the selected memory cells of 16 bits according to IO pin selecting signals AD0-AD3 from switching circuit 220. Because column address strobe signals /CAS0 and /CAS1 are activated, and block selecting signals BS0 and BS1 are activated, IO pin selecting signals AD0 and AD1 from switching circuit 220 are activated, and IO pin selecting signals AD2 and AD3 attain a deactivated state of a low level. Therefore, I/O control circuit 190 writes into corresponding two bits of memory cells out of 4 bits the write data DI0 and DI1 provided from input buffers 270a and 270b.

I/O control circuit 190 attains an output high impedance state for the remaining two bits of memory cells, so that data writing is not carried out.

Because a plurality of external column address strobe signals ext /CAS0-ext /CAS3 are used in mode C, write control signal WD generated from write control signal generation circuit 260 has an activation time period similar to that of column address strobe signals /CAS0 and /CAS1. This is to ensure execution of data writing.

When column address strobe signals ext /CAS0 and ext /CAS1 attain a high level at time t4, the data writing operation is completed. Write control signal WD attains a deactivated state of a low level, and write data DQ0 and DQ1 applied to IO nodes 255a and 255b attain a high impedance state.

By determining an operation mode by a switching signal generation circuit 200 as described above, data input/output can be carried out for each IO pin by using 4 external column address strobe signals ext /CAS0-ext /CA3. Since IO pins not requiring data output can be set to a high impedance state during data reading, the consumed current in an output buffer can be reduced. Furthermore, data of IO pins not requiring data writing and attaining a high impedance state will not be written into memory cells at the time of data writing, so that writing of erroneous parity bit can be prevented.

Only one external column address strobe signal ext /CAS0 is used by determination of an operation mode with switching signal generation circuit 200, and a device that carries out data input/output of 1 bit and 4 bits can be manufactured with the same mask. Therefore, a semiconductor memory device that can carry out three types of different input/output control is easily realized. The specific structure of each component will be described hereinafter.

Switching Signal Generation Circuit

Figure 21A:
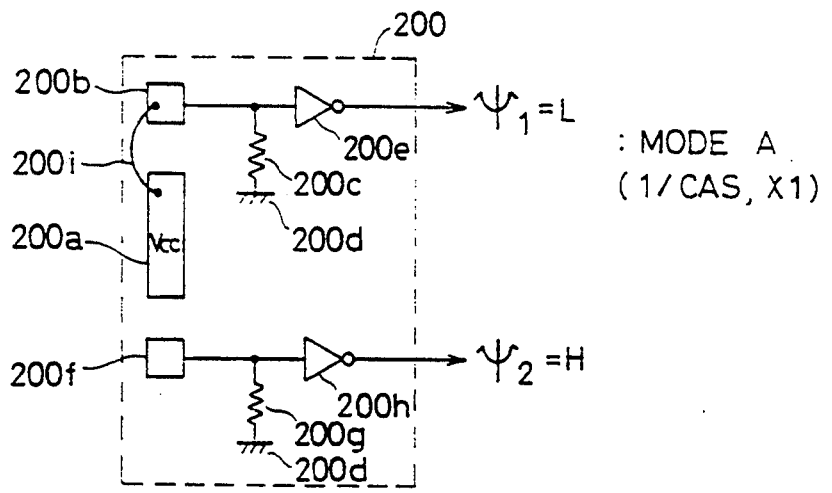
FIGS. 21A-21C are diagrams showing the structure of the switching signal generation circuit of FIG. 14.
Figure 21B:
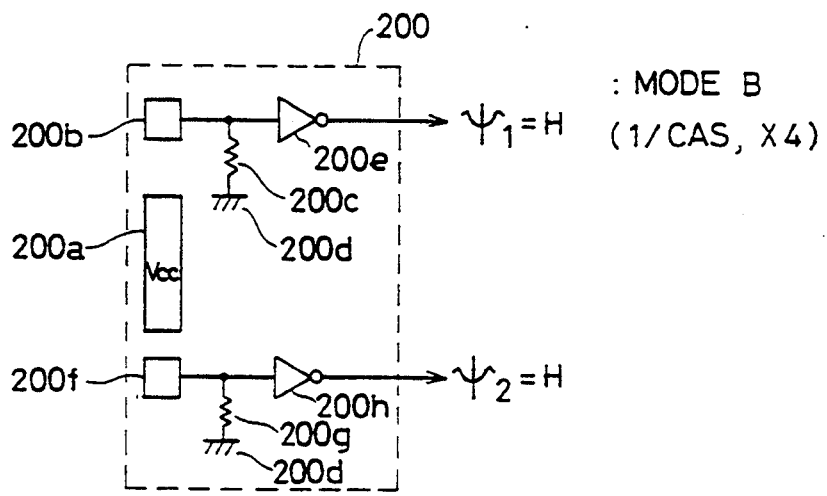
Figure 21C:
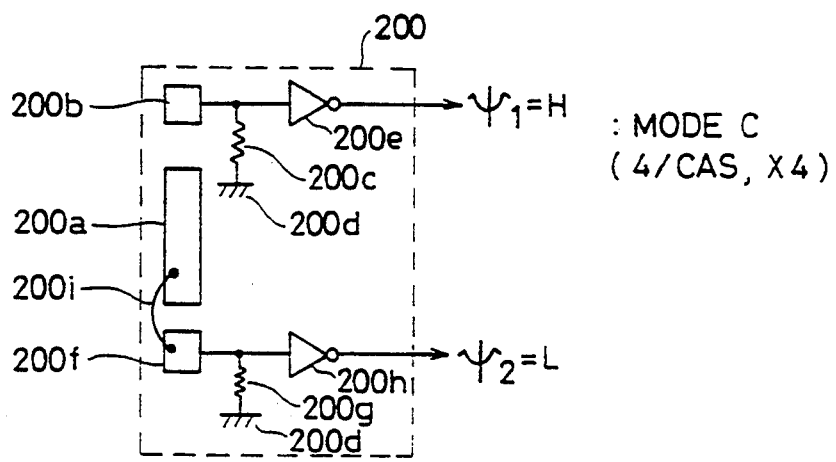

FIGS. 21A-21C show the structure and signal generation manner of the switching signal generation circuit of FIG. 14. Referring to FIGS. 21A-21C, a switching signal generation circuit 200 includes a power supply pad 200a to which an external power supply potential is applied, pads 200b and 200f provided adjacent to power supply pad 200a, inverter circuits 200e and 200h provided corresponding to pads 200b and 200f, and resistor elements 200c and 200g of high resistance connected between pads 200b and 200f and ground potential node 200d.

The inputs of inverter circuits 200e and 200h are connected to corresponding pads 200b and 200f. Resistor element 200c and 200g are realized by, for example, the channel resistance of a MOS transistor, and has a high resistance greater than 1M$\tilde{o}$. They function to pull down the input nodes of inverter circuits 200e and 200h to the level of ground potential. First and second switching signals Ψ1 and Ψ2 are generated from inverter circuits 200e and 200h, respectively.

Switching signals Ψ1 and Ψ2 of a desired level are generated by selectively wiring power supply pad 200a with pads 200b and 200f by a metal thin wire.

Upon specifying mode A, pad 200b is connected to power supply pad 200a by a metal thin wire 200i as shown in FIG. 21A. Pad 200f attains a floating state. Because a signal of a high level is applied to inverter circuit 200e under such a state, the first switching signal Ψ1 generates from inverter circuit 200e attains a low level. The potential of pad 200f attains the level of ground potential by resistor element 200g, so that the second switching signal Ψ2 generated from inverter circuit 200h attains a high level.

Upon specifying mode B, pads 200b and 200f both attain a floating state as shown in FIG. 21B. Under this state, switching signals Ψ1 and Ψ2 from inverter circuits 200e and 200h are both set to a high level.

Upon specifying mode C, pad 200f is connected to power supply pad 200a by a thin wire 200i as shown in FIG. 21C. Pad 200b attains a floating state. In this state, the first switching signal Ψ1 generated from inverter circuit 200e attains a high level, and the second switching signal Ψ2 generated from inverter circuit 200h is set to a low level.

By setting the potential levels of switching signals Ψ1 and Ψ2 by wiring with a metal thin wire 200i as described above, the operation mode of this semiconductor memory device can easily be specified.

(i) Modification 1

Figure 22:
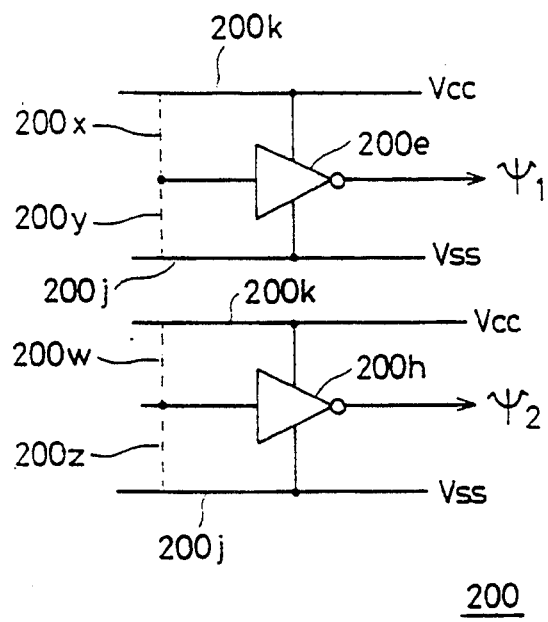
FIG. 22 shows a modification of the switching signal generation circuit of FIG. 14.

FIG. 22 shows a modification of the switching signal generation circuit. Referring to FIG. 22, a switching signal generation circuit 200 includes inverter circuits 200e and 200h generating first and second switching signals Ψ1a and Ψ2, respectively. In order to apply power supply potential Vcc and ground potential Vss to inverter circuits 200e and 200h, a power supply line 200k and a ground line 200j are disposed. In the structure of the switching signal generation circuit of FIG. 22, the input nodes of inverter circuits 200e and 200h are connected to power supply line 200k or ground line 200j by a metal interconnection such as aluminum. In FIG. 22, metal interconnections selectively formed by a mask are indicated by broken lines 200x, 200y, 200w and 200z. According to the structure shown in FIG. 22, a semiconductor memory device can be realized that carries out three types of input/output control using the same mask excluding the interconnection for determining an input signal for inverter circuits 200e and 200h.

(ii) Modification 2

Figure 23:
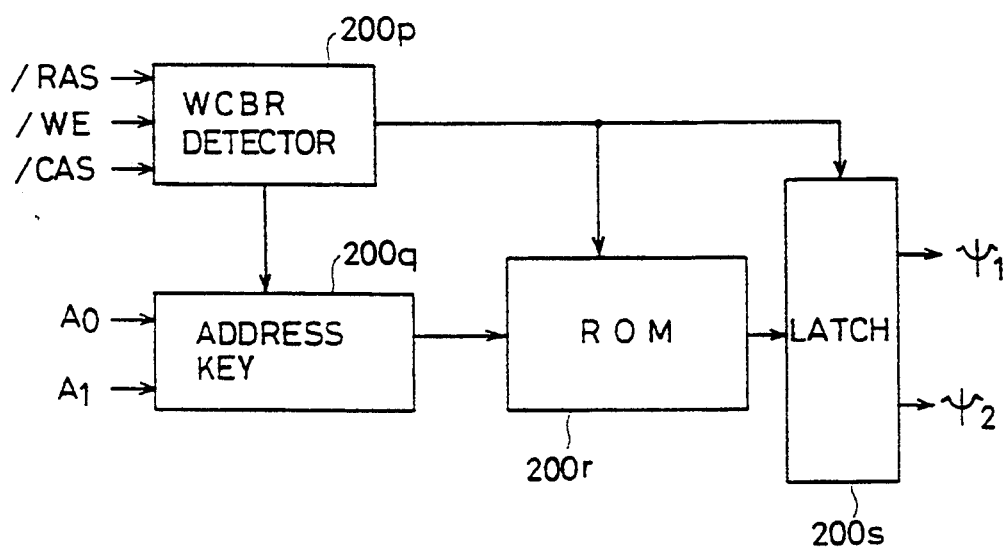
FIG. 23 shows another modification of the switching signal generation circuit of FIG. 14.

FIG. 23 shows a second modification of a switching signal generation circuit 200. Referring to FIG. 23, a switching signal generation circuit 200 includes a WCBR detector 200p for receiving external control signals /RAS, /WE and /CAS, an address key circuit 200a activated in response to a detection signal from WCBR detector 200p for fetching external address signals A0 and A1, a read only memory (ROM) 200r enabled in response to a detection signal from WCBR detector 200p to read out the stored contents with the address signal from address key circuit 200c as an address, and a latch circuit 200s responsive to a detection signal from WCBR detector 200p to latch an output of ROM 200r. First and second switching signals Ψ1 and Ψ2 are provided from latch circuit 200s.

WCBR detector 200p generates a WCBR detecting signal in response to the fall of row address strobe signal /RAS when signals /WE and /CAS both attain a low level. Address key circuit 200q is triggered by this WCBR detecting signal from WCBR detector 200p to latch address signals A0 and A1 applied at that time. ROM 200r stores in advance first and second switching signals Ψ1 and Ψ2. According to an address signal from address key circuit 200q, switching signals Ψ1 and Ψ2 of a predetermined combination of logics are read out from ROM 200r. According to the structure show in FIG. 23, no modification is required in the hardware structure. Switching signals Ψ1 and Ψ2 can be generated with a predetermined combination of logics externally by a software.

Also, a structure may be used in which first and second switching signals Ψ1 and Ψ2 are directly applied from an external source.

Block Selecting Decoder

Figures 24A, 24B:
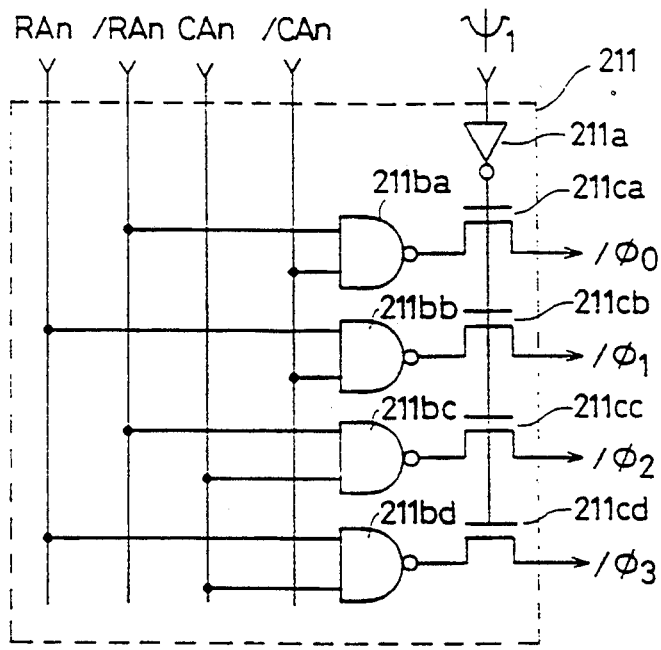
FIG. 24A shows a structure of the block selecting decoder of FIG. 14.
FIG. 24B lists the input/output logics of the block selecting decoder of FIG. 24A.

FIG. 24A shows an example of a structure of the block selecting decoder shown in FIG. 14. FIG. 24B lists the input/output logics of the block selecting decoder of FIG. 24A.

Referring to FIG. 24A, a block selecting decoder 211 includes an inverter circuit 211a for inverting the first switching signal Ψ1, four 2-input NAND circuits 211ba–211bd to which row address strobe signals of different combination are applied, and transfer gates 211ca–211cd provided corresponding to NAND circuits 211ba and 211bd, respectively, for conducting in response to an output of inverter circuit 211a.

NAND circuit 211ba receives address signals /RAn and /CAn. NAND circuit 211bb receives address signals RAn and /CAn. NAND circuit 211bc receives address signals /RAn and CAn. NAND circuit 211bd receives address signals RAn and CAn.

Transfer gates 211ca–211cd are formed of n channel MOS transistors, and conduct when the output of inverter circuit 211a attains a high level. Decode signals /φ0–/φ3 are provided from transfer gates 211ca–211cd. The operation will be described briefly hereinafter.

When the first switching signal Ψ1 attains a high level, mode A is specified, and input/output of 1 bit of data is executed. In this case, the output of inverter circuit 211a attains a low level, whereby transfer gates 211ca–211cd are OFF. Decode signals /φ0–/φ3 attain a high impedance state (Z).

When the switching signal Ψ1 attains a low level, four IO pins are used. In this case, the output of inverter circuit 211a attains high level, and transfer gates 211ca–211cd all attain a conductive state. According to the logics of address signals RAn, /RAn, CAn, and /CAn, one of decode signals /φ0–/φ3 attain an activated state of a low level. For example, when address signals RAn and CAn both attain a high level, the output of NAND circuit 211bd attains a low level, and decode signal /φ3 becomes low. Because the remaining NAND circuits 211ba–211bc receive a signal of a low level at each one input, the outputs are high, and decode signals /φ0–/φ2 attain the deactivated state of a high level.

Block Selecting Signal Generation Circuit

Figure 25:
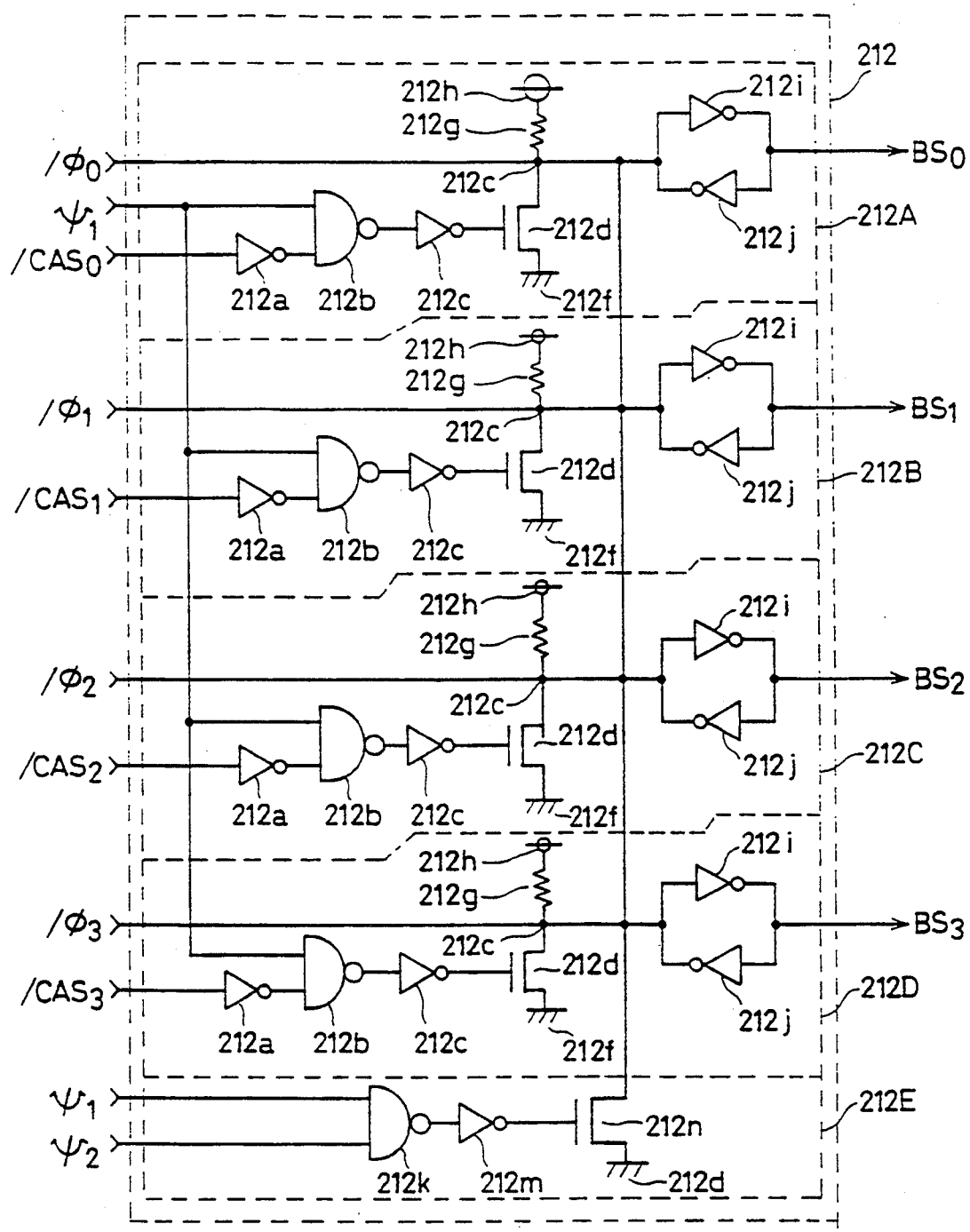
FIG. 25 shows a structure of the block selecting signal generation circuit of FIG. 14.

FIG. 25 shows a specific structure of the block selecting signal generation circuit of FIG. 14. Referring to FIG. 25, a block selecting signal generation circuit 212 includes circuit blocks 212A–212D provided corresponding to decode signals /φ0–/φ3, respectively, and a circuit block 212E for activating simultaneously block selecting signals BS0–BS3 according to switching signals φ1 and φ2.

Each of circuit blocks 212A and 212D has the same circuit structure, and receives different decode signals and column address strobe signals.

Circuit block 212A includes a resistor element 212g of high resistance provided between a node 212c and a power supply potential node 212h, inverter circuits 212i and 212j for forming a latch to invert and latch the potential on node 212c, an inverter circuit 212a for inverting column address strobe signal /CAS0, a 2-input NAND circuit 212b for receiving the output of inverter circuit 212a and first switching signal Ψ1, an inverter circuit 212c for inverting the output of NAND circuit 212b, and an N channel MOS transistor 212d conducting in response to an output of inverter circuit 212 for discharging node 212c to the level of ground potential.

Circuit blocks 212B and 212D differ from circuit block 212A only in that the decode signal and the column address signal applied thereto are different. The components corresponding to those of circuit block 212A have the same reference characters denoted, and their description will not be repeated.

Circuit block 212E includes a 2-input NAND circuit 212k for receiving first and second switching signals Ψ1 and Ψ2, an inverter circuit 212m for inverting the output of NAND circuit 212k, and an n channel MOS transistor 212n conducting in response to an output of inverter circuit 212m for discharging internal node 212c of circuit blocks 212A–212D to the level of ground potential.

Mode A: In mode A, the first switching signal Ψ1 attains a low level, and the second switching signal Ψ2 attains a high level. In this state, the output of each NAND circuit 212b in circuit blocks 212A–212D attains a high level. Transistor 212d receives a signal of a low level at its gate via inverter circuit 212c to be turned off. In circuit block 212E, the output of NAND circuit 212k attains a high level, so that transistor 212n receives a signal of a low level at its gate via inverter circuit 212m to be turned off. In mode A, one of decode signals /φ0–/φ3 from the block selecting decoder of FIG. 24A attains an activated state of a low level, and the remaining three decode signals attain a high level of a deactivated state. For example, when decode signal /φ0 attains a low level, and decode signals /φ1–/φ3 attain a low level, the decode signals are inverted by inverter circuit 212i, whereby block selecting signal BS0 attains a high level, and block selecting signals BS1–BS3 attain a low level of a deactivated state. More specifically, block selecting signals are activated/deactivated according to decode signals /φ0–/φ3 in mode A.

Mode B: In mode B, switching signals Ψ1 and Ψ2 both attain a high level and NAND circuit 212b functions as an inverter. The output of a NAND circuit 212k in circuit block 212E attains a low level, and the output of inverter circuit 212m attains a high level. This causes transistor 212n to conduct, whereby node 212c is discharged to the low level of ground potential (in mode B, all decode signals /φ0–/φ3 attain a high impedance state). Therefore, all block selecting signals BS0–BS3 attain an activated state of a high level independent of the logics of column address strobe signals /CAS0–/CAS3.

Mode C: In mode C, first and second switching signals Ψ1 and Ψ2 attain a high level and a low level, respectively. In this state, NAND circuit 212k in circuit block 212E provides a signal of a high level, and transistor 212n is turned off. In circuit blocks 212A–212D, NAND circuit 212b functions as an inverter to provide a signal of a logic corresponding to an applied column address strobe signal /CASj (j=0–3). Decode signals /φ0–/φ3 attain a high impedance state. Therefore, by inverter 212c and transistor 212d, a signal of a logic opposite to the logic of a corresponding column address strobe signal /CASj appears on node 212c. Because the logic of the signal of node 212c is inverted by inverter circuit 212i, block selecting signals BS0–BS3 are activated/deactivated according to corresponding column address strobe signals /CAS0–/CAS3. For example, when column address strobe signal /CAS0 attains an activated state of a low level, NAND circuit 212b in circuit block 212a provides an output of a low level. The output of inverter circuit 212c attains a high level, transistor 212d is turned on, and node 212c attains a low level of ground potential. In this case, block selecting signal BS0 attains a high level. When column address strobe signal /CAS0 attains a high level, NAND circuit 212b provides an output of high level in circuit block 212A. Inverter circuit 212c provides an output of a low level, and transistor 212d is turned off. In this state, node 212c is charged by resistor element 212g to attain a high level of the power supply potential, and block selecting signal BS0 attains a low level.

Switching Circuit

Figure 26:
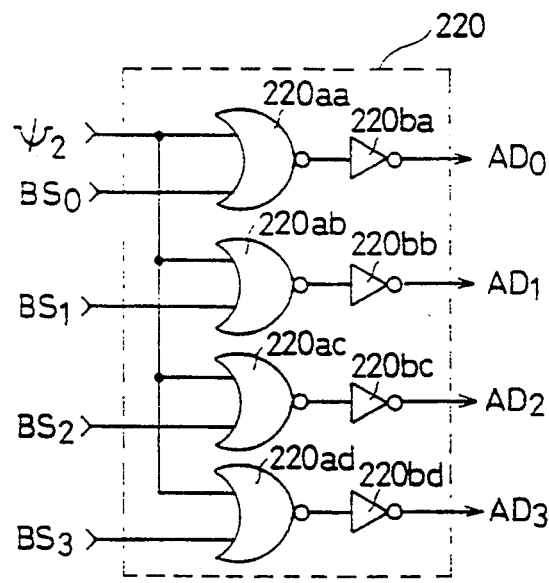
FIG. 26 shows a structure of the switching circuit of FIG. 14.

FIG. 26 specifically shows a structure of a switching circuit of FIG. 14. Referring to FIG. 26, a switching circuit 220 includes 2-input NOR circuits 220aa-220ad provided corresponding to block selecting signals BS0-BS3, respectively, and inverter circuits 220ba-220b d provided corresponding to NOR circuits 220aa-220ad, respectively. Each one input of NOR circuits 220aa-220ad is supplied with a second switching signal $\phi 2$. IO pin selecting signals AD0-AD3 are generated from inverter circuits 220ba-220bd. The operation will be described hereinafter.

Modes A and B: In modes A and b, the second selecting signal $\Psi 2$ is set to a high level. In this case, the outputs of NOR circuits 220aa-220ad attain a low level regardless of the logics of block selecting signals BS0-BS3. Therefore, all IO pin selecting signals AD0-AD3 attain an activated state of a high level.

Mode C: In mode C, the second switching signal $\Psi 2$ is set to a low level. Therefore, NOR circuits 220aa-220ad function as inverters. In this state, IO pin selecting signals AD0-AD3 will have logics opposite to those of block selecting signals BS0-BS3. For example, when block selecting signal BS0 attains an activated state of a high level, the output of NOR circuit 220aa attains a low level, and IO pin selecting signal AD0 provided from inverter circuit 220ba attains a high level. If block selecting signal BS0 attains a low level, the output of NOR circuit 220aa attains a high level, and IO pin selecting signal AD0 provided from inverter circuit 220ba attains a low level.

I/O Control Circuit

Figure 27:
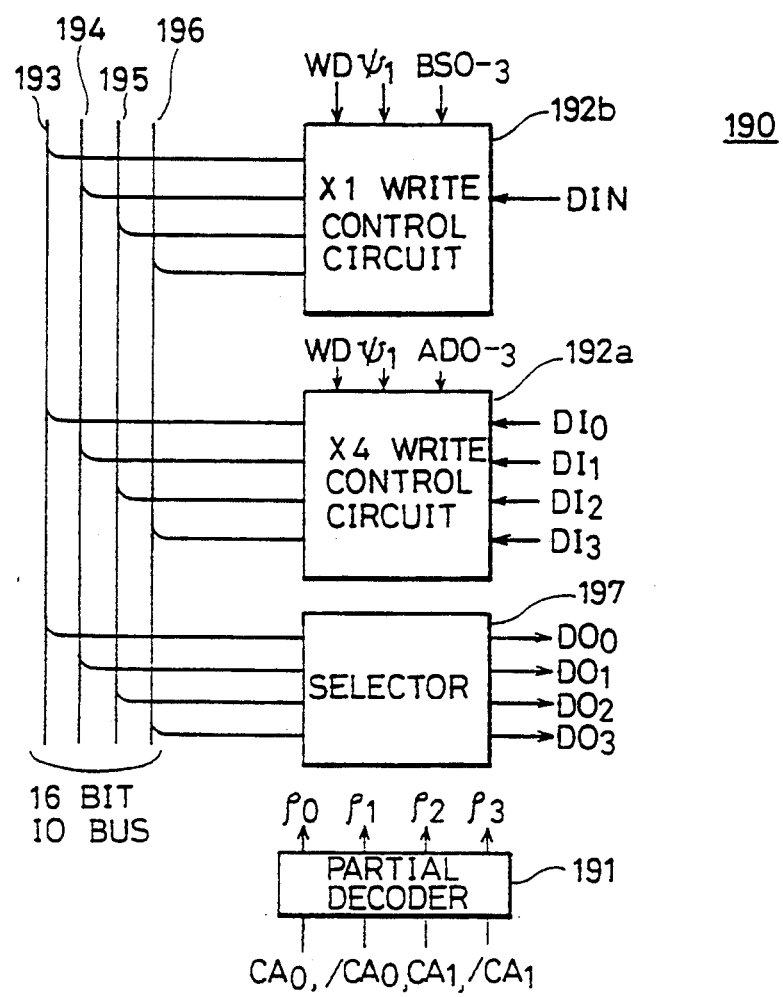
FIG. 27 is a block diagram schematically showing a structure of the I/O control circuit of FIG. 14.

FIG. 27 is a block diagram specifically showing the I/O control circuit 190 shown in FIG. 14. Referring to FIG. 27, an I/O control circuit 190 includes a partial decoder 191 for decoding column address signals CA0, /CA0, CA1, /CA1 to provide decode signals $\rho 1$, $\rho 2$ and $\rho 3$, a x1 write control circuit 192b for receiving a write data DIN of input buffer 270e (refer to FIG. 14) in an x1 bit organization, a x4 write control circuit 192a for receiving 4 bits of data DI0-DI3, and a selector 197 for providing output data DO0-DO3 in data reading.

I/O control circuit 190 includes four IO buses 193, 194, 195 and 196, each including 4 bits of IO lines. Partial decoder 191 has a structure similar to NAND circuits 211ba-211b d shown in FIG. 24A to set one of decode signals $\rho 0$-$\rho 3$ to an activated state according to the logic combination of applied column address signals CA0, /CA0, CA1, and /CA1. Decode signals $\rho 0$-$\rho 3$ specify one bit (one IO line) in each of the 4 bits of IO buses 193-196.

x4 write control circuit 192a is activated when the first switching signal $\Psi 1$ attains a high level of an operation mode (mode B or mode C) using four IO pins. According to write control signal WD, IO pin selecting signals AD0-AD3, and decode signals $\rho 0$-$\rho 3$ from partial decoder 191, x4 write control circuit 192a writes on an IO line specified by decode signals $\rho 0$-$\rho 3$ in an IO bus specified by activated IO pin selecting signals AD0-AD3.

x1 write control circuit 192b is activated when first switching signal $\Psi 1$ attains a low level and an operation mode (mode A) carrying out data input/output of x1 bit is specified. In this case, one block (i.e. one of IO buses 193-196) is selected according to block selecting signals BS0-BS3, whereby write data DIN is transmitted onto one IO line according to decode signals $\rho 0$-$\rho 3$ in the IO bus corresponding to the selected block.

Selector 197 selects one bit of data from four IO buses 193-196 according to decode signals $\rho 0$-$\rho 3$, and generates and transmits to output control circuit 230 internal data DO0-DO3.

Figure 28:
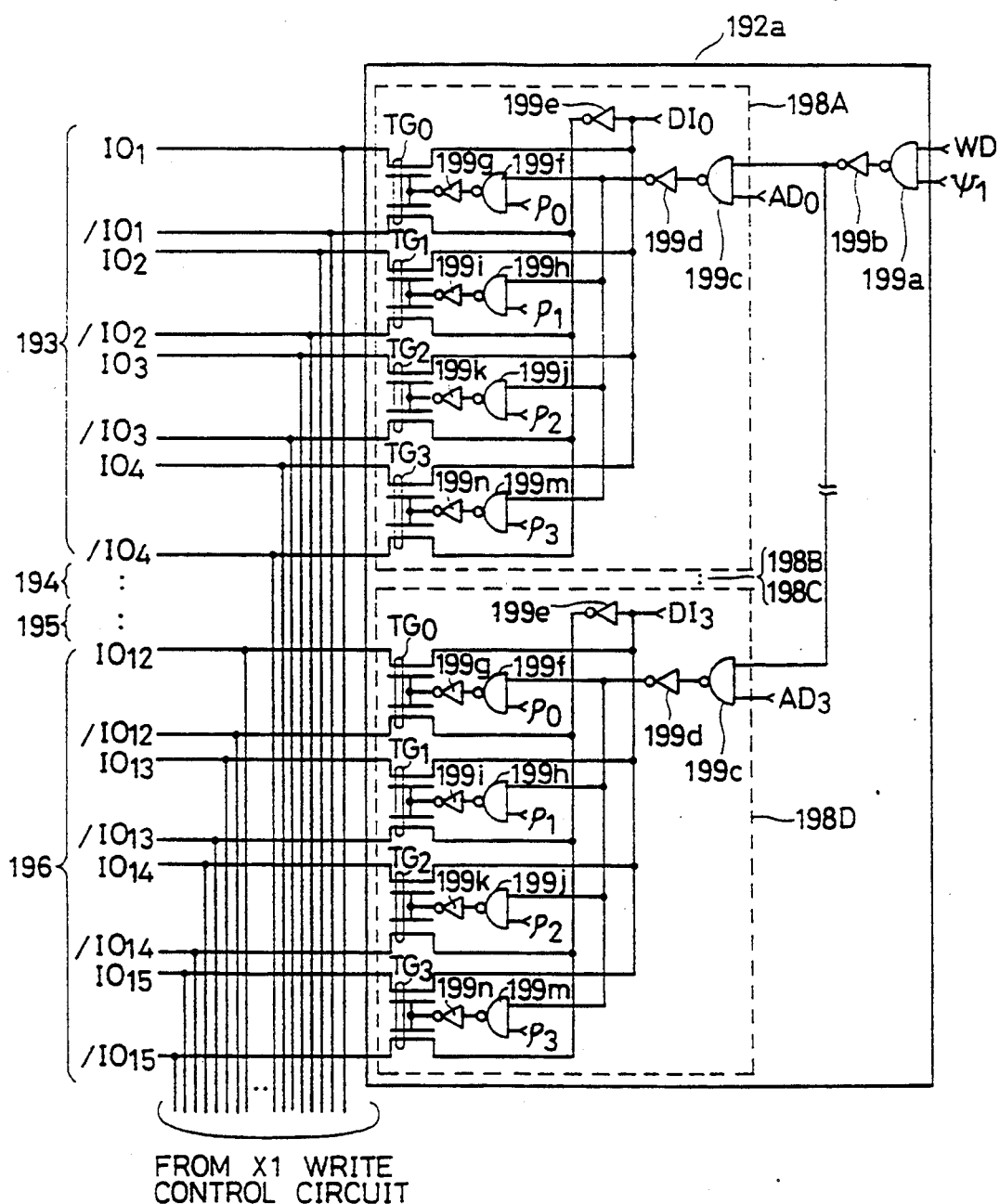
FIG. 28 shows a circuit of a x4 write control circuit of FIG. 27.

FIG. 28 schematically shows a structure of a x4 write control circuit of FIG. 27. Referring to FIG. 28, a x4 write control circuit 192a includes write circuits 198A-98D provided corresponding to the four bits of IO buses 193-196, respectively. In FIG. 28, write circuits 198A and 198C provided corresponding to IO buses 194 and 195 are indicated only by their reference characters, and is not indicated in the block diagram.

Write circuits 198A-198D receive write data DI0-DI3 from input buffers 270a-270d to transmit the write data onto one IO line out of the corresponding IO buses 193-196. These write circuits 198A-198D have the same structure. The activation/deactivation of write circuits 198A-198D are controlled by 2-input NAND circuit 199a receiving write control signal WD and first switching signal $\Psi 1$, and by inverter 199b inverting the output of NAND circuit 199a. When the output of inverter 199b attains a high level, write circuits 198A-198D are activated. When the output of inverter 199b attains a low level, write circuits 198A-198D are disabled, and attains an output high impedance state.

Write circuits 198A-198D each have the same structure, and the same reference characters are denoted for corresponding components. Write circuit 198A includes a 2-input NAND circuit 199c for receiving IO pin selecting signal AD0 and the output of inverter 199b, an inverter 199d for receiving the output of NAND circuit 199c, an inverter 199e for receiving write data DI0, NAND circuits 199f, 199h, 199j and 199m for receiving the output of inverter 199d at one input, and inverters 199g, 199i, 199k and 199n for inverting the outputs of NAND circuits 199f, 199h, 199j and 199m. NAND circuits 199f, 199h, 199j and 199m have the respective other inputs supplied with decode signals $\rho 0$, $\rho 1$, $\rho 2$ and $\rho 3$.

Write circuit 198A further includes transfer gates TG0, TG1, TG2 and TG3 provided corresponding to IO line pairs IO1, /IO1 to IO4, /IO4 for conducting in response to outputs of inverters 199g, 199i, 199k and 199n. Transfer gates TG0-TG3 transmits write data DI0 and the output of inverter 199e on respective IO bus lines IO and /IO when in an conductive state. The operation will be described briefly hereinafter.

Each of IO buses 193-196 include 4 pairs of IO lines. When the first switching signal $\Psi 1$ attains a high level, the output of inverter 199b rises to a high level according to write control signal WD. When the output of inverter circuit 199b attains a low level, the output of NAND circuit 199c attains a high level, and data of inverter 199d attains a low level. Therefore, the outputs of inverters 199g, 199i, 199k and 199n attain a low level, and transfer gates TG0-TG3 are turned off.

In mode A, the first switching signal Ψ1 attains a low level, and this x4 write control circuit attains an output high impedance state.

In mode B, all data IO pin selecting signals AD0-AD3 attain an activated state of a high level. Therefore, NAND circuit 199c functions as an inverter, and the output of inverter 199d in each write circuit 198A-198D rises to a high level according to write control signal WD. In response, any of the outputs of NAND circuits 199f, 199h, 199j and 199m fall to a low level according to decode signals ρ0-ρ3, whereby a corresponding transfer gate (any of TG0-TG3) conducts. As a result, complementary write data from inverter 199e and write data DI0 from an input buffer are transmitted onto the selected IO bus line pair by decode signals ρ0-ρ3. Thus, write data DI0-DI3 are transmitted in parallel on one IO line in each of IO buses 193-196.

In mode C, IO pin selecting signals AD0-AD3 are activated according to block selecting signals BS0-BS3. In this case, block selecting signals BS0-BS3 are activated according to column address strobe signals /CAS0-/CAS3. Therefore, NAND circuit 199c functions as an inverter only in a write circuit to which access is requested. The output of NAND circuit 199c is set to a high level in a write circuit where access is not required. Therefore, transfer gates TG0-TG3 in the write circuits which do not require access are turned off, and data writing is not carried out.

Figure 29:
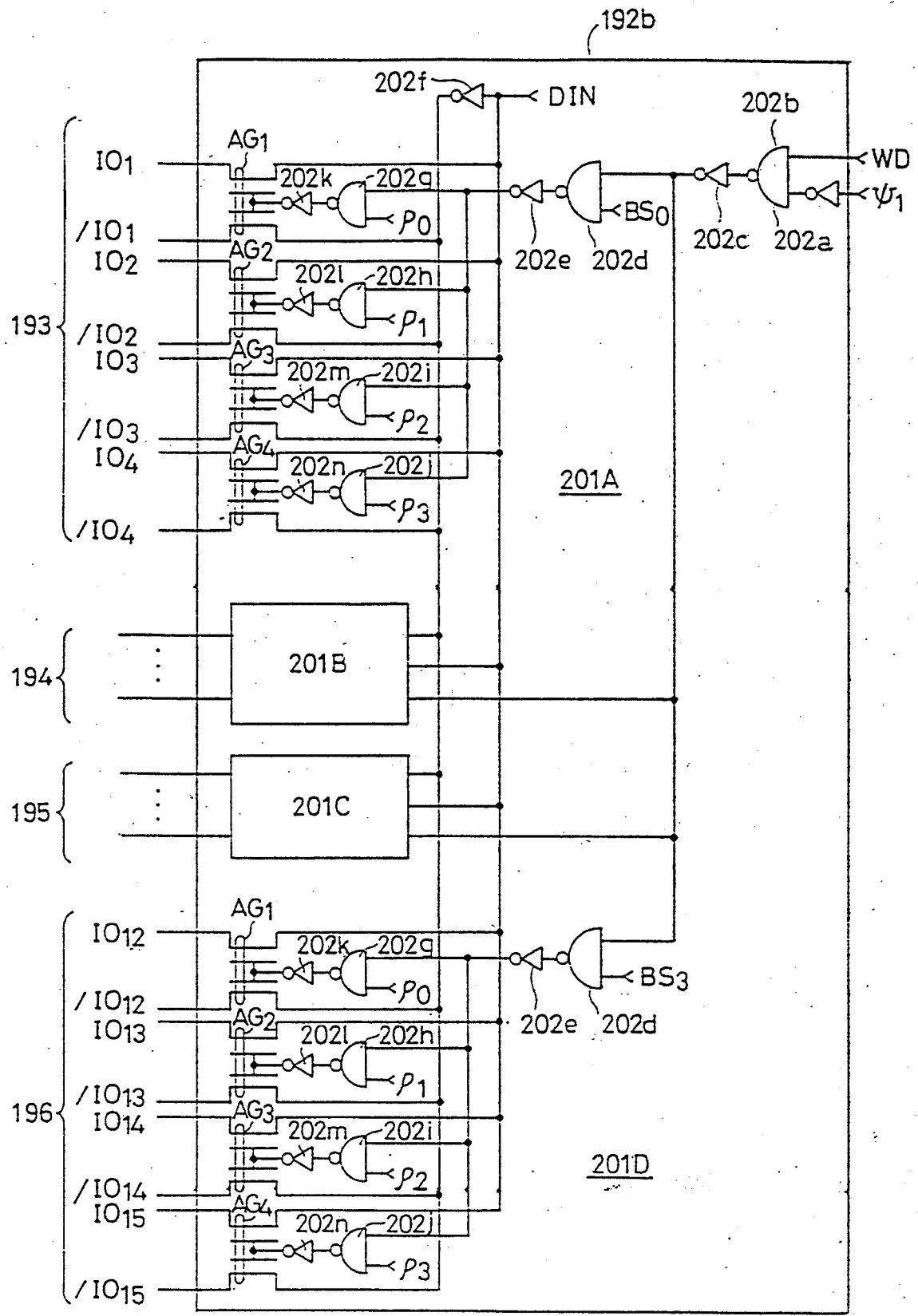
FIG. 29 shows a structure of a x1 write control circuit of FIG. 27.

FIG. 29 specifically shows a structure of a x1 write control circuit of FIG. 27. Referring to FIG. 29, a x1 write control circuit 192b includes write circuits 201A-201D provided corresponding to 4 bits of IO buses 193-196, respectively. Write circuits 201A-201D have the same structure, and are activated according to write control circuit WD when the first switching signal Ψ1 attains a low level (mode A).

Referring to FIG. 29, x1 write control circuit 192b includes an inverter 202a for receiving the first switching signal Ψ1, a 2-input NAND circuit 202b for receiving the output of inverter 202a and write control signal WD, an inverter 202c for receiving the output of NAND circuit 202b, and an inverter 202f for receiving write data DIN from input buffer 270e (refer to FIG. 14). A pair of complementary write data is generated by write data DIN and the output of inverter 202f. The output of inverter 202c attains a high level when the output of NAND circuit 202d attains a low level. The output of NAND circuit 202b attains a low level when write control signal WD attains a high level and the first switching signal Ψ1 attains a low level.

Each of write circuits 201A-201D include a 2-input NAND circuit 202d for receiving a block selecting signal BSk (k=0-3) and the output of inverter 202c, an inverter 202e for receiving the output of NAND circuit 202d, 2-input NAND circuits 202g-202j for receiving the output of inverter 202e and a decode signal ρi, inverters 202k-202n for inverting the outputs of NAND circuits 202g-202j, and transfer gates AG1-AG4 provided corresponding to respective IO line pairs for conducting when the outputs of inverters 202k-202n attain a high level. The operation thereof will be described briefly hereinafter.

In mode A, the switching signal Ψ1 is set to a low level, and the output of inverter 202a is fixed to a high level. In this state, NAND circuit 202b functions as an inverter, and a signal of a logic identical to that of write control signal WD is provided from inverter 202c.

When write control signal WD attains a low level, the output of NAND circuit 202d attains a high level, and the output of inverter 202e attains a low level. Therefore, transfer gates AG1-AG4 are all turned off by NAND circuits 202g-202j and inverters 202k-202n.

When write control signal WD rises to a high level, the output of inverter 202c rises to a high level, and NAND circuit 202d functions as an inverter. In mode A, one of block selecting signals BS0-BS3 is activated according to decode signals /φ0-/φ3 from block selecting decoder 211 (refer to FIG. 14). It is assumed that block selecting signal BS0 attains a high level now. In this state, the output of inverter 202a rises to a high level in write circuit 201A, so that NAND circuits 202g-202j in write circuit 201A function as inverters. One of decode signals ρ0-ρ3 from partial decoder 191 (refer to FIG. 27) attains a high level of an activated, state. Therefore, the transfer gate corresponding to the activated decode signal conducts, and write data DIN and an inverted signal thereof is transmitted onto a corresponding IO line pair. If decode signal ρ0 attains a high level, for example, the output of NAND circuit 202g attains a low level and the output of inverter 202k attains a high level. As a result, transfer gate AG1 conducts, and write data are transmitted on an IO line pair IO1 and /IO1. Because decode signals ρ1-ρ3 attain a low level, the outputs of inverters 202l-202n attain a low level, and transfer gates AG2-AG4 are turned off. Therefore, block selecting signals BS0-BS3 select one of the four bits of IO buses. According to decode signals ρ0-ρ3, an IO line pair of 1 bit out of the selected 4-bit IO buses is selected according to decode signals ρ0-ρ3, whereby 1 bit of data is written.

Because the first switching signal Ψ1 attains a high level in modes B and C, the output of inverter 202c attains a low level, and the output of inverter 202e attains a low level. All transfer gates AG1-AG4 are turned off. More specifically, write circuits 201A-201D attain an output high impedance state. This is because four IO pins are used when the first switching signal Ψ1 attains a high level.

Figure 30:
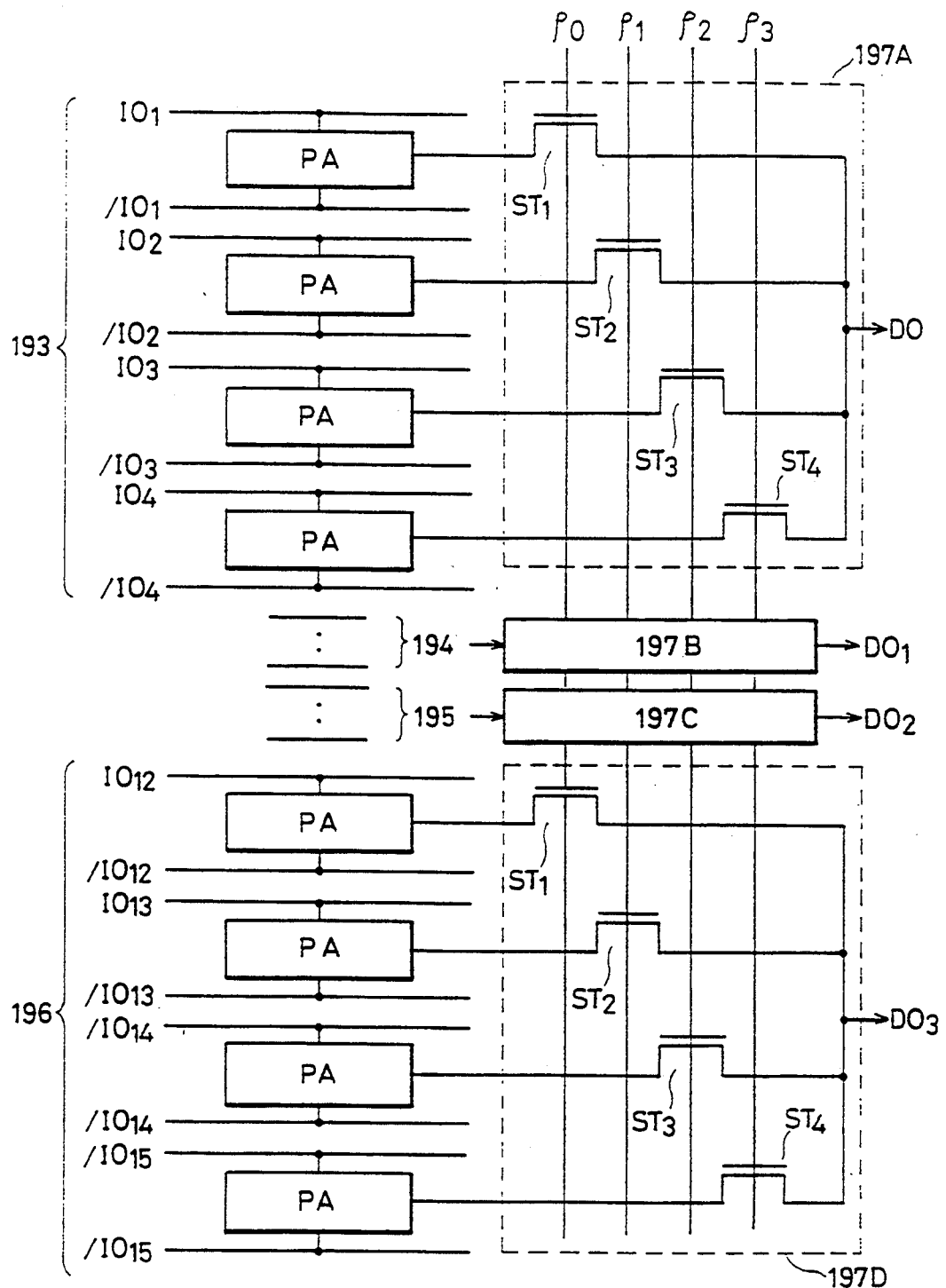
FIG. 30 shows a structure of a selecting circuit of FIG. 27.

FIG. 30 shows a specific structure of the selector of FIG. 27. Referring to FIG. 30, a selector 197 includes read circuits 197A-197D provided corresponding to 4 bits of IO buses 193-196, respectively, and a preamplifier PA provided corresponding to each IO line pair of IO1, /IO1-IO15, /IO15.

Each of read circuits 197A-197D have the same structure, and includes transfer gates ST1, ST2, ST3 and ST4 provided corresponding to the four IO line pairs of the corresponding four bits of IO buses. Transfer gates ST1-ST4 conduct in response to decode signals ρ1-ρ4. The operation will be described hereinafter.

Any of decode signals ρ0-ρ3 from partial decoder 191 (refer to FIG. 27) attains an activated state of a high level, whereby a corresponding transfer gate conducts. As a result, one IO line pair out of the four bits of IO buses 193-196 is selected. The output of preamplifier A is selected to provide 4 bits of data DO0-DO1.

Output Control Circuit

Figure 31:
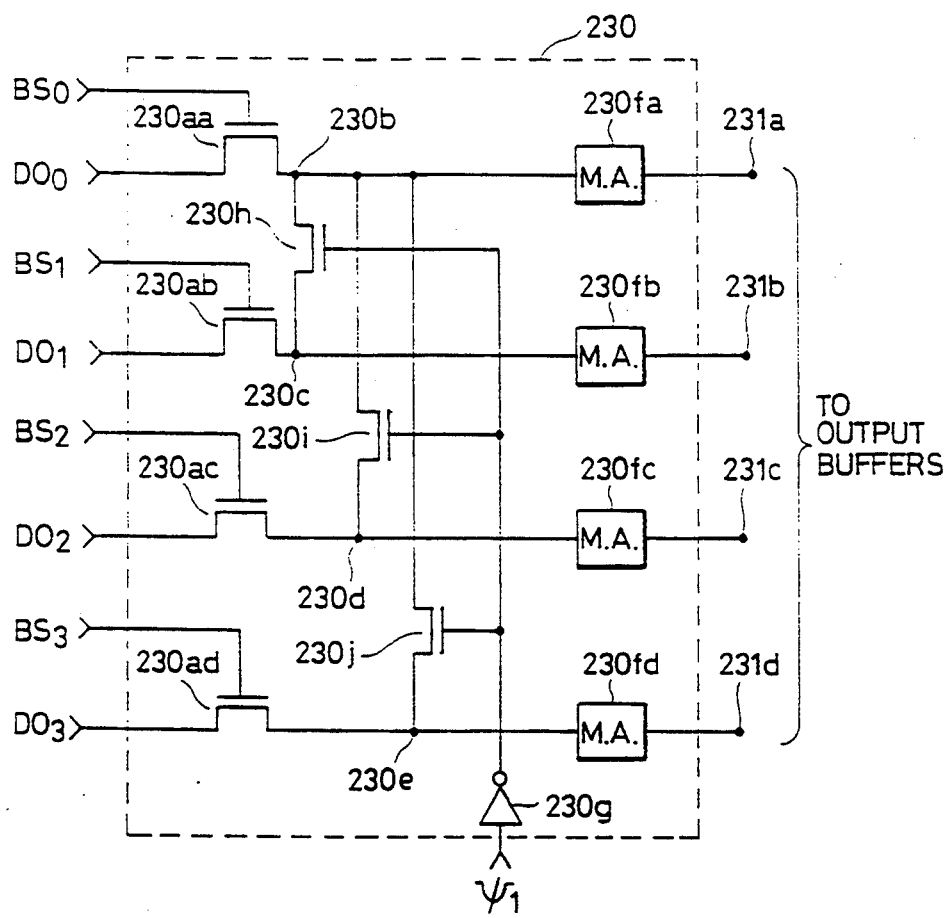
FIG. 31 shows a structure of the output control circuit of FIG. 14.

FIG. 31 shows a specific structure of the output control circuit of FIG. 14. Referring to FIG. 31, an output control circuit 230 includes n channel MOS transistors 230aa-230ad conducting in response to block selecting signals BS0-BS3, an inverter 230g for inverting the first switching signal Ψ1, an n channel MOS transistor 230h responsive to an output of inverter 230g for connecting output node 230c of transistor 230ab to output node 230*b* of transistor 230*aa*, an n channel MOS transistor 230*i* responsive to an output of inverter 230*g* for connecting output node 230*d* of transistor 203*ac* to output node 230*b* of transistor 230*aa*, an n channel MOS transistor 230*j* responsive to an output of inverter 230*g* for connecting output node 230*e* of transistor 230*ad* to output node 230*b* of transistor 230*aa*, and main amplifiers 230*fa*–230*fd* provided corresponding to nodes 230*b*, 230*c*, 230*d* and 230*e* for amplifying the signal potential of each corresponding node. The operation will be described hereinafter.

Mode A: In mode A, the first switching signal Ψ1 attains a low level, and the output of inverter 231 is set to a high level. In this state, transistors 230*h*, 230*i* and 230*j* conduct. More specifically, output data transmitted via transistors 230*a* b, 230*ac* and 230*ad* are transmitted to node 230*b*.

In mode A, one of block selecting signals BS0–BS3 is activated according to decode signals / 0–/φ3 from block selecting decoder 211 (refer to FIG. 14). As a result, one of transistors 230*aa*–230*ad* conduct. Read out data is transmitted to node 230*b* via the conducting transistor. As a result, the signal transmitted to node 230*b* is amplified by main amplifier 230*f* a to be provided to output node 231*a*. Output node 231*a* is connected to output buffer 251*a* of FIG. 14. In a x1 bit organization, output data DQ0 is provided to data output pin 255*a*. Output nodes 231*b*–231*d* are connected to output buffers 251*b*–251*d*, respectively, shown in FIG. 14. However, in mode A, output buffers 251*b*–251*d* are disconnected from IO pins, and data output is not carried out.

Mode B: In mode B, the first switching signal Ψ1 is set to a high level, and the output of inverter 230*e* attains a low level. As a result, transistors 230*h*, 230*i* and 230*j* are turned off. Because all block selecting signals BS0–BS3 attain a high level of an activated state, transistors 230*aa*–230*ad* transmit data D00–D03 selected by selector 197 to main amplifiers 230*fa*–230*fd*, respectively. As a result, 4 bits of data are provided in parallel to nodes 231*a*–231*d*.

Mode C: In this case, the first switching signal Ψ1 is set to a high level, and the output of inverter 230*g* is set to a low level. Block selecting signals BS0–BS3 are activated according to column address strobe signals /CAS0–/CAS3. For example, when column address strobe signals /CAS0–/CAS1 attain an activated state of a low level, only block selecting signals BS0 and BS1 attain a high level, and block selecting signals BS2 and BS3 maintain a low level. As a result, signals corresponding to data D00 and D01 requiring access is provided from main amplifiers 230*fa* and 230*fb*. Main amplifiers 230*fc* and 230*fd* have an input of high impedance state, and provides indefinite data.

Output Control Signal Generation Circuit

Figure 32:
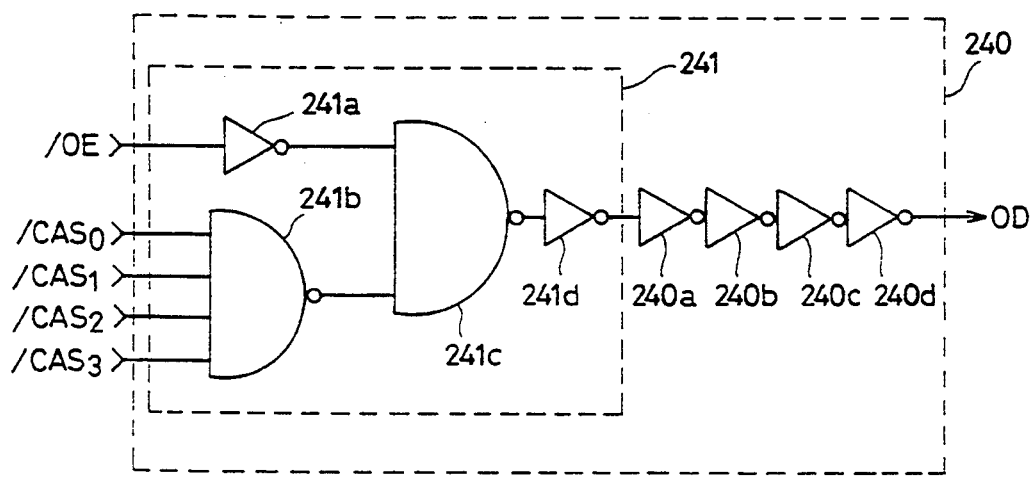
FIG. 32 shows a structure of the output control signal generation circuit of FIG. 14.

FIG. 32 shows an example of a structure of the output control signal generation circuit of FIG. 14. Referring to FIG. 32, an output control signal generation circuit 240 includes a logic circuit 241 for providing a signal of a predetermined logic level according to output enable signal /OE and column address strobe signals /CAS0–/CAS3, and four stages of cascade-connected inverters 240*a*–240*d* for amplifying the output of logic circuit 241 to provide an output control signal OD. Logic circuit 241 includes an inverter 241*a* for inverting output enable signal /φOE, a 4-input NAND circuit 241*b* for receiving column address strobe signals /φCAS0–/CAS3, a 2-input NAND circuit 241*c* for receiving an output of inverter 241*a* and an output of NAND circuit 241*b*, and an inverter 241*d* for inverting the output of NAND circuit 241*c*.

NAND circuit 241*b* provides a signal of a high level when at least one of column address strobe signals /CAS0–/CAS3 attains an activated state.

The gate width, for example, is increased with each succeeding stage of inverters 240*a*–240*d*, resulting in a greater current driving capability. Output control signal OD is generated by inverter 240*d* of the greatest driving capability. Therefore, output control signal OD can be transmitted far away at high speed to drive output buffers 251*a*–251*d* at high speed. The driving capability is sequentially increased in inverters 240*a*–240*d* as set forth in the following. If the input portion of an inverter of great driving capability is connected to the output portion of an inverter of low driving capability, the output of the inverter of high driving capability will rise slowly in comparison with the rise of an input signal of the inverter of low driving capability if there is a great difference in the driving capability therebetween. This means that through current flows from the power supply potential to ground potential in the inverter of high driving capability during the rise of the output of the inverter of high driving capability, resulting in increased current consumption. By reducing the difference of driving capability in inverters 240*a*–240*d* as shown in FIG. 32, reduction in power consumption can be realized.

Output Circuit

Figure 33:
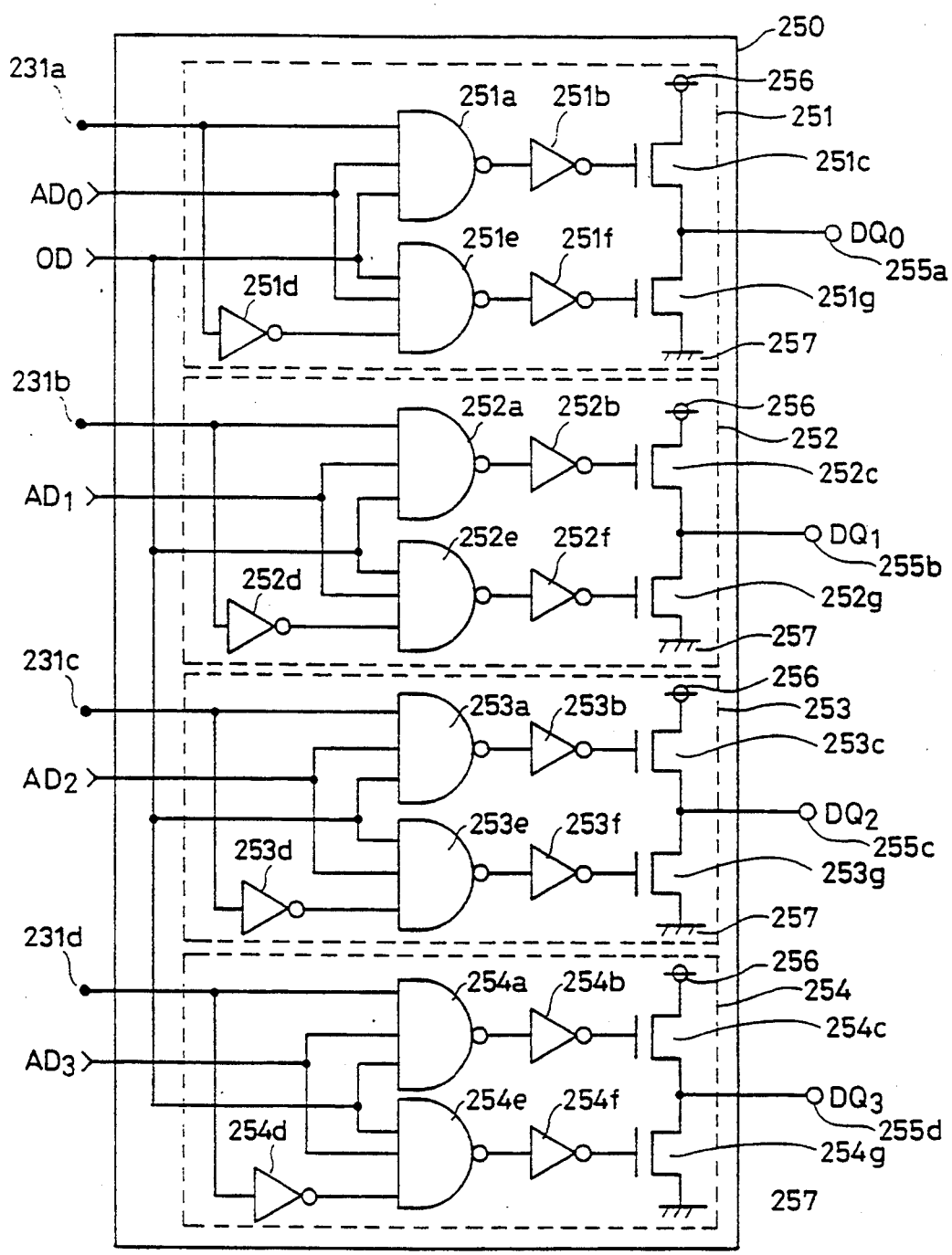
FIG. 33 shows a structure of the output circuit of FIG. 14.

FIG. 33 shows a specific structure of an output circuit of FIG. 14. In FIG. 33, each of output buffers 251, 252, 253 and 254 in output circuit 250 have the same structure. Output buffer 251 includes a 3-input NAND circuit 251*a* for receiving a signal on output node 231*a* (refer to FIG. 31), IO pin selecting signal ADO, and output control signal OD, an inverter 251*b* for inverting the output of NAND circuit 251*a*, an n channel MOS transistor 251*c* conducting in response to an output of inverter 251*b* for connecting power supply potential node 256 to IO node 255*a*, an inverter 251*d* for inverting the potential of the signal on node 231*a*, an NAND circuit 251*e* for receiving output control signal OD of inverter 251*d* and IO pin selecting signal ADO, an inverter 251*f* for inverting the output of NAND circuit 251*e*, and an n channel MOS transistor 251*g* conducting in response to an output of inverter 251*f* for connecting IO pin 255*a* to ground potential node 257.

Output buffers 252–254 includes a structure similar to output buffer 251, and corresponding components will have the same reference character with a suffix applied. Detailed description will not be repeated. The operation thereof will be described hereinafter.

Mode A: In mode A, all IO pin selecting signals AD0–AD3 attain a high level. Although all output buffers 251–254 are operable in this state, output buffers 252–254 are disconnected from IO pins, so that the outputs thereof attain a floating state. In mode A, data of the selected 1 bit of memory cell is transmitted to node 231*a*. When the transmitted data is a signal of a high level, and in response to a high level of output control signal OD, the outputs of NAND circuits 251*a* and 251*e* attain a low level, and transistors 251*c* and 251*g* are turned on and off, respectively, whereby a signal of a high level is provided at node 255*a*. Data DQ0 on node 255*a* is transmitted to a corresponding IO pin.

Mode B: In mode B, all IO pin selecting signals AD-0–AD3 attain an activated state of a high level, and all output buffers 251–254 attain an operable state. In this state, data of 4 bits are applied in parallel to output nodes 231a–231d. When output control signal OD rises to a high level, the output portions of transistors 251c, 251g, 252c, 252g, 253c, 253g, 254c and 254g attain a conductive state/non-conductive state according to the potential of the signal applied to nodes 231a–231d, whereby data is transmitted to input/output nodes 255a–255b.

Mode C: In mode C, IO pin selecting signals AD-0–AD3 are activated according to column address strobe signals /CAS0–/CAS3. A case is considered where column address strobe signals /CAS0 and /CAS1 are activated, and column address strobe signals /CAS2 and /CAS3 attain a deactivated state of a high level. Similar to mode B, signals of logics corresponding to the data applied to nodes 231a and 231b are transmitted on input/output nodes 255a and 255b under this state. Because IO pin selecting signals AD2 and AD3 attain a low level of a deactivated state in output buffers 253 and 254, outputs of NAND circuits 253a, 253e, 254a and 254e attain a high level, and transistors 253c, 253g, 254c and 254g attain a non-conducting state in response to signals of low levels provided from inverters 253b, 253f, 254b, and 254f. IO nodes 255c and 255d attain a high impedance state. Therefore, even if main amplifiers 230fe and 230fd shown in FIG. 31 provide uncertain data according to the high impedance state of the input thereof in mode C, output buffers 253 and 254 attain an output high impedance state, and unrequired output of data is not carried out.

By setting an output high impedance state by IO pin selecting signals AD2 and AD3, charging and discharging of input/output pins (IO pins) do not have to be carried out, resulting in reduction in the consumed power in an output buffer.

Write Control Signal Generation Circuit

Figure 34:
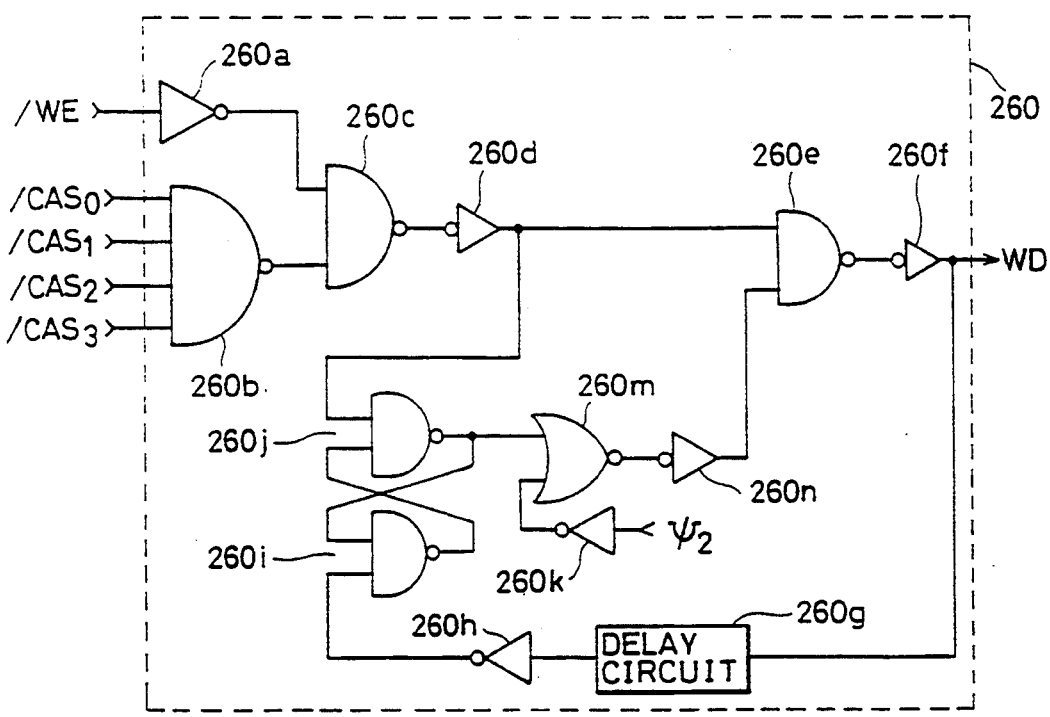
FIG. 34 shows a structure of the control signal generation circuit of FIG. 14.

FIG. 34 specifically shows a structure of write control signal generation circuit 260 of FIG. 14. Referring to FIG. 34, a write control signal generation circuit 260 includes an inverter 260a for receiving a write enable signal /WE, a 4-input NAND circuit 260b for receiving column address strobe signals /CAS0–/CAS3, a 2-input NAND circuit 260c for receiving outputs of inverter 260a and NAND circuit 260b, an inverter 260d for receiving an output of NAND circuit 260c, a 2-input NAND circuit 260e for receiving the output of inverter 260d at one input and the output of inverter 260n at the other input, and an inverter 260f for inverting the output of NAND circuit 260e. A write control signal WD is generated from inverter 260f.

NAND circuit 260b provides a signal of a high level when at least one of column address strobe signals /CAS0–/CAS3 attains an activated state of a low level. Therefore, NAND circuit 260c provides a signal of a low level when at least one column address strobe signal attains an active state and write enable signal /WE attains an activated state of a low level.

Write control signal generation circuit 260 further includes a delay circuit 260g for delaying write control signal WD for a predetermined time, an inverter 260h for inverting the output of delay circuit 260g, a 2-input NAND circuit 260i for receiving the outputs of inverter 260h and NAND circuit 260a, a 2-input NAND circuit 260j for receiving outputs of NAND circuit 260i and inverter 260d, an inverter 260k for inverting the second switching signal Ψ2, a 2-input NOR circuit 260m for receiving outputs of inverter 260k and NAND circuit 260a, and an inverter 260n for inverting the output of 2-input NOR circuit 260m. NAND circuits 260i and 260j form a flipflop. Next, the operation thereof will be described briefly.

Modes A and B: In modes A and B, the second switching signal Ψ2 is set to a high level, and the output of inverter 260k is set to a low level. Therefore, NOR circuit 260m functions as an inverter, and a signal of a logic corresponding to the output of NAND circuit 260a is provided from inverter 260n.

Before data writing is designated, the output of inverter 260d attains a low level and output of NAND circuit 260j attains a high level. Therefore, NOR circuit 260m provides an output of a low level, and inverter 260n provides an output of a high level.

When write enable signal /WE and column address strobe signal /CAS0 attain a low level, the output of inverter 260d rises to a high level. As a result, both inputs of NAND circuits 260e attain a high level to provide signal of a low level. Write control signal WD provided from inverter 260f attains an activated state of high level. Although a signal of a high level is provided from inverter 260d to NAND circuit 260j, the output of inverter 260h initially attains a high level, and the output of NAND circuit 260i attains a low level. Therefore, the output of NAND circuit 260a does not change and maintains the high level.

When a predetermined time elapses, delay circuit 260g responds to a write control signal WD to rise to a high level, and the output of inverter 260h falls to a low level. In response, the output of NAND circuit 260i rises to a high level, and the output of NAND circuit 260j rises to a low level. As a result, the output of NOR circuit 260m attains a high level, and the output of inverter 260n attains a high level. The output of NAND circuit 260e attains a high level, and write control signal WD provided from inverter 260f falls to a low level. By the delay time provided by delay circuit 260g, the time period of an activation state of write control signal WD is set.

When one cycle ends, write enable signal /WE and column address strobe signal /CAS0 both attain a high level. In response, the output of inverter 260d attains a low level, and the output of NAND circuit 260j is set to a high level. Although this setting causes the output of NOR circuit 260m to attain a low level and the output of inverter 260m to attain a high level, the output of NAND circuit 260e attains a high level due to a low level signal from inverter 260d and inverter 260f maintains the low level.

Mode C: In the case of mode C, switching signal Ψ2 is set to a low level. In this state, the output of inverter 260k attains a high level and the output of NOR circuit 260m attains a low level. The output of inverter 260n is fixed to a high level. Therefore, in this state, write control signal WD changes according to the output of inverter 260d since NAND circuit 260e operates as an inverter. More specifically, in mode c, write control signal WD maintains the activated state of a high level when write enable signal /WE and any of column address strobe signal /CAS0–/CAS3 attains an activated state.

Thus, by setting write control signal WD, not as a one shot pulse, but a signal maintaining an activated state during the activation time of column address strobe signals /CAS0–/CAS3 in mode C, data writing can be carried out reliably according to the timing of column address strobe signals /CAS0-/CAS3. Here, data can be written into different addresses according to column address strobe signal /CAS0-/CAS3 (during 1 cycle of an activation state of write enable signal /WE).

CAS Buffer

Figure 35:
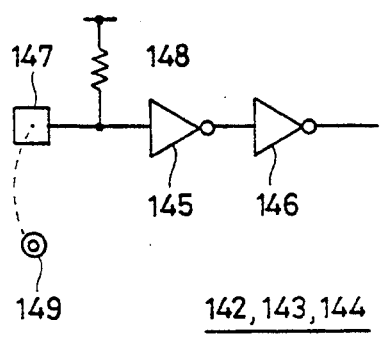
FIG. 35 shows a structure of the /CAS buffer of FIG. 14.

FIG. 35 shows a structure of CAS buffers 142-144 of FIG. 14. Referring to FIG. 35, a /CAS buffer 142 (143, 144) includes a resistor element 148 of high resistance connected to a pad 147, an inverter 145 having the input portion connected to pad 147, and an inverter 146 for receiving the output of inverter 145. Pad 147 is wired by a metal thin wire to an external pin terminal 149 to be selectively connected, as shown by the broken line in the diagram. In modes A and B, pad 147 is disconnected from external pin terminal 149. In this case, the input portion of inverter 145 is fixed to a high level, and an internal column address strobe signal is fixed to a deactivated state of high level of a high level due to high resistor element 148.

In mode C, pad 147 and external pin terminal 149 are connected by wiring with a metal thin wire indicated by the broken line in the drawing.

/CAS buffer may have pad 147 and inverter 145 connected/disconnected by a metal interconnection according to the operation mode. As an alternative of the structure shown in FIG. 35, a transmission gate may be provided between pad 147 and the input portion of the inverter 145 which becomes conductive/non-conductive in response to a second signal $\Psi 2$. In the case of modes A and B, transmission gate is turned off. In the case of mode C, the transmission gate conducts.

Column Address Buffer

Figure 36:
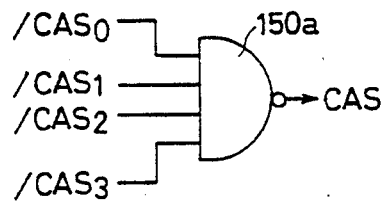
FIG. 36 shows a structure of a column address strobe signal generation portion of the column address buffer of FIG. 14.

FIG. 36 shows a structure of a column address signal generation circuit applied to a column address buffer. Referring to FIG. 36, a column address buffer 150 includes a 4-input NAND circuit 150a for-receiving column address strobe signals /CAS0-/CAS3 at its control signal input portion. When at least one of column address strobe signals /CAS0-/CAS3 attains an activated state of a low level, column address strobe signal CAS provided from NAND circuit 150a attains an activated state of a high level. The column address buffer carries out latching of an address signal according to this column address strobe signal CAS. More specifically, the output of gate circuit 150a is activated when signal /RAS from a /RAS buffer is activated.

Embodiment 2

Figure 37:
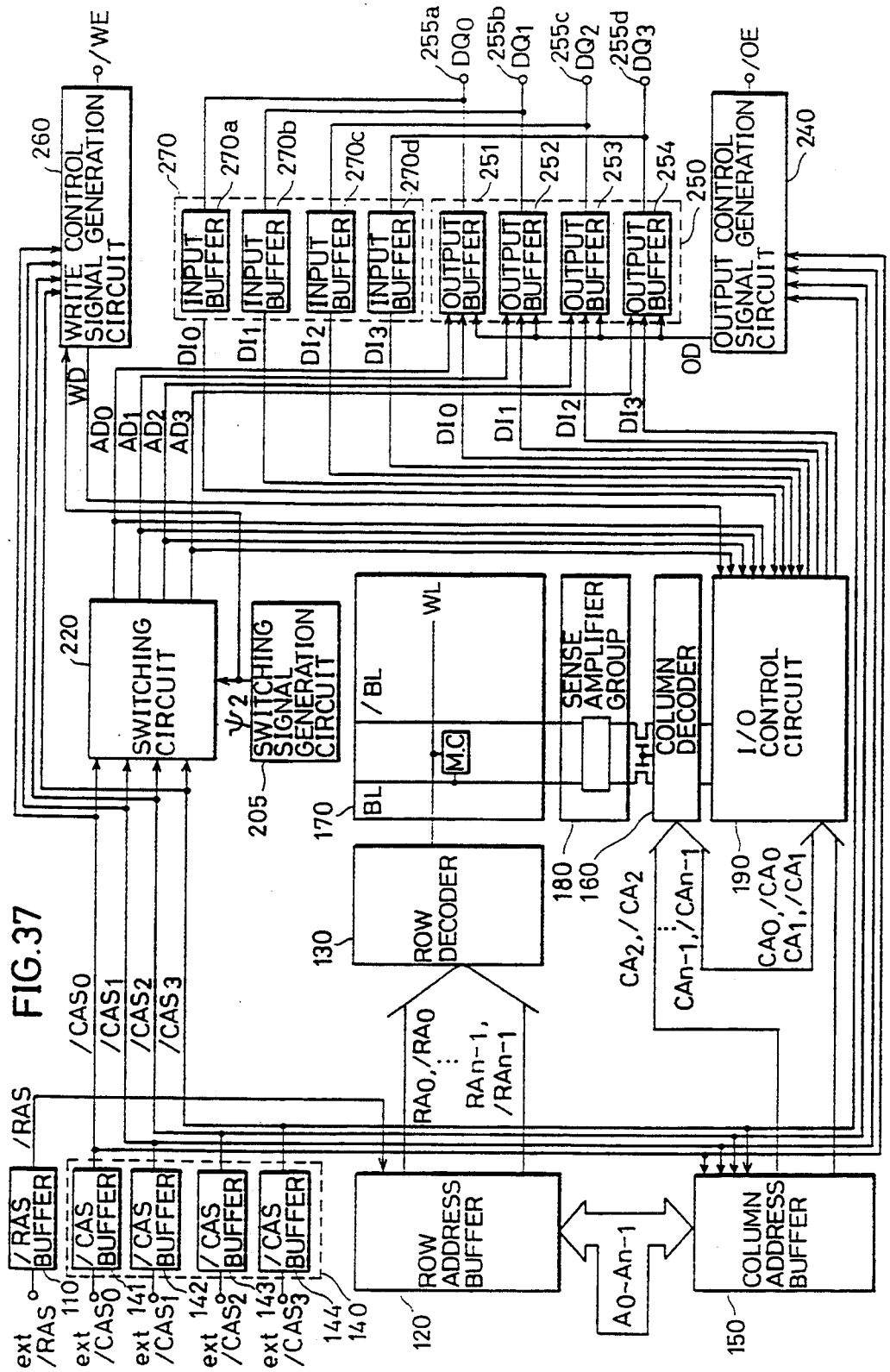
FIG. 37 shows a structure of a DRAM according to a second embodiment of the present invention.

FIG. 37 shows a structure of a DRAM according to a second embodiment of the present invention. The DRAM shown in FIG. 37 has all input/output nodes 255a-255d connected to IO pins. The DRAM can operate in either modes of mode B carrying out input-/output of 4 bits of data according to one column address strobe signal, and mode C carrying out input/output independently of each data bit according to four column address signals. Because a x1 bit organization is not used, the first switching signal $\Psi 1$ for switching between a x1 bit organization and a x4 bit organization is not used. Only a second switching signal $\Psi 2$ for specifying 1 or 4 column address strobe signals is used. Therefore, an output control circuit for switching the data transmission path between a x1 bit organization, i.e. mode A, and a x4 bit organization, i.e. modes B and C in data output is not provided. Furthermore, because a x1 bit organization is not used, a block selecting circuit is not provided since a block selecting signal does not have to be generated.

Switching signal generation circuit 205 generates a second switching signal $\Psi 2$ indicating whether the DRAM receives four column address strobe signals or one column address strobe signal, i.e. whether to operate in mode B or in mode C.

Switching circuit 220 responds to a switching signal $\Psi 2$ from switching signal generation circuit 205 to activate all IO pin selecting signals AD0-AD3, or to activate IO pin selecting signals AD0-AD3 according to column address strobe signals /CAS0-/CAS3.

When switching signal $\Psi 2$ from switching signal generation circuit 205 indicates mode B, write control signal generation circuit 260 generates a write control signal WD having a predetermined pulse width in response to a write enable signal /WE and one column address strobe signal (for example /CAS0). When switching signal $\Psi 2$ indicates mode C, write control signal generation circuit 260 generates a write control signal that is activated during the activation of a column address strobe signal. The structure of this write control signal generation circuit 260 is similar to that shown in FIG. 34.

I/O control circuit 190 decodes column address signals CA0, /CA0, CA1 and /CA1 from column address buffer 150 to select 4 bits of memory cells from the 16 bits of memory cells selected by column decoder 160. In data writing, I/O control circuit 190 carries out data writing for the selected IO pins, i.e. for memory cells corresponding to pins applied with valid data according to IO pin selecting signals AD0-AD3 from switching circuit 220. In data reading, I/O control circuit 190 selects data of 4 bits of memory cells according to column address signals CA0, /CA), CA1 and /CA1 to provide the data to output buffers 251-254.

Output buffers 251-254 in output circuit 250 carries out data output according to respective IO pin selecting signals AD0-AD3. The data output timing is determined by an output control signal 0D from output control signal generation circuit 240.

The remaining structure is similar to that of the DRAM of the first embodiment shown in FIG. 14. Corresponding components have the same reference characters denoted, and their description will not be repeated. The operation will be described hereinafter.

(I) Mode B: data input/output is carried out using only one column address strobe signal In mode B, switching signal $\Psi 2$ generated from switching signal generation circuit 205 is set to high level. In /CAS buffer circuit 140, only /CAS buffer 141 is connected to an external pin terminal to receive an external column address strobe signal ext /CAS0 to generate an internal column address strobe signal /CAS0. The remaining /CAS buffers 142-144 are disconnected from the external pin terminals, so that internal column address strobe signals /CAS1-/CAS3 are maintained at the deactivated state of a high level. Switching circuit 220 responds to a switching signal $\Psi 2$ of a high level from switching signal generation circuit 205 to set all IO pin selecting signals AD0-AD3 to an activated state of a high level.

(i) Data Reading Operation

Data reading in mode B will be described with reference to FIG. 38. Address signals A0 to An-1 corresponding to an X address (row address) are provided from an external source, and external row address strobe signal ext /RAS is activated to a low level at time t1. Internal row address strobe signal /RAS from /RAS buffer 110 attains an activated state of a low level. Row address buffer 120 responds to a row address strobe signal /RAS of a low level to latch address signals A0 to An-1 to generate row address signals RA0, /RA0 to RAn-1, /RAn-1. Because only a x4 bit organization is used, it is to be noted that the address signals are A0-An-1 and an address signal An is not used.

Row decoder 130 decodes row address signals RA0, /RA0 to RAn-1, /RAn-1 to select a corresponding word line in the memory cell array 170. The potential of the selected word line is pulled up to a high level. Data of the memory cells connected to this selected word line is read out to a corresponding bit line (BL or /BL), whereby data of this memory cell is detected, amplified, and latched by a sense amplifier of sense amplifier group 180.

At time t2, output enable signal /OE is activated to a low level. However, since column address strobe signal ext /CAS0 attains a high level, output control signal OD maintains the low level. Address signals A0-An-1 corresponding to an Y address are applied. When external column address strobe signal ext /CAS0 is activated to a low level at time t3, column address buffer 150 latches address signals A0 to An-1 to generate column address signals CA0, /CA0 to CAn-I, /CAn-1.

Column decoder 160 decodes column address signals CA2, /CA2 to CAn-I, /CAn-1 to select 16 bits of memory cells (16 pairs of bit lines) from the memory cells connected to the selected word line. The data of the 16 bits of memory cells are transmitted to I/O control circuit 190. I/O control circuit 190 decodes column address signals CA0, /CA0, CA1 and /CA1 to further select 4 bits of memory cell data corresponding to each data IO pin from the 16 bits of memory cells. It is to be noted that IO pin selecting signals AD0-AD3 are not used in data reading.

In response to column address strobe signal /CAS0 activated at time t3, output control signal OD from output control signal generation circuit 240 is activated to rise to a high level. All IO pin selecting signals AD0-AD3 attain an activated state of a high level. Therefore, output buffers 252-254 are activated in response to this output control signal OD, whereby data of 4 bits from I/O control circuit 190 are transmitted to respective corresponding input/output nodes 255a-255d. Input/output node 255a-255d are connected to external IO pin terminals, whereby data of 4 bits are provided in parallel to an external source.

When external column address strobe signal ext /CAS0 is deactivated to rise to a high level at time t4, one data reading cycle is completed, and output buffers 251-254 attain an output high impedance state.

(ii) Data Writing Operation

In data writing, address signals A0 to An-1 corresponding to an X address are applied, and data DQ0-DQ3 are provided to input/output nodes 255a-255d. Input buffers 270-270d in input circuit 270 generates internal write data DI0-DI3 from data DQ0-DQ3 to transmit the same to I/O control circuit 190. Write control signal WD from write control signal generation circuit 260 still attains a deactivated state, so that data writing is not carried out.

When external row address strobe signal ext /RAS falls to a low level at time t1, a word line selecting operation and detection, application, and latching of data of memory cells connected to a selected word line are carried out by row address buffer 120, row decoder 130 and sense amplifier group 180, as in data reading.

At time t2, write enable signal /WE is activated to fall to a low level. Here, external column address strobe signal ext /CAS0 is still at a high level of a deactivated state. Therefore, write control signal WD from write control signal generation circuit 260 maintains a deactivated state of a low level.

When column address strobe signal ext /CAS0 falls to a low level at time t3, write control signal WD from write control signal generation circuit 260 attains a high level of an activated state for a predetermined time.

Column address buffer 150 responds to activation of external column address strobe signal ext /CAS0 to generate column address signals CAS0, /CAS0 to CAn-1, /CAn-1. Column decoder 160 decodes these column address signals CA2, /CA2 to CAn-1, /CAn-1 to select 16 bits of memory cells of the memory cells connected to the selected word line. I/O control circuit 190 decodes column address signals CA0, /CA0, CA1 and /CA1 to select 4 bits of memory cells out of the 16 bits of the memory cells. IO pin selecting signal AD0-AD3 from switching circuit 220 all attain an activated state. Therefore, I/O control circuit 190 writes the 4 bits of write data DI0-DI3 from input buffers 270a-270d into the selected 4 bits of memory cells.

(II) Mode C: 4 column address strobe signals and 4 IO pins are used

In mode C, /CAS buffers 141-144 receive external column address strobe signals ext /CAS0-ext /CAS3, respectively. Input/output nodes 255a-255d are connected to external IO pins.

(i) Data Reading Operation: Data reading will be described with reference to an operation waveform diagram of FIG. 40.

Figure 38:
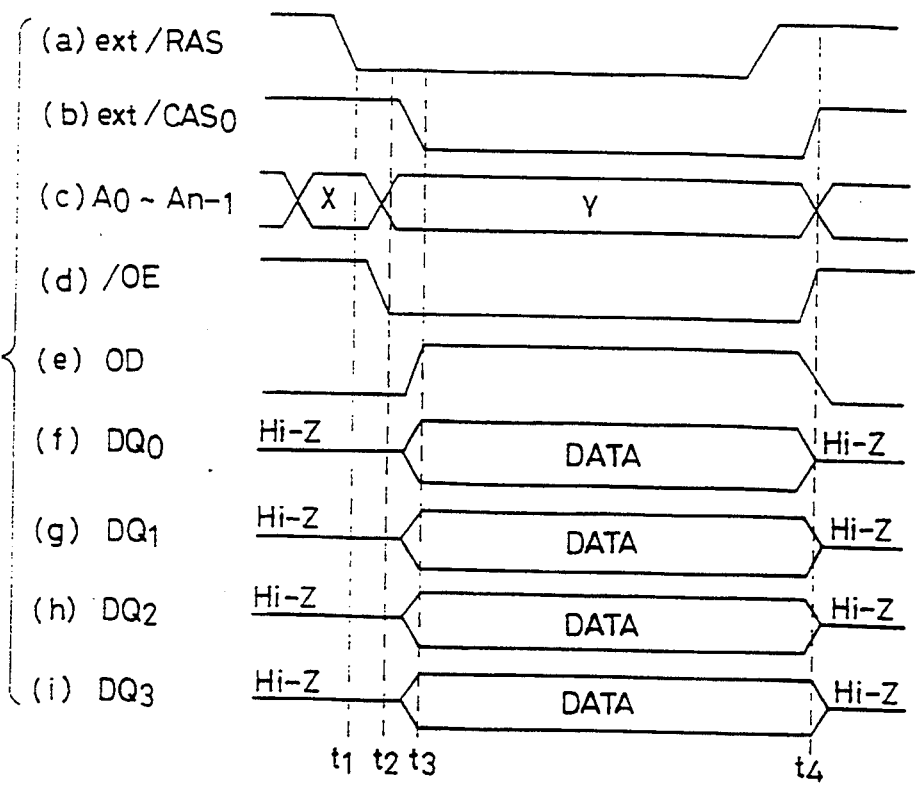
FIGS. 38-41 are signal waveform diagrams showing the operation of the DRAM of FIG. 37.

The operation of external row address strobe signal ext /RAS activated at time t1 and output enable signal /OE activated at time t2 is similar to that data of the data reading operation in mode B shown in FIG. 38.

Figure 40:
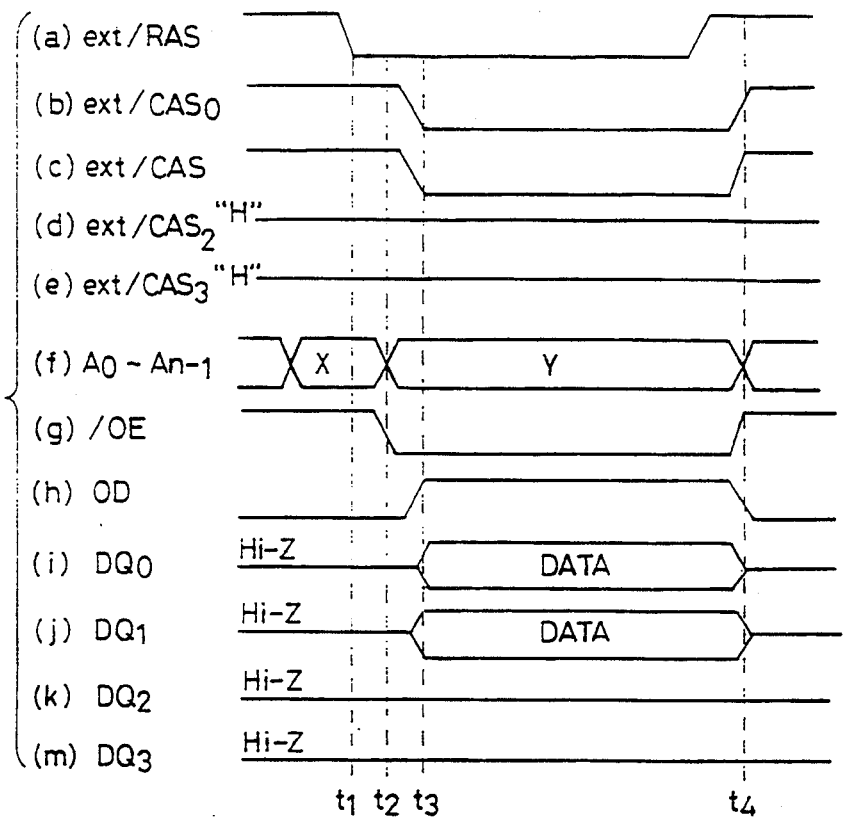

When at least one of external column address strobe signals ext /CAS0-ext /CAS3 (two column address strobe signals ext /CAS0 and ext /CAS1 in FIG. 40) is activated to a low level at time t3, output control signal OD from output control signal generation circuit 240 attains an activated state of a high level.

In response to activation of internal column address strobe signals /CAS0 and /CAS1, column address buffer 150 generates column address signals CA0, /CA0-CA1 /CA1. Column decoder 160 decodes column address signals CA2 /CA2 to CAn-1 /CAn-1 to select memory cells of 16 bits out of the memory cells connected to the selected word line in memory cell array 170.

I/O control circuit 190 decodes column address signals CA0, /CA0-CA1, /CA1 to select 4 bits of memory cells out of the selected 16 bits of memory cells. The data of the selected 4 bits of memory cells are provided to output buffers 251-254. In mode C, IO pin selecting signals AD0-AD3 from switching circuit 252 is activated according to internal column address strobe signals /CAS0-/CAS3.

When external column address strobe signal ext /CAS0 and ext /CAS1 are activated as shown in FIG. 40, IO pin selecting signals AD0 and AD1 are activated, and IO pin selecting signals AD2 and AD3 maintain a deactivated state. As a result, output buffers 251 and 252 are enabled to buffer internal read out data DO0 and DO1 transmitted from I/O control circuit. 190. The buffered data are provided to input/output nodes 255a and 255b as read out data DQ0 and DQ1. Output buffers 253 and 254 attain an output high impedance state since IO pin selecting signals AD2 and AD3 are deactivated.

When the activated column address strobe signal (signals ext /CAS0 and ext /CAS1 in FIG. 40) attain a deactivated state of a high level at time t4, output control signal OD is also deactivated, and output buffers 251 and 252 attain an output high impedance state.

(ii) Data Writing Operation

Figure 39:
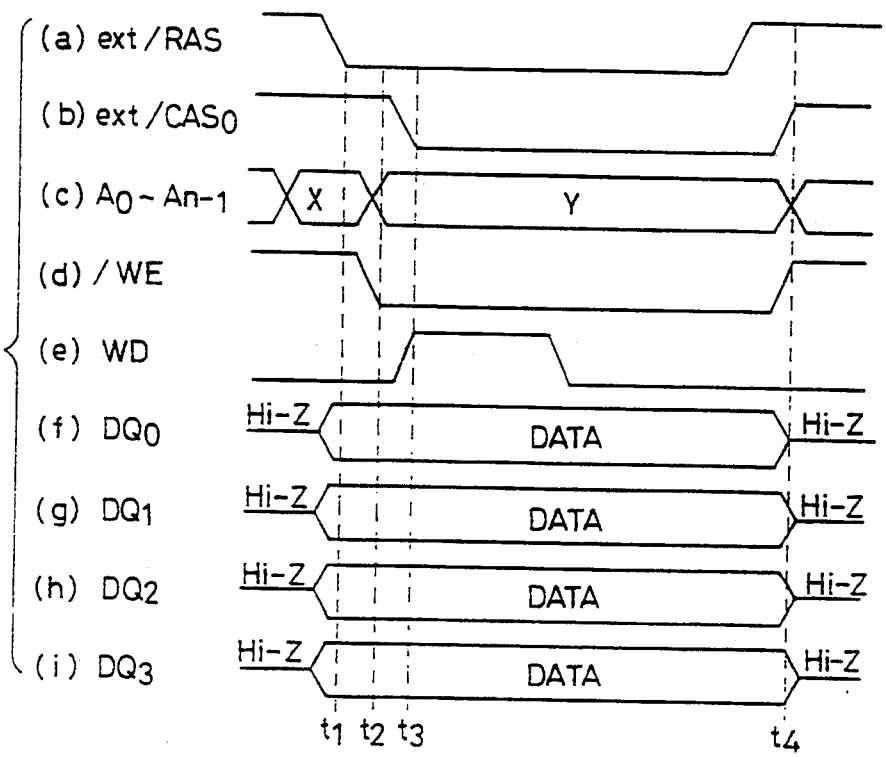
Figure 41:
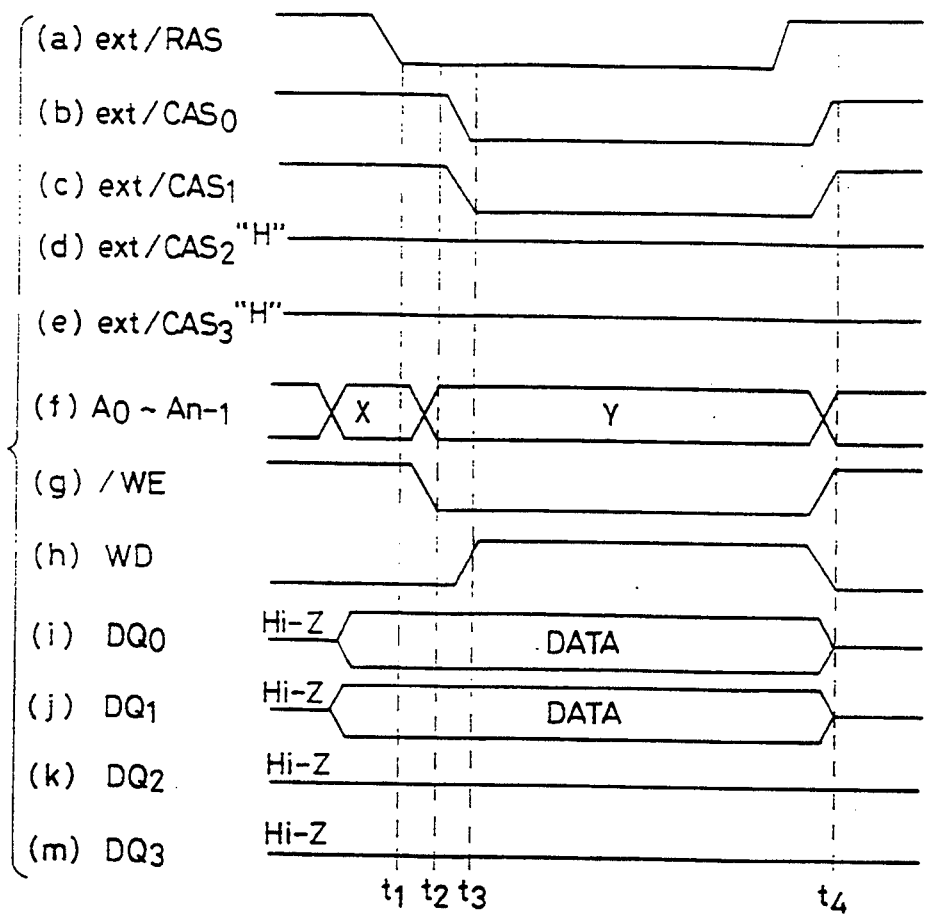

Data writing in mode C will be described with reference to an operation waveform diagram of FIG. 41. Until time t2, an operation similar to data writing in mode B shown in FIG. 39 is carried out. Internal write data DI0 and DI1 corresponding to external write data DQ0 and DQ1 are generated from input buffers 270a and 270b to be provided to I/O control circuit 190. Input buffers 270c and 270d have its input/output nodes 255c and 255d set to a high impedance states to generate internal write data DI2 and DI3 of an uncertain state.

When at least one of external column address strobe signals ext /CAS0–ext /CAS3 (signals ext /CAS0 and ext /CAS1 in FIG. 40) is activated at time t3, column address signals CA0, /CA0 to CAn-1, CAn-1 are generated from column address buffer 150. Column decoder 160 selects 16 bits of memory cells from the memory cells connected to the selected word line in memory cell array 170.

I/O control circuit 190 decodes column address signals CA0, /CA0, CA1 and /CA1 to select 4 bits of memory cells out of the 16 bits of memory cells. However, here, IO pin selecting signals AD0 and AD1 from switching circuit 220 are activated, and IO pin selecting signals AD2 and AD3 are deactivated. Therefore I/O control circuit 190 respond to a write control signal WD from write control signal generation circuit 260 to carry out data writing only for memory cells corresponding to IO pin selecting signals AD0 and AD1. Data writing is not carried out for memory cells corresponding to IO pin selecting signals AD2 and AD3 (for these memory cells, I/O control circuit 190 attains an output high impedance state).

Write control signal WD from write control signal generation circuit 260 maintains an activated state during activation of column address strobe signals /CAS0 and /CAS1 in mode C. Therefore, data writing can be carried out reliably.

When column address strobe signal ext /CAS0 and ext /CAS1 are deactivated from an activated state to attain a high level at time t4, write control signal WD is also deactivated to attain a low level. Thus, a data writing operation is completed.

By switching the generation manner of IO pin selecting signals from switching circuit 220 with a switching signal $\Psi 2$ from switching signal generation circuit 205, a DRAM that operates in modes B and C can be realized easily. The structure of each component will be described hereinafter. Components having a structure similar to those of the DRAM described in Embodiment 1 will not be repeated. Only different components, i.e. IO control circuit, the switching signal generation circuit, and switching circuit will be described.

Switching Signal Generation Circuit

Figure 42A:
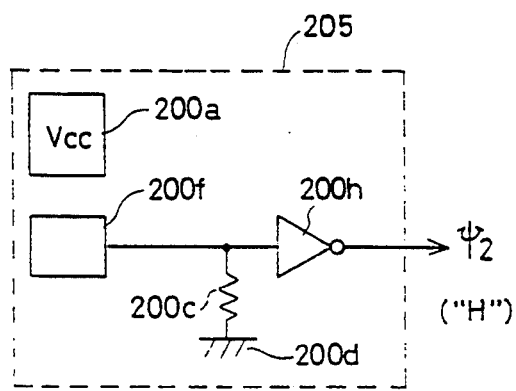
FIGS. 42A and 42B are diagrams showing the structure of the switching signal generation circuit of FIG. 37.
Figure 42B:
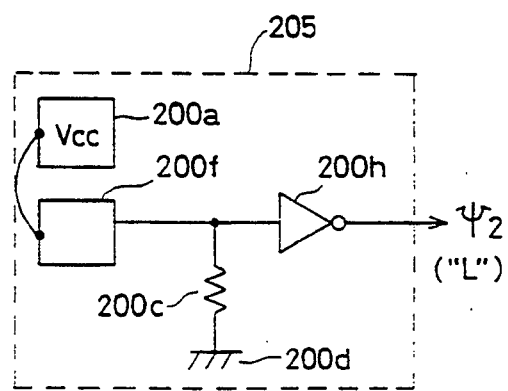

FIGS. 42A and 42B show the structure of the switching signal generation circuit of FIG. 37. Referring to FIGS. 42A and 42B, a switching signal generation circuit 205 includes a resistor element 200 of high resistance (more than 1M$\widetilde{\Omega}$) provided between a pad 200f and a ground potential node 200d, and an inverter 200h having its input portion connected to pad 200f. A power supply pad 200a for receiving power supply potential Vcc is provided in the proximity of pad 200f.

In mode B (only one column address strobe signal is used), pad 200f is disconnected from power supply pad 200a as shown in FIG. 42A. In this state, switching signal $\Psi 2$ generated from inverter 200h attains a high level since a low level signal of ground potential is applied to inverter 200h via resistor element 200c.

In mode C where four column address strobe signals are used, pad 200f is connected by wiring with a metal thin wire to power supply pad 200a as shown in FIG. 42B. In this state, switching signal $\Psi 2$ generated from inverter 200h attains a low level since a signal of the level of power supply potential Vcc is applied to the input portion of inverter 200h. By selectively connecting pad 200f to power supply pad 200a by wiring as described above, a DRAM that carries out different input/output control can be manufactured with the same mask.

A metal interconnection may be formed to fix the potential of the input portion of inverter 200h by using a mask, instead of the structure of the selective connection of the pad by wiring.

Alternatively, a structure in which a switching signal $\Psi 2$ is directly applied from an external source may be used.

Switching Circuit

Figure 43:
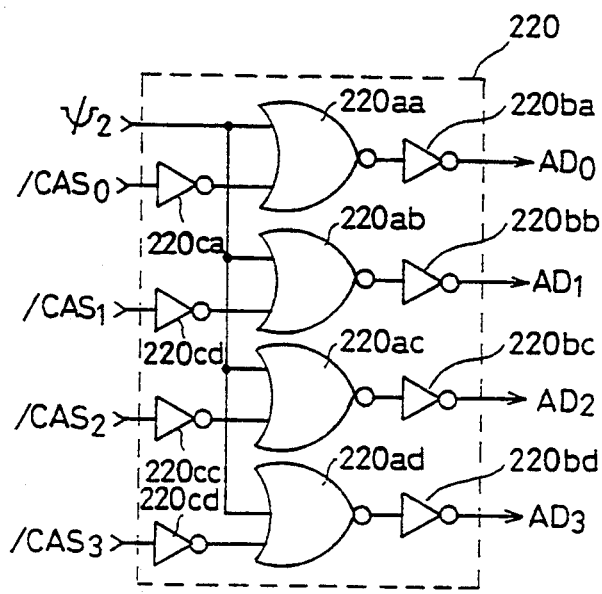
FIG. 43 shows a structure of the switching circuit of FIG. 37.

FIG. 43 shows the feature of the switching circuit of FIG. 37. Switching circuit 220 includes inverters 220ca–220cd for inverting column address strobe signals /CAS0–CAS3, NOR circuits 220aa–220ad having one input receiving respective outputs of inverters 220ca–220cd, and inverters 220ba–220bd for inverting the outputs of NOR circuits 220aa–220ad. Switching signal $\Psi 2$ is applied to the other inputs of NOR circuits 220aa–220ad.

IO pin selecting signals AD0–AD3 are generated from inverters 220ba–220bd.

When switching signal $\Psi 2$ attains a high level indicating mode B, the outputs of NOR circuits 220aa–22ad attain a low level, and IO pin selecting signals AD0–AD3 generated from inverters 220ba–220bd attain an activated state of a high level. As a result, data input/output of 4 bits is carried out.

In mode C, switching signal $\Psi 2$ is set to a low level, and NOR circuits 220aa–220ad function as inverters. Therefore, IO pin selecting signals AD0–AD3 are activated/deactivated according to activation/deactivation of corresponding column address strobe signals /CAS0–CAS3.

I/O Control Circuit

Figure 44:
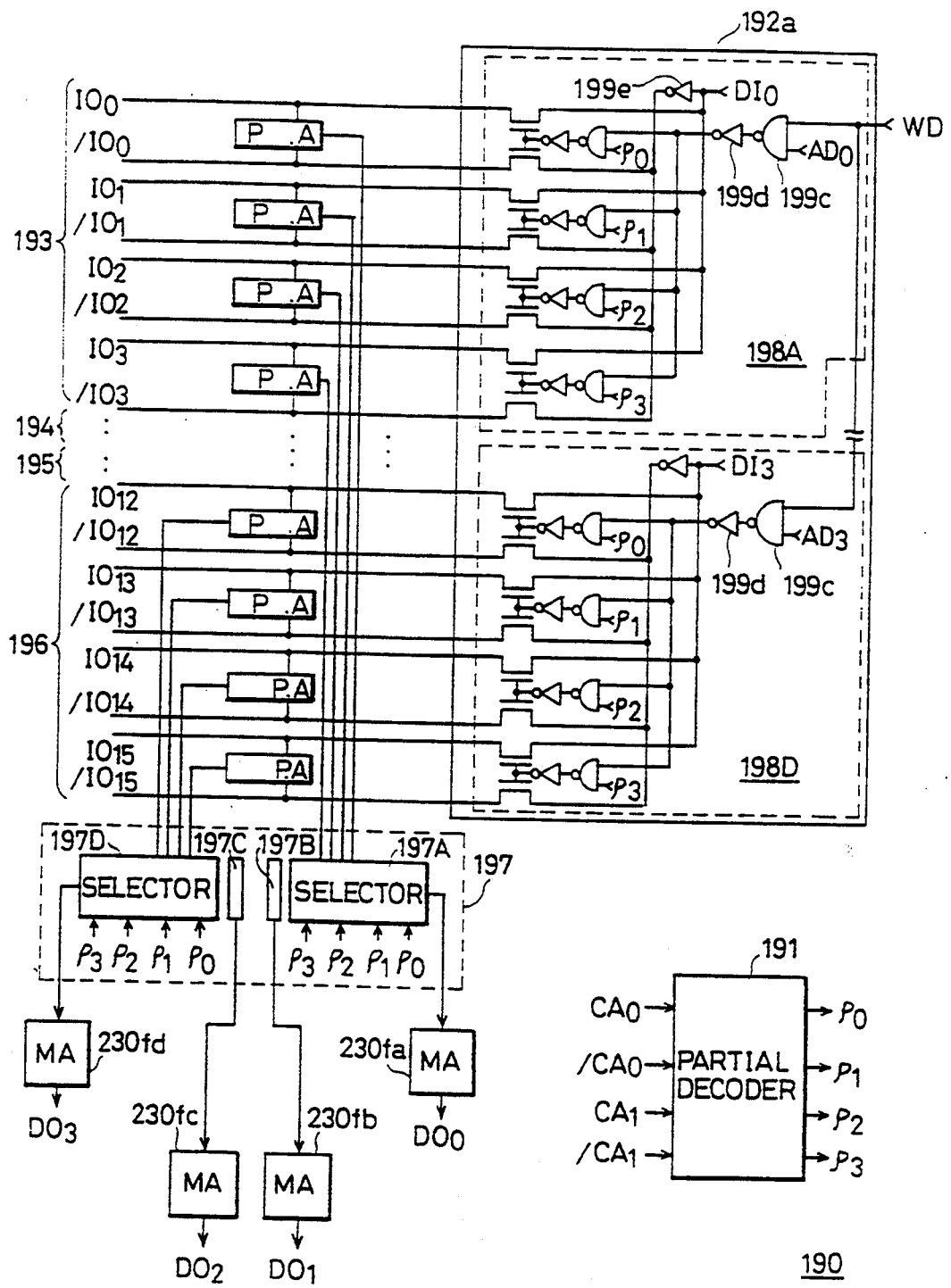
FIG. 44 shows a structure of the I/O control circuit of FIG. 37.

FIG. 44 shows a specific structure of the I/O control circuit of FIG. 37. The I/O control circuit 190 of FIG. 44 differs from the I/O control circuit of the first embodiment in that only a x4 bit control circuit 192 is included since a first switching signal $\Psi 1$ is not used. A write control signal WD and IO pin selecting signals AD0–AD3 are applied to NAND circuit 199c provided at the input portion of x4 bit control circuit 192a. The remaining structure is similar to that of FIG. 28.

The IO bus includes IO buses 193–196, each having a width of 4 bits. Each of IO buses 193–196 correspond to a data IO pin. Write control circuits 198A–198D are provided corresponding to 4-bit IO buses 193–196. In FIG. 44, write control circuits 198B and 198C provided corresponding to IO buses 194 and 195 are not indicated. In the structure of FIG. 44, data writing is carried out for the corresponding 4 bits of IO buses only when IO pin selecting signals AD0–AD3 are activated. Decode signals $\rho 0$–$\rho \rho 3$ from partial decoder 191 select an IO line pair of 1 bit from the 4 bits of I0 buses.

In mode B, all IO pin selecting signals AD0–AD3 attain an activated state of a high level. Therefore, the output of inverter 199d attains a high level when write control signal WD attains a high level, whereby data writing is carried out on one IO line pair in each of 4 bits of IO buses 193–196 according to decode signals $\rho 0$–$\rho 3$.

In mode C, IO pin selecting signals AD0–AD3 are activated independently according to column address strobe signals CAS0-/CAS3. Therefore, only the write circuit provided in the IO bus which requires data writing carries out data writing. When IO pin selecting signals AD0–AD3 attain a deactivated state of a low level, write circuits 198A–199D attain an output high impedance state.

The output portion of I/O control circuit 190 includes a selecting circuit 197 for selecting 1 bit of data (the output of one preamplifier PA) from 4-bit IO buses 193–196, and main amplifiers 230fa–230fd for amplifying 4 bits of data from selecting circuit 197. Selecting circuit 197 includes selectors 197A–197D provided corresponding to IO lines 193–196. The structure of selectors 197A–197D is similar to that shown in FIG. 30, and data of 1 bit of memory cell is selected from a corresponding 4-bit IO bus according to decode signals $\rho 0$–$\rho 3$.

Main amplifiers 230fa–230fd amplify output signals from selectors 197A–197D to provide internal output data DO0–DO3. Therefore, the data output portion of this IO control circuit provides 4 bits of data whether in mode B or in C.

Output buffers 251–254 has a structure similar to that shown in FIG. 33, and are enabled/disabled by IO pin selecting signals AD0–AD3.

According to the above-described structure, parallel input/output of 4 bits of data, and independent input/output control of each bit of 4 bits of data can easily be realized.

Embodiment 3

Figure 45:
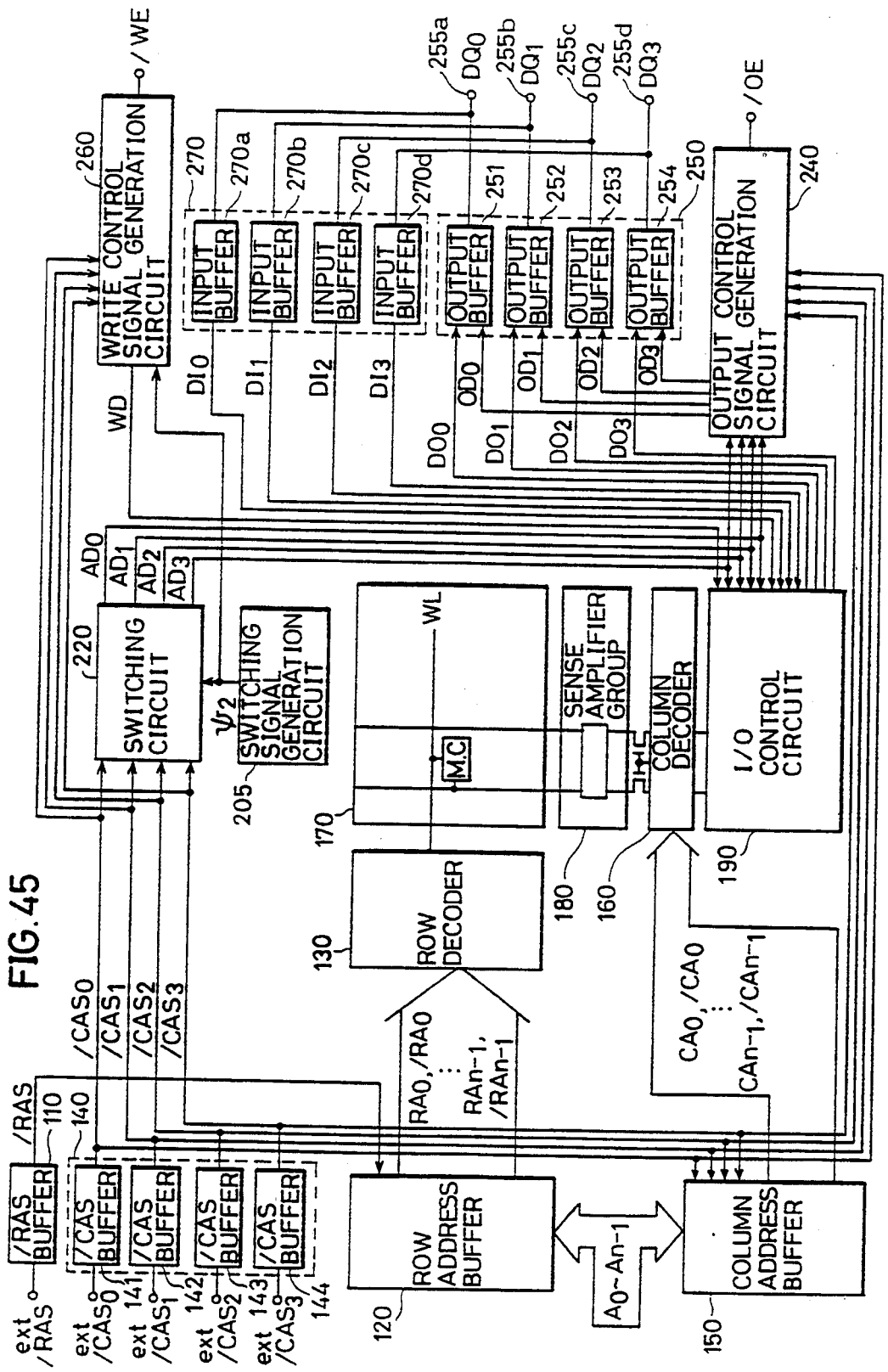
FIG. 45 shows a structure of a DRAM according to a third embodiment of the present invention.

FIG. 45 shows a structure of a DRAM according to a third embodiment of the present invention. The DRAM of FIG. 45 has column decoder 160 receiving column address signals CA0, /CA0 to CAn-1 /CAn-1 from column address buffer 150 to select 4 bits of memory cells in memory cell array 170. The selected 4 bits of memory cells correspond to data input/output nodes 255a–255d, respectively.

Output control signal generation circuit 240 receives IO pin selecting signals AD0–AD3 from switching circuit 220, and provides output control signals OD0–OD3 to output buffers 251–254, respectively. Output control signals OD0–OD3 are activated/deactivated in response to activation/deactivation of IO pin selecting signals AD0–AD3. I/O control circuit 190 writes data into a memory cell according to IO pin selecting signals AD0–AD3 in data writing. Data writing is carried out for a memory cell corresponding to an activated data IO pin selecting signal.

I/O control circuit 190 transmits in parallel data of 4 bits of memory cells selected by column decoder 160 to output buffers 251–254 in data reading. I/O control circuit 190 does not carry out a decoding operation.

Input/output nodes 255a–255d are connected to external IO pins. Switching signal generation circuit 205 generates a switching signal $\Psi 2$ for specifying mode B or mode C. Switching circuit 220 activates all IO pin selecting signals AD0–AD3 according to switching signal $\Psi 2$ or respectively activates IO pin selecting signals AD0–AD3 according to column address strobe signals /CAS0-/CAS3. The operation will be described hereinafter.

(I) Mode B: input/output of 4 bits of data is carried out using one column address strobe signal.

Figure 46:
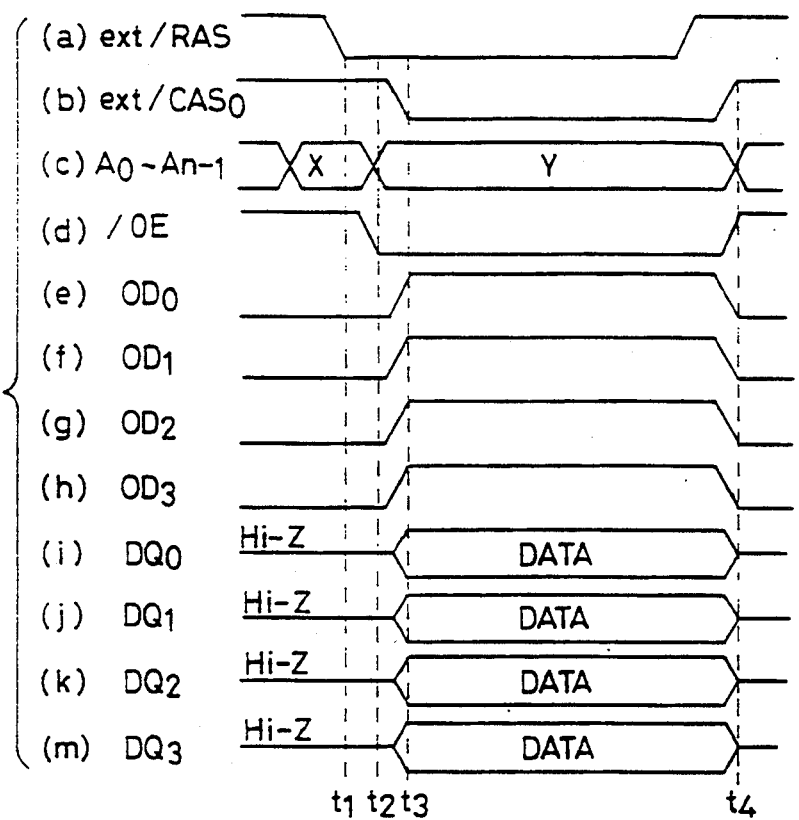
FIGS. 46-49 are signal waveform diagrams showing the operation of a DRAM of FIG. 45.

(a) Data read out operation: Referring to the operational waveform diagram of FIG. 46, data reading will be described. When external row address strobe signal ext /RAS is asserted at time t1, row address buffer 120 latches address signals A0 to An-1 to generate internal row address signals RA0, /RA0 to RAn-1, /RAn-1. Row decoder 130 decodes these row address signals RA0, /RA0 to RAn-1, /RAn-1 to select a corresponding word line in memory cell array 170. Sense amplifier group 180 detects, amplifies, and latches data of the memory cells connected to the selected word line.

At time t2, output enable signal /OE is asserted. Here, column address strobe signal ext /CAS0 still attains the high level of a deactivated state, and output control signals OD0–OD3 from output control signal generation circuit 240 attain a low level of a deactivated state.

At time t3, column address strobe signal ext /CAS0 is asserted. In mode B, external column address strobe signals ext /CAS-ext /CAS3 applied to /CAS buffers 142–144 attain a high impedance state, and internal column address strobe signals /CAS1-/CAS3 are set to a high level of a deactivated state.

In response to activation of internal column address strobe signal ext /CAS0 at time t3, internal column address strobe signal /CAS0 generated from /CAS buffer 141 is asserted, whereby column address buffer 150 latches address signals A0 to An-1 to generate column address signals CA0, CA0 to CAn-1, /CAn-1. Column decoder 160 decodes these n bits of column address signals CA0, /CA0 to CAn-1, /CAn-1 to select 4 bits of memory cells out of the memory cells connected to the selected bit line. The selected 4 bits of memory cells correspond to data input/output nodes 255a–255d, respectively. The 4 bits of memory cells are amplified by I/O control circuit 190 to be provided to output buffers 251–254 as read out data DO0–DO3.

In response to activation of external column address strobe signal ext /CAS0 at time t3, an output control signal from output control signal generation circuit 240 is generated. In mode B, all IO pin selecting signals AD0–AD3 attain an activated state of a high level. In this state, output control signal generation circuit 240 provides to output buffers 251–254 output control signals OD0–OD3 attaining an activated state of a high level. Output buffers 251–254 buffers internal read out data DO0–DO3 according to output control signals OD0–OD3 to transmit output data DQ0–DQ3 to data input/output nodes 255a–255d, and then to external IO pins.

When external column address strobe signal ext /CAS0 attains a high level at time t4, output control signals OD0–OD3 also fall to a low level, whereby a data reading cycle is completed.

(ii). Data Writing Operation

Data writing in mode B will be described hereinafter with reference to FIG. 47.

When external write data DQ0–DQ3 are applied to input pins 255a–255d, input buffers 270a–270d generate and provide to I/O control circuit 190 internal write data DI0–DI3. Here, write control signal WD still attains a deactivated state of a low level, so that data writing is not yet carried out.

At time t1, external row address strobe signal ext /RAS falls to a low level, and row address signals RA0, /RA0 to RAn-1, /RAn-1 are generated from row address buffer 120. A corresponding word line is selected in memory cell array 170 by row decoder 130, and data of memory cells connected to the selected word lines are detected, amplified, and latched by sense amplifier group 180.

At time t2, write enable signals /WE is asserted. Here, external column address strobe signal ext /CAS0 attains a high level of a deactivated state, and write control signal WD maintains the deactivated state of a low level.

When external column address strobe signal ext /CAS0 falls to a low level at time t3, column address signals CA0, /CA0 to CAn-1, /CAn-1 are generated from column address buffer 150. Column decoder 160 decodes these column address signals CA0, /CA0 to CAn-1, /CAn-1 to select 4 bits of memory cells out of the memory cells connected to the selected word line.

Write control signal generation circuit 260 responds to activation of external column address strobe signal ext /CAS0 at time t3 to activate a write control signal WD for a predetermined time according to an activated internal column address strobe signal /CAS0.

IO pin selecting signals AD0-AD3 attain an activated state of a high level in mode B. I/O control circuit 190 responds to write control signal WD to write internal write data DI0-DI3 from input buffers 270a-270c into 4 bits of memory cells selected by column decoder 160.

At time t4, external column address strobe signal ext /CAS0 rises to a high level, whereby a data writing cycle is completed.

(II) Mode C: 4 column address strobe signals and 4 IO pins are used (a) Data Reading Operation: Data reading in Mode C will be described with reference to FIG. 48.

In mode C, /CAS buffers 141-144 receive external column address strobe signals ext /CAS0-ext /CAS3, respectively. Switching signal Ψ2 from switching signal generation circuit 205 is set to a low level, and switching circuit 220 activates IO pin selecting signals AD0-AD3 according to column address strobe signals /CAS0-CAS3.

(i) Data Reading Operation: Data reading in mode C will be described with reference to FIG. 48. The operation of external row address strobe signal ext /RAS activated at time t1 and output enable signal /OE activated at time t2 is similar to that in the data reading operation in mode B shown in FIG. 46. A word line is selected by row decoder 130, and detection, amplification, and latching of data of the selected memory cells are carried out by sense amplifier group 180.

Figure 48:
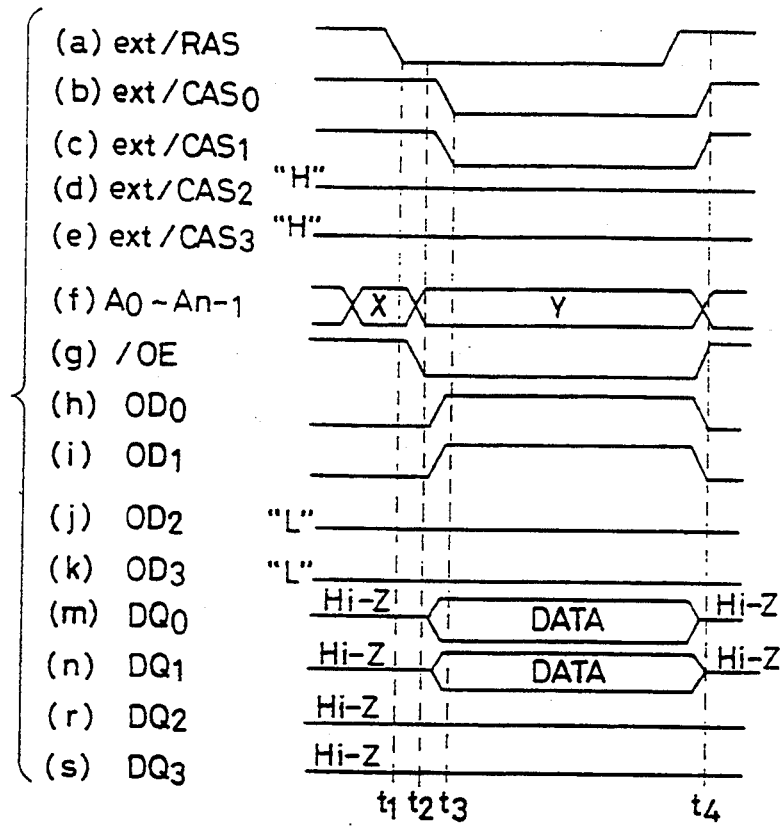

At time t3, at least one external column address strobe signal (two external column address strobe signals ext /CAS0 and ext /CAS1 in FIG. 48) is activated. In response, column address buffer 150 generates column address signals CA0, /CA0 to CAn-1, /CAn-1 from address signals A0-An-1. Column decoder 160 decodes these column address signals CA0, /CA0 to CAn-1, /CAn-1 to select 4 bits of memory cells simultaneously from the selected memory cells in memory cell array 170. I/O control circuit 190 amplifies data of the 4 bits of memory cells selected by column decoder 160 to provide the same to output buffers 251-254 as internal read out data DO0-DO3.

In response to activation of external column address strobe signals ext /CAS0 and ext /CAS1 at time t3, output control signal generation circuit 240 generates an output control signal. Here, IO pin selecting signals AD0 and AD1 are activated, and IO pin selecting signals AD2 and AD3 are deactivated. Therefore, output control signal generation circuit 240 activates output control signals OD0 and OD1 corresponding to activated IO pin selecting signals AD0 and AD1 are activated, and output control signals OD2 and OD3 corresponding to IO pin selecting signals AD2 and AD3 maintain the deactivated state. As a result, output buffers 251 and 252 are enabled, whereby read out data DQ0 and DQ1 from internal read out data DO0 and DO1 are generated to be transmitted to input/output nodes 255a and 255b. Output buffers 253 and 254 attain an output high impedance state since output control signals OD2 and OD3 are deactivated.

At time t4, external column address strobe signals ext /CAS0 and ext /CAS1 both rise to a high level, whereby one data reading cycle is completed.

Figure 49:
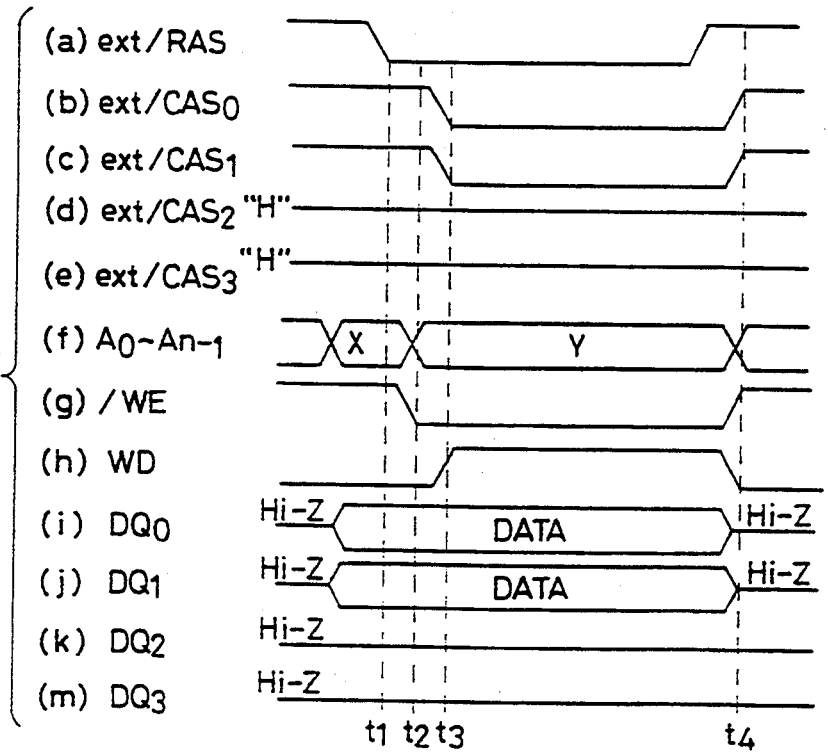

(ii) Data Writing Operation: Data reading in mode C will be described with reference to FIG. 49.

Figure 47:
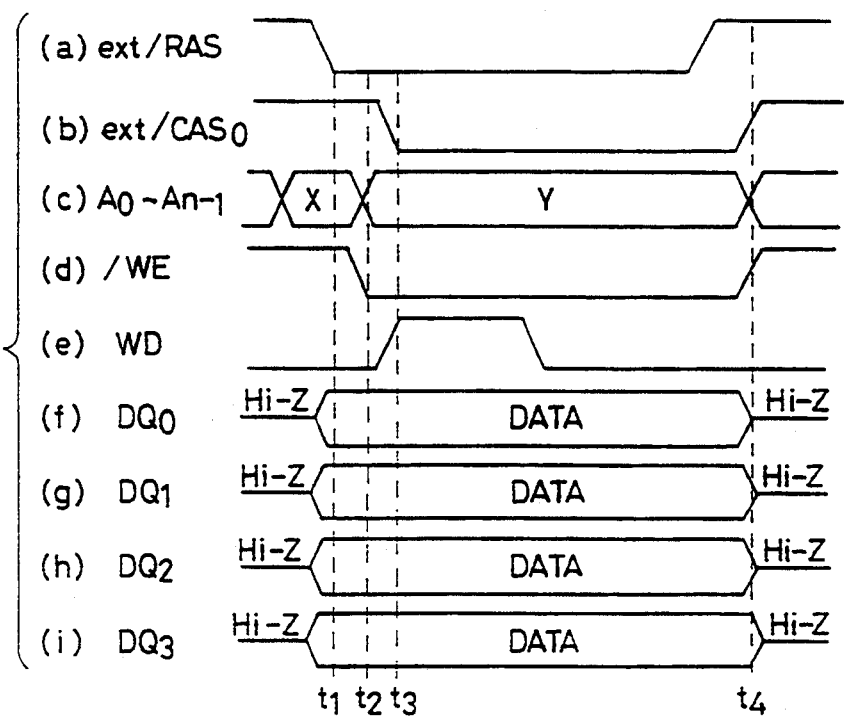

The operation up to time t2 similar to that of the data writing operation mode in mode B of FIG. 47 is carried out.

When external column address strobe signals ext /CAS0 and ext /CAS1 are activated to a low level at time t3, write control signal WD from write control signal generation circuit 260 attains an activated state of a high level. In mode C, switching signal Ψ2 attains a low level, and write control signal WD from write control signal generation circuit 260 is activated during the activation of column address strobe signals /CAS0 and /CAS1.

IO pin selecting signals AD0 and AD1 are activated, and IO pin selecting signals AD2 and AD3 maintain the deactivated state. I/O control circuit 190 writes internal write data DI0 and DI1 out of the internal write data DI0-DI3 from input buffers 270a-270c into memory cells corresponding to IO pin selecting signals AD0 and AD1. Because IO pin selecting signals AD2 and AD3 are deactivated, internal read out data DI2 and DI3 are not written into memory cells.

At time t4, column address strobe signals ext /CAS0 and ext /CAS1 rise to a high level. Write enable signal /WE also rises to a high level, and write control signal WD falls to a low level. Thus, a data write cycle is completed.

Even if the column decoder has a structure selecting 4 bits of memory cells, data input/output can be carried out selectively for the 4 bits of memory cells, as described above. Specific structure of each component will be described hereinafter.

The structures of switching signal generation circuit 205 and switching circuit 220 are similar to those of the switching signal generation circuit (FIGS. 42A and 42B) and switching circuit (FIG. 43) described in the second embodiment.

I/O control circuit

Figure 50:
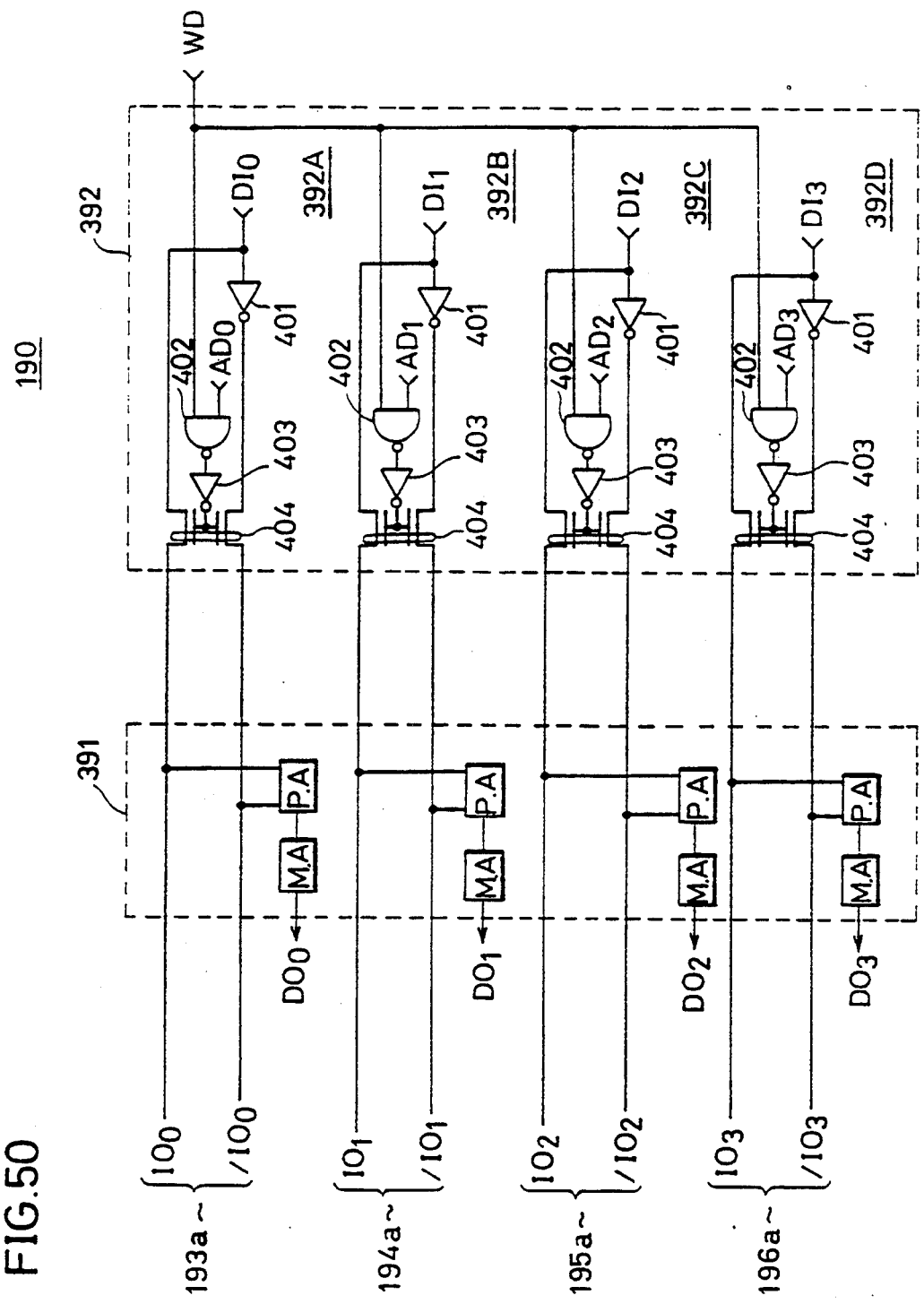
FIG. 50 shows a structure of the I/O control circuit of FIG. 45.

FIG. 50 specifically shows a structure of the I/O control circuit of FIG. 45. Referring to FIG. 50, an I/O control circuit 190 includes four IO line pairs 193a-196a. IO line pairs 193a-196a correspond to data input/output nodes 255a-255d, respectively. I/O control circuit 190 includes a write circuit 392 and a read circuit 391.

Read circuit 391 includes a preamplifier PA provided corresponding to respective IO line pairs 193a-196a for amplifying differentially the data on corresponding IO line pairs IO and /IO, and a main amplifier MA for further amplifying the output of preamplifier PA. Internal read out data DO0-DO3 are provided from main amplifier MA. Therefore, read circuit 391 provides 4 bits of data DO0-DO3 in parallel to an output buffer in data reading.

Write circuit 392 includes write control circuit 392A and 392D provided corresponding to IO line pairs 193a-196a, respectively. Write control circuits 392A-392D have the same structure, and include an inverter 401 for inverting internal write data DI (DI0--DI3), a 2-input NAND circuit 402 for receiving an IO pin selecting signal AD (AD0-AD3) and a write control signal WD, an inverter 403 for inverting the output of NAND circuit 402, and a transfer gate 404, conducting in response to an output of inverter 403, for transmitting the internal write data DI and the output of inverter 401 to corresponding IO lines IO and /IO (IO0-IO3 and /IO0-/IO3).

In mode B, all IO pin selecting signals AD0-AD3 attain an active state. In this state, NAND circuit 402 functions as an inverter, and transfer gate 404 conducts according to a write control signal WD. More specifically, internal write data DI0-DI3 are transmitted in parallel to the four IO line pairs 193a-196a in mode B.

In mode C, IO pin selecting signals AD0-AD3 are activated according to column address strobe signals /CAS0-/CAS3. For example, if IO pin selecting signal AD0 is deactivated, the output of NAND circuit 402 attains a high level, and the output of inverter 403 attains a low level. Therefore, in this case, even if write control signal WD attains an active state of a high level, transfer gate 404 is turned off and internal write data DI0 will not be transmitted to IO line pair 193a. Therefore, writing of only the required data can be carried out according to IO pin selecting signals AD0-AD3, i.e, column address strobe signals /CAS0-/CAS3 in mode C.

Output Control Signal Generation Circuit

Figure 51:
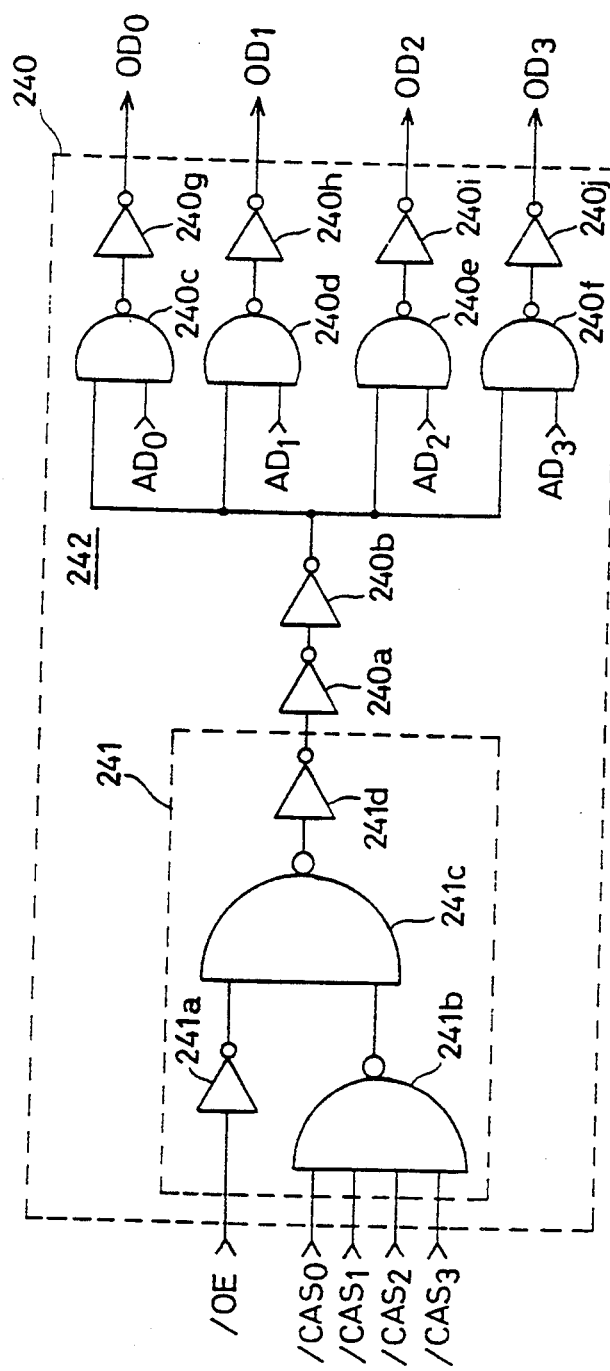
FIG. 51 shows a structure of the output control signal generation circuit of FIG. 45.

FIG. 51 specifically shows a structure of the output control signal generation circuit 240 of FIG. 45. Referring to FIG. 51, an output control signal generation circuit 240 includes a logic circuit 241 for determining the data output timing according to output enable signal /OE and column address strobe signals /CAS0-/CAS3, and a control signal generation unit 242 for generating output control signals OD0-OD3 corresponding to output buffers 251-254.

Logic circuit 241 includes an inverter 241a for inverting output enable signal /OE, a 4-input NAND circuit 241b for receiving column address strobe signals /CAS-0-/CAS3, a 2-input NAND circuit 241c for receiving the outputs of inverter 241a and NAND circuit 241b, and an inverter 241d for inverting the output of NAND circuit 241c.

A signal of a high level is provided from logic circuit 241 when output enable signal /OE attains an activated state of a low level and at least one of column address strobe signals /CAS0-/CAS3 is activated. The data output timing is determined by this signal of a high level.

Control signal generation circuit 242 includes an inverter 240a for receiving the output of logic circuit 241 (inverter 241d ), an inverter 240b for inverting the output of inverter 240a, 2-input NAND circuits 240c-240f for receiving IO pin selecting signals AD-0-AD3 at each one input, and inverters 240g-240j for inverting the outputs of NAND circuits 240c-240f. The output of inverter 240b is applied to each other input of NAND circuits 240c-240f. Output control signals OD-0-OD3 are generated from inverters 240g-240j.

In mode B, all IO pin selecting signals AD0-AD3 attain an activated state of a high level. Under this state, NAND circuits 240c-240f function as inverters. Therefore, when the output of inverter 240b attains a high level, i.e. when the signal determining the output timing from logic circuit 241 attains a high level, the outputs of NAND circuits 240c-240f fall to a low level, and output control signals OD0-OD3 rise to a high level simultaneously by inverters 240g-240j.

In mode C, IO pin selecting signals AD0-AD3 are activated according to column address strobe signals /CAS0-/CAS3. For example, if IO pin selecting signal AD0 attains a low level of a deactivated state, the output of NAND circuit 240c attains a low level, and output control signal OD0 is fixed to a low level regardless of the logic level of the output of logic circuit 241. Therefore, output buffer 251 (refer to FIG. 45) maintains an output high impedance state. If IO pin selecting signals AD0 is high, output control signal OD0 is activated to a high level in response to the change of the output of logic circuit 241 to a high level, similar to the previous mode B.

Thus, output control signals OD0-OD3 applied to output buffers 251-254 can be driven individually according to each operation mode using IO pin selecting signals AD0-AD3.

Output Circuit

Figure 52:
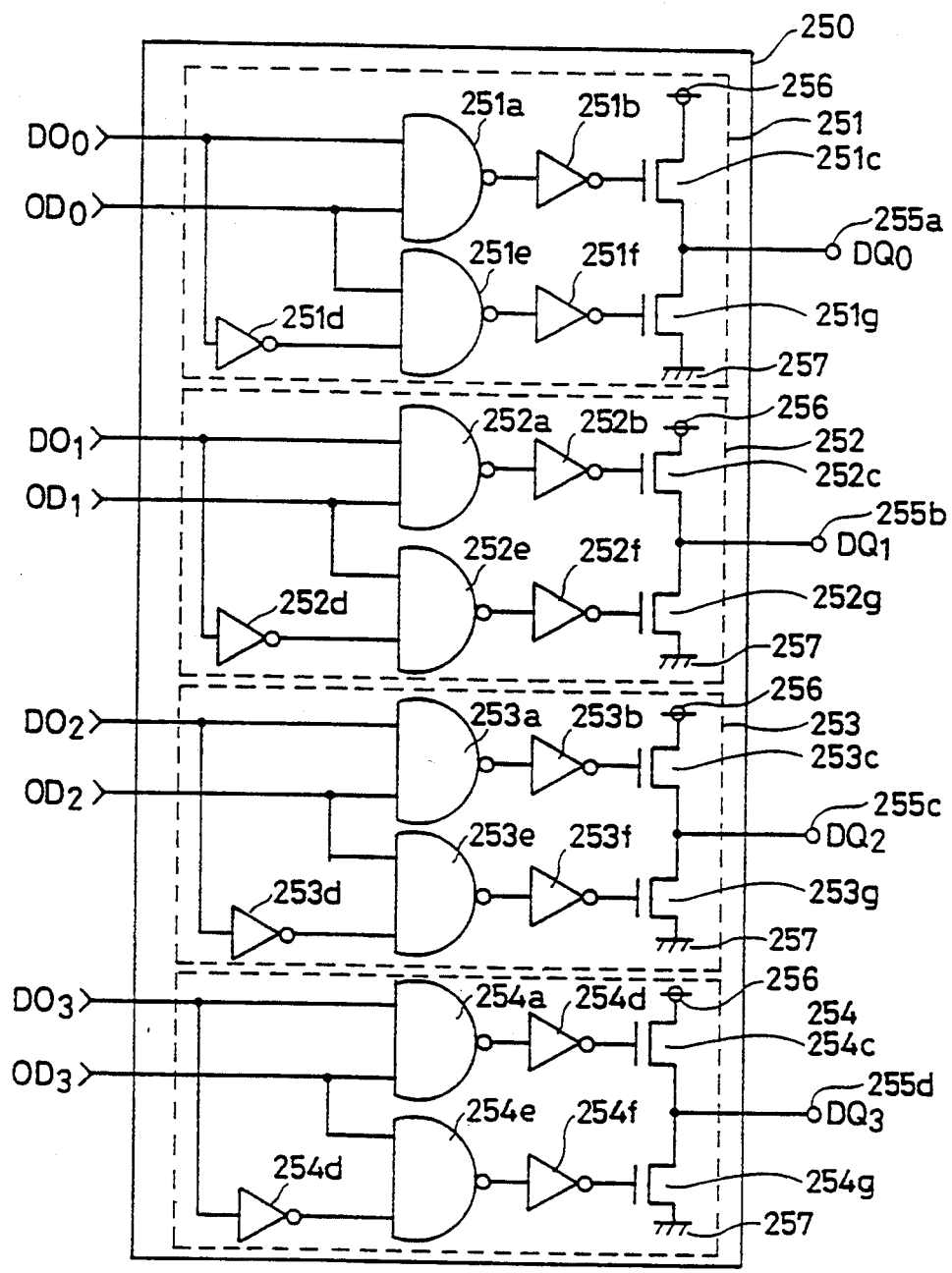
FIG. 52 shows a structure of an output circuit of FIG. 45.

FIG. 52 specifically shows an output circuit of FIG. 45. The structure of output circuit of FIG. 250 is similar to that of output circuit 250 described with reference to FIG. 33 in the prior first embodiment. Corresponding components have the same reference number denoted, and their description will not be repeated.

In the structure of output circuit 250 of FIG. 52, output control signals OD0-0D3 are generated by an NAND operation of output control signal OD and IO pin selecting signals AD0-AD3. Therefore, the output circuit of FIG. 52 differs from that shown in FIG. 33 in that NAND circuits 251a, 251e, 252a, 252e, 253a, 253e, 254a and 254e provided at the input portion of each output buffer includes a 2-input NAND circuit for receiving corresponding output control signals OD-0-OD3 at one input.

In mode B, output control signals OD0-OD3 are activated in parallel to attain a high level according to external column address strobe signal /CAS and output enable signal /OE. In this case, data corresponding to internal read out data DO0-D03 transmitted from I/O control circuit 190 are transmitted to input/output nodes 255a-255d (output data DQ0-DQ3).

In mode C, output control signals OD0-OD3 are activated selectively. When an output control signal attains a low level of a deactivated state, a corresponding output buffer attains an output high impedance state. For example, if output control signal OD0 attains a deactivated state of a low level in output buffer 251, the outputs of NAND circuits 251a and 251e attain a high level regardless of the logic of internal read out data DO0, whereby transistors 251c and 251g of the output portion are turned off to attain an output high impedance state.

Thus, according to the present invention, data input/output control can be carried out for respective IO pins by a plurality of column address strobe signals. Output of unnecessary data can be inhibited with respect to IO pins in data output, so that power consumption required for unnecessary data output is reduced. Also, writing of unnecessary data can be reliably inhibited in data writing.

Furthermore, the input/output structure of a device can be modified with only changing a switching signal, and a semiconductor memory device carrying out various input/output control can be manufactured with the same masks for substantially all masks.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells;
   N data access nodes operatively connected to said memory cell array, where N is an integer greater than 1;
   column select designating signal generation means for generating N column select designating signals corresponding respectively to said N data access nodes;
   column cell selecting means for selecting simultaneously N memory cells from said memory cell array according to an address signal, said selected N memory cells corresponding to each of said N data access nodes;
   node identifying means for generating a node identifying signal indicating whether each of said N data access nodes is available; and
   access means responsive to the node identifying signal indicating whether each of said N data access nodes is available and at least one of said N column select designating signals for accessing one of the N memory cells corresponding to one of the N data access nodes indicated available by said node identifying signal for one of data writing and reading.

2. The semiconductor memory device according to claim 1, wherein said N data access nodes each include data output nodes for providing output data to an external device, and said node identifying signals include a plurality of pin selecting signals generated for each output node,
   wherein said access means comprises
   output control signal generation means for generating an output control signal in response to an output enable signal and at least one of said N column select designating signals;
   a plurality of buffer means provided corresponding to each of said N data output nodes, responsive to said output control signal and a corresponding pin selecting signal for providing buffered data corresponding to data read from said N memory cells into a corresponding data output node of said data output nodes as said output data, wherein each of said plurality of buffer means is set to a high impedance state when the corresponding data output node is indicated unavailable by a corresponding pin selecting signal of the plurality of pin selecting signals.

3. The semiconductor memory device according to claim 2, further comprising:
   first switching signal generation means for generating a first switching signal indicating a first mode (mode A) using only a specific output node out of said data output nodes and a second mode (mode B, mode C) using all of said data output nodes,
   second switching signal generation means for generating a second switching signal indicating a third mode (mode A, mode B) in which said plurality of buffer means are controlled in common and a fourth mode (mode C) in which said plurality of buffer means are controlled independently,
   block selecting means for generating a block selecting signal specifying a memory cell out of said selected N memory cells of which data is to be read out according to said first switching signal, said second switching signal, said N column select designating signals, and an address signal,
   switching means responsive to said block selecting signal and said second switching signal for generating said pin selecting signal, and
   output control means responsive to said first switching signal and said pin selecting signal for selectively transmitting data of said specified memory cell either to corresponding buffer means or to a buffer provided corresponding to said specific data output node.

4. The semiconductor memory device according to claim 3, wherein said block selecting means comprises
   block selecting decode means for decoding said address signal to generate a decode signal specifying a memory cell of which stored data is to be read out into said specific output node from said N selected memory cells when said first switching signal indicates said first mode, and attaining an output high impedance state when said first switching signal indicates said second mode,
   means for generating said block selecting signal according to said decode signal when said first switching signal indicates said first mode, for generating said block selecting signal so as to specify all of said N selected memory cells when said first switching signal indicates said second mode and said second switching signal indicates said third mode, and for generating said block selecting signal according to said column select designating signal when said first switching signal indicates said second mode and said second switching signal indicates said fourth mode.

5. The semiconductor memory device according to claim 3, wherein said switching means comprises means for generating said pin selecting signal so that all of said data output nodes attain an available state when said second switching signal indicates said third mode, and for generating said pin selecting signal according to said block selecting signal when said second switching signal indicates said fourth mode.

6. The semiconductor memory device according to claim 1, wherein said data access nodes include a data output node for providing data of a logic corresponding to data read out from a selected memory cell to an exterior as an output data, and said node identifying signals include a plurality of pin selecting signals generated corresponding to each said data output node,
   wherein said access means comprises logic means responsive to said N column address select designating signals and an output enable signal for generating an output control signal, means for generating an output designating signal corresponding to each said data output node according to said output control signal and each of said pin selecting signals, N output buffer means provided corresponding to each said data output node, responsive to corresponding output designating signals for providing data of logics corresponding to data read out from said selected N memory cells to corresponding data output node as said output data, wherein each of said output buffer means is set to an output high impedance state when a corresponding pin selecting signal indicates an inavailable state of a data output node.

7. The semiconductor memory device according to claim 1, further comprising:

switching signal generation means for generating a switching signal indicating an input and output control mode, switching means for generating said node identifying signal in response to said switching signal and said column select designating signal, wherein said switching means comprises means for setting said node identifying signal to a state where all said data access nodes are available when said switching signal indicates a first input and output control mode (mode B) and for generating a mode identifying signal indicating whether each of said data access nodes is available according to each of said column select designating signals when said switching signal indicates a second input and output control mode (mode C).

8. The semiconductor memory device according to claim 1, further comprising:

first switching signal generation means for generating a first switching signal for indicating a first mode A) using a specific node of said data access nodes as a data output node and a second mode (mode B and mode C) using all of said data access nodes as data output nodes, second switching signal generation means for generating a second switching signal indicating a third mode (mode B) controlling in common all data outputs of said data output nodes and a fourth mode (mode C) controlling individually each data output of said data output nodes, block selecting means responsive to said first switching signal, said second switching signal, said column select designating signal, and an address signal for generating a block selecting signal specifying a memory cell storing data to be read out to said data output node, and switching means responsive to said second switching signal and said block selecting signal for generating said node identifying signal indicating whether said data output node is available.

9. The semiconductor memory device according to claim 8, wherein said access means comprises output means responsive to said block selecting signal and said first switching signal for providing data read out from a memory cell specified by said block selecting signal to said specific node when said first switching signal indicates said first mode, and for providing in parallel data of logics corresponding to data read out from said selected N memory cells to said data output node when said first switching signal indicates said second mode.

10. The semiconductor memory device according to claim 1, wherein said data access nodes include a data input/output node to which externally applied write data is transmitted, wherein said access means comprises a plurality of buffer means provided corresponding to each of said data input nodes for generating internal write data from data on a corresponding data input node, write control signal generation means responsive to a write enable signal and at least one of said column select designating signals for generating a write control signal, and write means responsive to a pin selecting signal specifying a memory cell to which data is to be written out of said N selected memory cells and said write control signal for writing internal write data applied from said buffer means into a memory cell specified by said pin selecting signal.

11. The semiconductor memory device according to claim 10, further comprising switching means for generating said node identifying signal in response to a switching signal indicating a first mode (mode A, mode B) controlling in common writing of data from said input node and a second mode (mode C) controlling individually writing of data from said plurality of input buffers and said column select designating signal for generating said node identifying signal, wherein said node identifying signal comprises a pin selecting signal generated corresponding to each said input node, wherein said switching means comprises means for activating said pin selecting signal so that all of said input nodes are available when in said first mode and for generating said pin selecting signal according to said column select designating signal when in said second mode.

12. The semiconductor memory device according to claim 11, further comprising switching signal generation means for generating said switching signal.

13. The semiconductor memory device according to claim 11, further comprising:

an additional input node provided in addition to data input node, an additional input buffer provided corresponding to said additional input node for generating internal write data from data on said additional input node, means for generating an additional switching signal indicating a third mode (mode A) in which data writing is carried out using said additional input node and said additional input buffer and a fourth mode (mode B, mode C) in which data writing is carried out using said data input nodes, block selecting means for decoding said address signal for generating a block selecting signal specifying a memory cell from said selected N memory cells subject to writing of internal write data from said additional input buffer when said additional switching signal indicates said third mode, inhibiting means for inhibiting writing by said write means when said additional switching signal indicates said third mode, means for transmitting said block selecting signal instead of said column select designating signal to said switching means when said additional switching signal indicates said second mode, and additional write means for writing a write data from said additional input buffer into a memory cell specified by said block selecting signal when said additional switching signal indicates said third mode.

14. The semiconductor memory device according to claim 13, wherein said block selecting means comprises
block select decoder means for decoding an address signal for generating a decode signal specifying a memory cell subject to data writing from said selected N memory cells according to the decoding result when said additional switching signal indicates said third mode, and for attaining an output high impedance state when said additional switching signal indicates said fourth mode, and
block selecting signal generation means for generating said block selecting signal according to said decode signal when said switching signal indicates said third mode, and for generating said block selecting signal according to said column select designating signal when said switching signal indicates said second mode.

15. The semiconductor memory device according to claim 10, wherein said write control signal generation means further comprises means responsive to a switching signal indicating a first mode in which data writing of said input node is controlled in common and a second mode in which writing is controlled individually for activating said write control signal during activation of at least one of said column selecting signals when in said second mode and for activating said write control signal for a predetermined time when in said first mode.

16. The semiconductor memory device according to claim 15, wherein said write control signal generation means comprises
means responsive to said write enable signal and activation of at least one of said column select designating signal for generating a write designating signal,
flipflop means responsive to said write designating signal for being set,
a logic gate responsive to said switching signal for transmitting an output of said flipflop means when said switching signal indicates said first mode, and for constantly activating the output of said flipflop means when in said second mode,
means responsive to an output of said logic gate means and said write designating signal for generating said write control signal, and
delay means for delaying said write control signal a predetermined time and applying the delayed write control signal to a reset input of said flipflop means.

17. The semiconductor memory device according to claim 10, further comprising:
block selecting means responsive to a switching signal indicating a first mode in which data writing is effected using an additional input node provided in addition to said data input nodes and an additional input buffer provided corresponding to said additional input node and a second mode in which data writing is effected using said data input nodes, for generating a block selecting signal to specify a memory cell subject to said data writing among said selected N memory cells according to said address signal when in said first mode,
inhibiting means responsive to said switching signal for inhibiting writing by said write means, and
additional write means responsive to said switching signal and said block selecting signal for writing into a memory cell specified by said block selecting signal a write data from said additional input buffer.

18. The semiconductor memory device according to claim 1, wherein said column select designating signal comprises a strobe signal providing a latch timing of a column address signal.

19. The semiconductor memory device according to claim 1, wherein said data access nodes comprise a data input/output node to which external write data and external output data are transmitted.

20. The semiconductor memory device according to claim 1, wherein said access means comprises both a write circuit for writing data into a selected memory cell, and a data read circuit for reading out data from a selected memory cell.

21. A method of driving a semiconductor memory device including a memory cell array having a plurality of memory cells and a plurality of data input nodes, said method comprising the steps of:
generating a pin selecting signal indicating whether each of said data input nodes is available,
selecting simultaneously a number of memory cells corresponding in number to said data input nodes from said memory cell array, each of the selected plurality of memory cells corresponding to a different data input node,
writing data applied to an input node indicated available into a corresponding memory cell according to said pin selecting signal,
generating a switching signal indicating that a different input node differing from said data input nodes is to be used,
generating a block selecting signal to select a memory cell out of said selected memory cells to which data applied to said different input node is to be written in response to said switching signal, and
invalidating said pin selecting signal for writing data of a logic corresponding to the data applied to said different input pin according to said block selecting signal into a memory cell specified by said block selecting signal.

22. The method according to claim 21, wherein said step of generating a pin selecting signal comprises the step of generating said pin selecting signal according to a plurality of column select designating signals generated corresponding to said plurality of input nodes.

23. The method according to claim 22, further comprising the step of rendering said pin selecting signal to indicate that all the input nodes are available in response to deactivation of said switching signal.

24. A method of driving a semiconductor memory device including a memory cell array having a plurality of memory cells and a plurality of data output nodes, said method comprising the steps of:
generating pin selecting signals indicating whether each of said data output nodes is available,
selecting simultaneously a number of memory cells corresponding in number to said data input nodes from said memory cell array, each of the selected memory cells corresponding to a different data output node,
providing data read out from a memory cell corresponding to an output node indicated available to the indicated available output node according to said pin selecting signals, generating a switching signal for carrying out data output using only a specific output node out of said data output nodes, generating a block selecting signal for specifying a memory cell corresponding to said specific output node out of said selected memory cells, and providing to said specific output node the data of a memory cell specified by said block selecting signal in response to said switching signal and said block selecting signal.

25. The method according to claim 24, wherein said step of generating pin selecting signals comprises the steps of generating a plurality of column select designating signals, and generating said pin selecting signals according to said column select designating signals.

26. The method according to claim 24, wherein said step of generating pin selecting signals comprises the steps of generating a plurality of column select designating signals, generating said pin selecting signal according to said column select designating signal, and activating all pin selecting signals when only a specific column select designating signal is used out of said plurality of column select designating signals.

* * * * *